United States Patent
Yang et al.

(10) Patent No.: US 9,857,447 B2
(45) Date of Patent: Jan. 2, 2018

(54) ELECTRON SPIN RESONANCE FOR MEDICAL IMAGING

(71) Applicants: Xuebei Yang, Houston, TX (US);
Charles Chen, Houston, TX (US);
Payam Seifi, Houston, TX (US); Aydin Babakhani, Houston, TX (US)

(72) Inventors: Xuebei Yang, Houston, TX (US);
Charles Chen, Houston, TX (US);
Payam Seifi, Houston, TX (US); Aydin Babakhani, Houston, TX (US)

(73) Assignee: WILLIAM MARSH RICE UNIVERSITY, Houston, TX (US)

( * ) Notice: Subject to any disclaimer, the term of this patent is extended or adjusted under 35 U.S.C. 154(b) by 1064 days.

(21) Appl. No.: 14/041,212

(22) Filed: Sep. 30, 2013

(65) Prior Publication Data
US 2014/0097842 A1  Apr. 10, 2014

Related U.S. Application Data

(60) Provisional application No. 61/707,441, filed on Sep. 28, 2012.

(51) Int. Cl.
*G01R 33/60* (2006.01)
*G01R 33/30* (2006.01)

(52) U.S. Cl.
CPC ............ *G01R 33/60* (2013.01); *G01R 33/302* (2013.01)

(58) Field of Classification Search
CPC .............................. G01R 33/60; G01R 33/302
See application file for complete search history.

(56) References Cited

U.S. PATENT DOCUMENTS

| 2003/0060409 | A1* | 3/2003 | Ramanathan | C07K 14/705 435/6.14 |
| 2009/0102482 | A1* | 4/2009 | Freytag | G01R 33/30 324/318 |
| 2009/0323864 | A1 | 12/2009 | Tired | |
| 2011/0020455 | A1* | 1/2011 | Yoshida | A61K 9/1611 424/489 |
| 2012/0087867 | A1* | 4/2012 | McCamey | A61K 49/06 424/9.3 |
| 2012/0112956 | A1 | 5/2012 | Trotta et al. | |

(Continued)

OTHER PUBLICATIONS

F. Goda et al., In vivo Oximetry using EPR and India Ink, Magnetic Reasonance in Medicine, vol. 33, pp. 237-245, Feb. 1995.

(Continued)

*Primary Examiner* — Gregory H Curran
(74) *Attorney, Agent, or Firm* — Winstead PC

(57) ABSTRACT

A method includes generating, from an integrated oscillator circuit, an oscillating output signal and generating, by an integrated power amplifier (PA) circuit, an amplified oscillating output signal based on the oscillating output signal. The method further includes receiving, by integrated receiver amplifier circuit, an electron spin resonance (ESR) signal from biological samples that include a magnetic species and generating, by the integrated receiver amplifier circuit, an amplified ESR signal based on the received ESR signal. The method further includes receiving, by the integrated receiver amplifier circuit, an electron spin resonance (ESR) signal from magnetic nanoparticles that are loaded with drugs or attached to human cells.

37 Claims, 50 Drawing Sheets

(56) References Cited

U.S. PATENT DOCUMENTS

| | | |
|---|---|---|
| 2013/0093424 A1 | 4/2013 | Blank et al. |
| 2013/0257431 A1 | 10/2013 | Tseitlin et al. |
| 2014/0091802 A1 | 4/2014 | Yang et al. |
| 2014/0247048 A1 | 9/2014 | Cochrane et al. |
| 2014/0285198 A1 | 9/2014 | Halpern |
| 2016/0223478 A1 | 8/2016 | Babakhani et al. |
| 2016/0233969 A1 | 8/2016 | Kordik et al. |

OTHER PUBLICATIONS

B. B. Williams et al., Clinical Electron Paramagnetic Resonance (EPR) Oximetry Using India Ink, Advances in Experimental Medicine and Biology. vol. 662, pp. 149-156, Aug. 2010.

Kuppusamy et al., Cardiac applications of EPR imaging, NMR in Biomedicine, vol. 17, pp. 226-239, 2004.

H. M. Swartz, et al., "Clinical applications of EPR: overview and perspectives", NMR Biomed., vol. 17, pp. 335-351, 2004.

I. Salikhov, et al., "EPR Spectrometer for Clinical Applications", Magnetic Resonance in Medicine., vol. 54, pp. 1317-1320, 2005.

C. Poole, "Electron Spin Resonance: A Comprehensive Treatise on Experimental Techniques" John Wiley & Sons, p. 443, 1982.

* cited by examiner

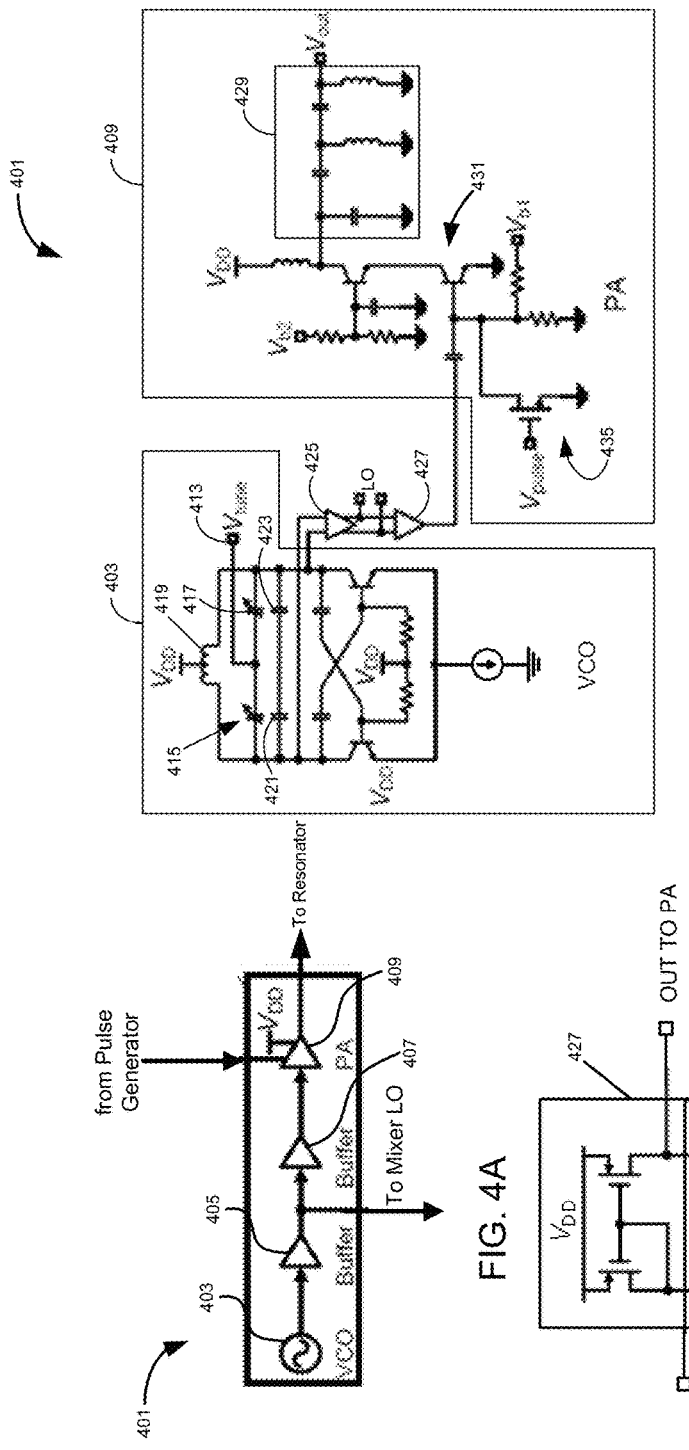

| SoC Specifications | |
|---|---|
| Process | IBM 8HP 0.13μm SiGe BiCMOS |
| Die specifications | 2.5mm x 1.5mm, 59 pins (8 test) |
| Power consumption | 425mW |
| Operating Voltage | 2.0V and 1.5V (analog), 1.2V (digital) |
| Transmitter | |
| VCO frequency range | 770MHz – 970MHz |
| PA power gain | 15dB |
| RF pulse width (in pulse mode) | 20ns – 400ns |
| Receiver (designed values) | |
| LNA Power gain | 40dB |
| LNA Noise figure | 3.7dB |
| LNA 1dB compression point | -15dBm (Output referred) |
| Programmable pulse generator | |
| Pulse width | 20ns to 400ns |
| Pulse width resolution | 0.5ns |

Figure S3: SoC specifications.

FIG. 18A

| SoC Specifications | |
|---|---|
| Process | IBM 8HP 0.13μm SiGe BiCMOS |
| Die specifications | 1mm x 2mm, 54 pins (47 I/O, 7 test) |
| Power consumption | 385mW |
| Operating Voltage | 2.0V and 1.5V (analog), 1.2V (digital) |
| Transmitter | |
| Operation frequency | 22-26GHz |
| Pulse Frequency | 1-10MHz |
| Pulse Width | 0.5ns-500ns |
| Pulse Resolution | 490ps |
| Transmitter Gain | 936A/W (excitation current/VCO output power) |
| Receiver | |
| Operation Frequency | 22-26GHz |
| LNA Voltage Gain | 61dB |
| Receiver Gain | 244W/A (baseband output power/detection current) |

FIG. 18B

| Distance (cm) | B-Field Stregth (kG) | | | | |
|---|---|---|---|---|---|
| | 1 | 2 | 3 | 4 | 5 |
| 0 | 0.57 | 1.47 | 1.45 | 1.3 | 1.38 |
| 0.25 | 0.57 | 1.05 | 0.9 | 0.93 | 1.05 |
| 0.5 | 0.55 | 0.47 | 0.42 | 0.26 | 0.53 |
| 0.75 | 0.51 | 0.36 | 0.25 | 0.17 | 0.28 |
| 1 | 0.5 | 0.38 | 0.16 | 0.12 | 0.14 |
| 1.25 | 0.4 | 0.3 | 0.34 | 0.14 | 0.13 |
| 1.5 | 0.45 | 0.27 | 0.2 | 0.15 | 0.104 |
| 1.75 | 0.36 | 0.23 | 0.12 | 0.14 | 0.05 |
| 2 | 0.3 | 0.19 | 0.177 | 0.085 | 0.08 |
| 3 | 0.2 | | | | |
| 3.5 | 0.11 | | | | |
| 4 | 0.095 | | | | |

ELECTRON SPIN RESONANCE FOR MEDICAL IMAGING

CROSS-REFERENCE TO RELATED APPLICATIONS

This application claims priority, pursuant to 35 U.S.C. §119(e), to U.S. Provisional Application No. 61/707,441, the contents of which is incorporated by reference herein in its entirety.

BACKGROUND

Electron spin resonance (ESR), also equivalently referred to herein as electron paramagnetic resonance (EPR), is a spectroscopic and imaging technique that is capable of providing quantitative information regarding the presence and concentration of a variety of magnetic species within a sample under test, e.g., a biological tissue sample. The valence electron(s) of a magnetic species possess unpaired spin angular momentum and thus, have net magnetic moments that tend to align along an externally applied magnetic field. This alignment process is known as magnetization. ESR is a measurement technique that relies on the external manipulation of the direction of this electron magnetization, also referred to as a net electronic magnetic moment. In a typical ESR experiment, a polarizing magnetic field $B_0$ is applied to a sample to align the magnetic moments of the electrons along the direction of the magnetic field $B_0$. Then, an oscillating magnetic field $B_1$, often referred to as the transverse magnetic field, is applied along a direction that is perpendicular to the polarizing field $B_0$. Usually the oscillating field $B_1$ is generated using a microwave resonator (a coil or a transmission line) and is designed to excite the unpaired electrons by driving transitions between the different angular momentum states of the unpaired electron(s).

Currently there are two major techniques used to perform ESR spectroscopy. The first is a continuous wave (CW), frequency domain method and the second is a pulse-based, time domain technique. A CW spectrometer utilizes a continuous, narrow-band signal to create $B_1$ and thus, energize unpaired electrons in the presence of the external DC magnetic field $B_0$. In CW spectroscopy, an absorption spectrum of the sample is obtained by either sweeping the frequency of $B_1$ while $B_0$ is kept constant or by sweeping $B_0$ while the frequency of $B_1$ is kept constant. CW spectroscopy has been traditionally used for ESR because it is simpler in terms of circuitry and is able to detect samples even with very fast relaxation times (tens of nanoseconds). However, direct measurement of certain spin relaxation parameters, such as the longitudinal relaxation time, also referred to as the spin-lattice relaxation time ($T_1$) and/or the transverse relaxation time, also referred to as the spin-spin relaxation time ($T_2$) is feasible using time domain or pulse techniques. In pulse ESR, instead of sweeping a continuous signal, $B_1$ is pulsed in a precisely designed pulse sequence to manipulate the direction of the spins of the unpaired electrons. The subsequent time-domain ESR signal emitted from the electrons as they relax back to their equilibrium state is then recorded by a receiver resonator. In pulsed ESR, wideband spectral information relating to the ESR samples may be reproduced using Fourier transform techniques applied to the ESR signal.

Presently, ESR imaging and spectroscopy are conducted using systems that employ a large number of discrete radiofrequency (RF) or microwave components. For example, current systems employ discrete RF sources, pulse generators, power amplifiers, lock-in amplifiers, resonators, mixers, analog-to digital converters, connecting cables, etc. However, as the instrument sizes exceed the characteristic wavelengths corresponding to the ESR experiment frequency (typically less than 1 meter, corresponding to a frequency of 300 MHz) the spectrometer/imager becomes sensitive to radiative effects and noise from the ambient RF radiation. This results in noisy and/or unstable data. Furthermore, the weight of the magnets and the RF components is typically hundreds of kilograms thereby prohibiting the portability of currently existing ESR spectrometers/imagers. Furthermore, the cost of building an ESR imager from discrete components can be prohibitively high. Finally large, discrete ESR imagers also have slow response times. This becomes a key limitation for time-domain imaging/spectroscopy, where the response time of the imager determines the shortest relaxation time that can be detected using time-domain ESR. Current in-vivo ESR imagers have response times that are limited to 1 microsecond or greater.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

In general, in one aspect, one or more embodiments are directed to a method of obtaining an electron spin resonance (ESR) signal from a biological sample using an integrated electron spin resonance circuit chip having a chip substrate. The method includes generating, from an integrated oscillator circuit, an oscillating output signal and generating, by an integrated power amplifier (PA) circuit, an amplified oscillating output signal based on the oscillating output signal. The method further includes receiving, by integrated receiver amplifier circuit, an ESR signal from the biological sample that includes a magnetic species and generating, by the integrated receiver amplifier circuit, an amplified ESR signal based on the received ESR signal. The method further includes down-converting, by an integrated mixer circuit, the amplified ESR signal to a baseband signal and generating, by an integrated baseband amplifier circuit, an amplified baseband signal based on the baseband signal. The integrated oscillator circuit, the integrated PA circuit, the integrated receiver amplifier circuit, and integrated mixer circuit, and the integrated baseband amplifier circuit are all disposed on the chip substrate.

Other aspects of the invention will be apparent from the following description and the appended claims.

BRIEF DESCRIPTION OF DRAWINGS

FIGS. 4A-4C show an integrated transmitter circuit in accordance with one or more embodiments of the invention.

FIGS. 6B, 6C, 6D, 6E, 6F, 6G, and 6H correspond to layers M7 or AM (aluminum, top layer), M6 or LY (aluminum), M5 or MQ (copper), M4 (copper), M3 (copper), M2 (copper), and M1 (copper, bottom layer).

FIGS. 6B, 6C, 6D, 6E, 6F, 6G, and 6H correspond to layers M7 or AM (aluminum, top layer), M6 or LY (aluminum), M5 or MQ (copper), M4 (copper), M3 (copper), M2 (copper), and M1 (copper, bottom layer).

FIGS. 18A-18B show system specification for integrated transceiver circuits in accordance with one or more embodiments of the invention.

FIG. 27A shows a detected ESR signal as a function of distance from the front surface of a permanent magnet. This measurement uses a fixed distance between a resonator and a sample. FIG. 27B shows the magnetic field as a function of distance from the same permanent magnet for purposes of calibration.

FIG. 28A shows the detected ESR signal for a varying distance (from 0 mm to 5 mm) between a resonator and a sample. FIG. 28B shows the detected ESR signal for a varying distance (from 0 mm to 35 mm) between a resonator and a sample. FIG. 28C shows the detected ESR signal for a varying distance (from 0 mm to 40 mm) between a resonator and a sample using a different resonator.

DETAILED DESCRIPTION

Figure 1A:
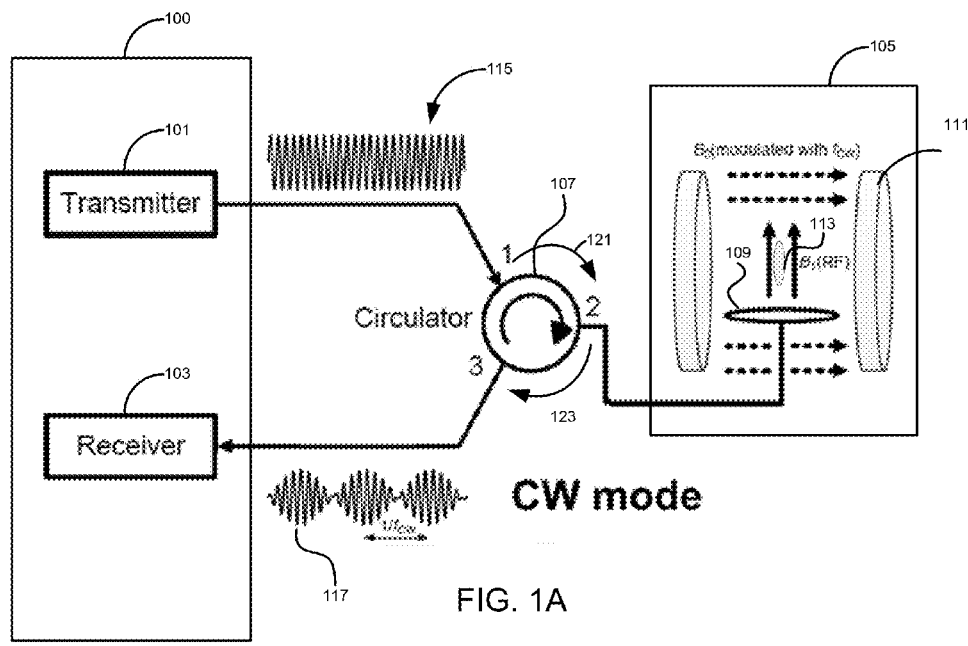
FIGS. 1A-1B show an integrated electron spin resonance (ESR) spectrometer in accordance with one or more embodiments of the invention.

Specific embodiments of an integrated electron spin resonance (ESR) spectrometer will now be described in detail with reference to the accompanying figures. Like elements in the various figures (also referred to as FIGURES) are denoted by like reference numerals for consistency.

In the following detailed description of embodiments, numerous specific details are set forth in order to provide a more thorough understanding of integrated ESR spectrometer. However, it will be apparent to one of ordinary skill in the art that these embodiments may be practiced without these specific details. In other instances, well-known features have not been described in detail to avoid unnecessarily complicating the description.

In general, embodiments of the invention relate to an integrated ESR spectrometer. As used herein, the term integrated refers to a monolithic circuit that is integrated onto a single chip substrate. Furthermore the term chip substrate is used herein broadly to include any layer of a multi-layer integrated circuit. For example, one or more embodiments of an integrated ESR spectrometer include a transmitter, receiver, and a programmable pulse generator that are formed on the same ship substrate, e.g., the circuitry may be implemented in silicon by way of a 0.13 µm SiGeBiCMOS process, or the like. In accordance with one or more embodiments, the integrated transceiver of the ESR spectrometer disclosed herein is capable of operating in a continuous wave (CW) mode and/or a pulse mode. In accordance with one or more embodiments, the integrated ESR spectrometer may also include an integrated ESR probe that employs an integrated resonator for exciting and receiving ESR signals from a sample under test. In accordance with one or more embodiments, the integrated ESR spectrometer may also include an external ESR probe that employs an external resonator for exciting and receiving ESR signals from a sample under test.

In accordance with one or more embodiments, the integrated ESR transceiver chip includes an integrated programmable pulse generator that may produce RF pulses having varying durations and spacings. Programmable pulse durations are possible that have durations that range from 0.5 ns to 500 ns. In addition, the integrated transmitter circuit of the integrated ESR transceiver chip may be switched off very quickly, e.g., in approximately 1 ns. This results in a spectrometer that has a very short, approximately 1 ns, dead time. As used herein, the term spectrometer dead time refers to the minimum duration of time that must elapse between excitation and detection of the ESR signal form the sample.

This programmable pulse capability in combination with this short dead time allows the integrated ESR spectrometer to be used for time domain ESR spectroscopy as well as frequency domain ESR spectroscopy. Furthermore, the integrated ESR system may be used across a number of different frequency ranges. For example, one or more embodiments disclosed herein operate within a range of about 0.5-27 GHz. However, other frequency ranges may be used without departing from the scope of the present disclosure.

Furthermore, as used herein the terms ESR and EPR are understood to be completely synonymous and interchangeable and thus, the use of one or the other is not meant to differentiate between the magnetic property of the sample under test. In other words as used herein the terms EPR and ESR are not meant to limit the type of electronic magnetic property of the sample, but rather are used generally to refer to the a measurement technique that manipulates the electronic magnetization of a sample. As used herein the term magnetic species is used broadly to cover all molecules, atoms, or particles with unpaired electron spins and thus, refers to all species that having a net electronic magnetic moment. Examples of magnetic species include but are not limited to para- or dia-magnetic atoms, molecules, ions, free radicals, or any type of paramagnetic nanoparticle, or any other magnetic particle that may be used to produce an ESR signal. Accordingly, the term EPR and ESR signal as used herein to refers to a signal that originates from the magnetic resonance of the species' electronic magnetic moment (or equivalently the net electronic angular momentum, spin or otherwise) of the species.

The integrated ESR spectrometer in accordance with one or more embodiments may be used to measure ESR parameters such as the spin-spin relaxation time ($T_2$) using RF pulse sequences having two or more RF pulses. In addition, the integrated ESR spectrometer may be used to measure ESR parameters such as the spin-lattice relaxation time ($T_1$) using inversion recovery techniques. In general, the integrated ESR spectrometer may be used to make any other type of time domain ESR measurement without departing from the scope of the present disclosure. In addition, by operating in CW mode, the integrated ESR spectrometer may be used to conduct frequency domain ESR spectroscopy.

In accordance with one or more embodiments, the integrated ESR spectrometer in accordance with one or more embodiments is extremely versatile and may be used in a number of different applications. Because of its small size, e.g., 1 mm by 2 mm, the integrated ESR transceiver chip may be employed in a non-invasive, point-of-care (POC) instrument. For example, integrated ESR spectrometer may be part of a handheld ESR system that may be used to study the properties of magnetic species such as metal ions in enzymes and/or free radicals involved in biochemical signaling pathways. In addition, the ESR system may be used to make direct measurements of the partial pressure of oxygen ($pO_2$) in tissues with high sensitivity and accuracy. Because $pO_2$ has been shown to be related to many diseases, e.g., cancer and peripheral vascular insufficiency, the ESR system in accordance with one or more embodiments may be used to diagnose disease. Furthermore, the integrated ESR system may be used to diagnose other diseases whose presence may be detectable using ESR, e.g., melanoma. In accordance with one or more embodiments, the integrated ESR system may be used to image free radicals and perform oximetry. Further examples of uses for the versatile integrated ESR system discloses herein include cancer tumor imaging and cardiac imaging. The invention is not limited to the aforementioned examples.

Figure 1B:
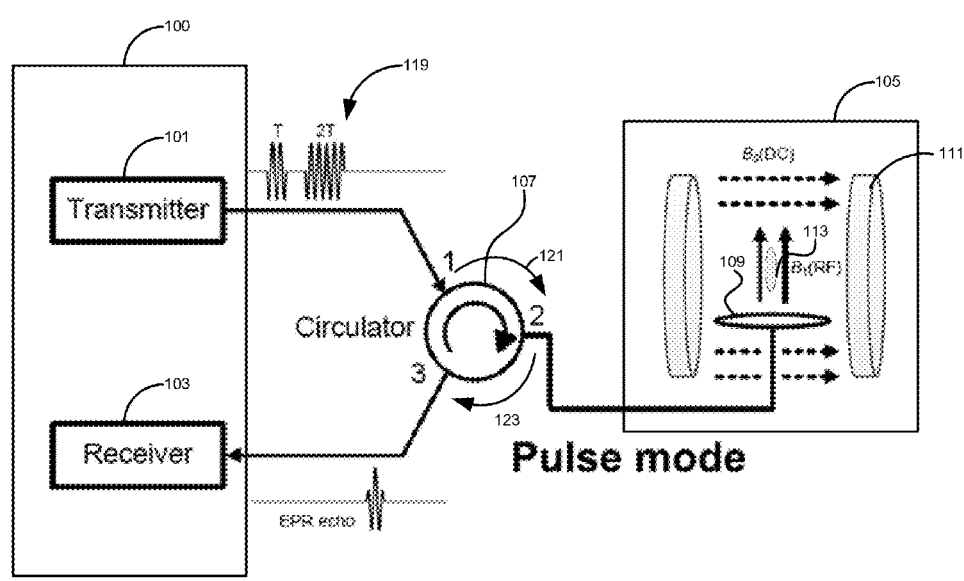

FIGS. 1A-1B show an integrated ESR system in accordance with one or more embodiments of the invention. In accordance with one or more embodiments, the system includes an integrated ESR transceiver chip 100 and an ESR probe module 105. Furthermore, in accordance with one or more embodiments, the integrated ESR transceiver chip 100 includes a transmitter circuit 101 and a receiver circuit 103. Each of these components of the system will be described in more detail below in reference to FIGS. 4-11. FIG. 1A shows the ESR system configured to perform CW ESR measurements. FIG. 1B shows the ESR system configured to performed pulsed ESR measurements. In accordance with one or more embodiments, both configurations may employ an RF circulator 107 such that the same resonator 109 may be used for both the transmission of RF power to the sample during the excitation phase and for the reception of the ESR signal from the sample during the detection phase. However, one or more embodiments of the invention may alternatively employ separate or multiple resonators for transmission and reception without departing from the scope of the present disclosure. In accordance with one or more embodiments, the transmitter circuit 101 and receiver circuit 103 may be located on the same chip substrate 100 and fabricated thereon as a single-chip transceiver, e.g., they may be implemented in a 0.13 µm SiGeBiCMOS process technology, as described in more detail below. Furthermore, although not shown in FIGS. 1A-1B, the resonator 109 may be integrated onto the transceiver chip 100 in accordance with one or more embodiments.

FIGS. 1A-1B further show that the ESR probe module 105 may include a magnet 111 that generates a bias magnetic field $B_0$ that is capable of being varied, e.g., capable of being modulated at a frequency $f_{CW}$. In accordance with one or more embodiments, the magnet 111 may be a solenoid electromagnet having a spatially uniform $B_0$ across the sample. Furthermore, a sample 113 may be located within the magnetic file $B_0$ of the magnet 111. The probe module 105 further includes the resonator 109 that may serve as a resonator for transmitting and receiving RF signals. In accordance with one or more embodiments, the resonator 109 may be integrated into the transceiver chip 100, e.g., in the form of a planar loop-gap resonator as described in more detail below in reference to FIGS. 7A-7B. While a single resonator 109 is shown here for simplicity, one or more embodiments of the invention may employ two or more resonators 109 that are also integrated onto the substrate 100. Such a configuration may or may not employ a circulator 107. When a circulator 107 is employed, the RF path 121, defined as the signal path from the transmitter to the resonator 109 that passes through ports 1 and 2 on the circulator 107, is isolated from the ESR signal path 123, defined as the signal path from the resonator to the receiver that passes through ports 2 and 3 on the circulator 107. Furthermore, one or more embodiments of the invention may employ an active feedback system for increasing the isolation between the RF path 121 and the ESR signal path 123, thereby reducing the amount of RF leakage power from the transmitter that is detected by the receiver during detection. For example, during CW operation, RF leakage may occur between ports 1 and 3 of the circulator 107.

In an ESR measurement in accordance with one or more embodiments, the magnetic field $B_0$ also referred to herein as the Zeeman field, may be generated by the magnet 111. As shown in FIGS. 1A-1B, this Zeeman field is present in both the CW and pulsed ESR measurements. The presence of $B_0$ in the sample volume introduces an energy difference $\Delta E$ between the spin states of the unpaired electron(s) in the sample 113. The energy difference $\Delta E$ between the spin states is proportional to both $B_0$ and g, where g is the g-factor, a physical parameter that is dependent on the electromagnetic microenvironment surrounding the unpaired electron. Furthermore, the sample 113 may be placed within the sample region of the resonator 109 so that the sample 113 is exposed to the oscillating $B_1$ field generated by the resonator 109. When operating near the resonance frequency f of the resonator 109, the resonator produces a strong RF magnetic field $B_1$ that is perpendicular to $B_0$. In accordance with one or more embodiments, the resonance frequency f is chosen such that $hf=\Delta E$, where h is Planck's constant. Thus, electron transitions between the spin states are possible and the RF energy generated by the resonator 109 is absorbed efficiently.

FIG. 1A shows an ESR system configured to operate in the CW mode in accordance with one or more embodiments. In the CW mode, a sinusoidal RF signal 115 is sent to the resonator 109 and reflected RF power 117 that is reflected from the resonator is measured to calculate the amount of the RF power absorbed by the sample 113. The absorbed power varies with the strength of the $B_0$ field and thus, the RF power absorption curve, reflected in the reflected RF power 117 as a function of $B_0$, reveals the magnetic properties of the sample 113. In accordance with one or more embodiments, in order to reduce the low frequency noise (1/f), $B_0$ may be modulated at a frequency $f_{CW}$ and the reflected power 117 may be measured at the same modulation frequency $f_{CW}$. Furthermore, in accordance with one or more embodiments, the $B_0$ field may be held constant and the RF frequency of the sinusoidal RF signal 115 may be modulated to perform the CW measurement.

FIG. 1B shows an ESR system configured to operate in the pulse mode in accordance with one or more embodiments. In pulse mode, the transmitter circuit 101 sends a sequence of RF pulses 119 to the resonator 109 to manipulate the direction of the spins of unpaired electrons of the sample 113. For example, in a spin echo measurement, a first RF pulse having a length T may flip the spins 90 degrees about $B_0$. Shortly after the flip, the sample may emit a free induction decay signal due to the de-phasing of the spins of the sample, which are now precessing, i.e., rotating, about the $B_0$ access. Additional pulses having a duration of 2 T that flips the spins by 180 degrees refocuses the de-phased spins and may cause one or more spin echo signals to be emitted from the sample. This ESR signal, in the form of a spin echo signal, is emitted by the sample 113 and then received by the resonator 109, now operating as a reception resonator. The ESR signal then travels to the receiver circuit 103 by way of the ESR signal path 123. By applying a properly timed sequence of RF pulses, the timing of and number of detected spin echoes can be controlled. Of course, one of ordinary skill having the benefit of this disclosure will recognize that any type of pulsed ESR measurement may be employed without departing from the scope of the present disclosure and thus, the spin echo measurement is described here should not be used to limit the scope of the invention.

Figure 2:
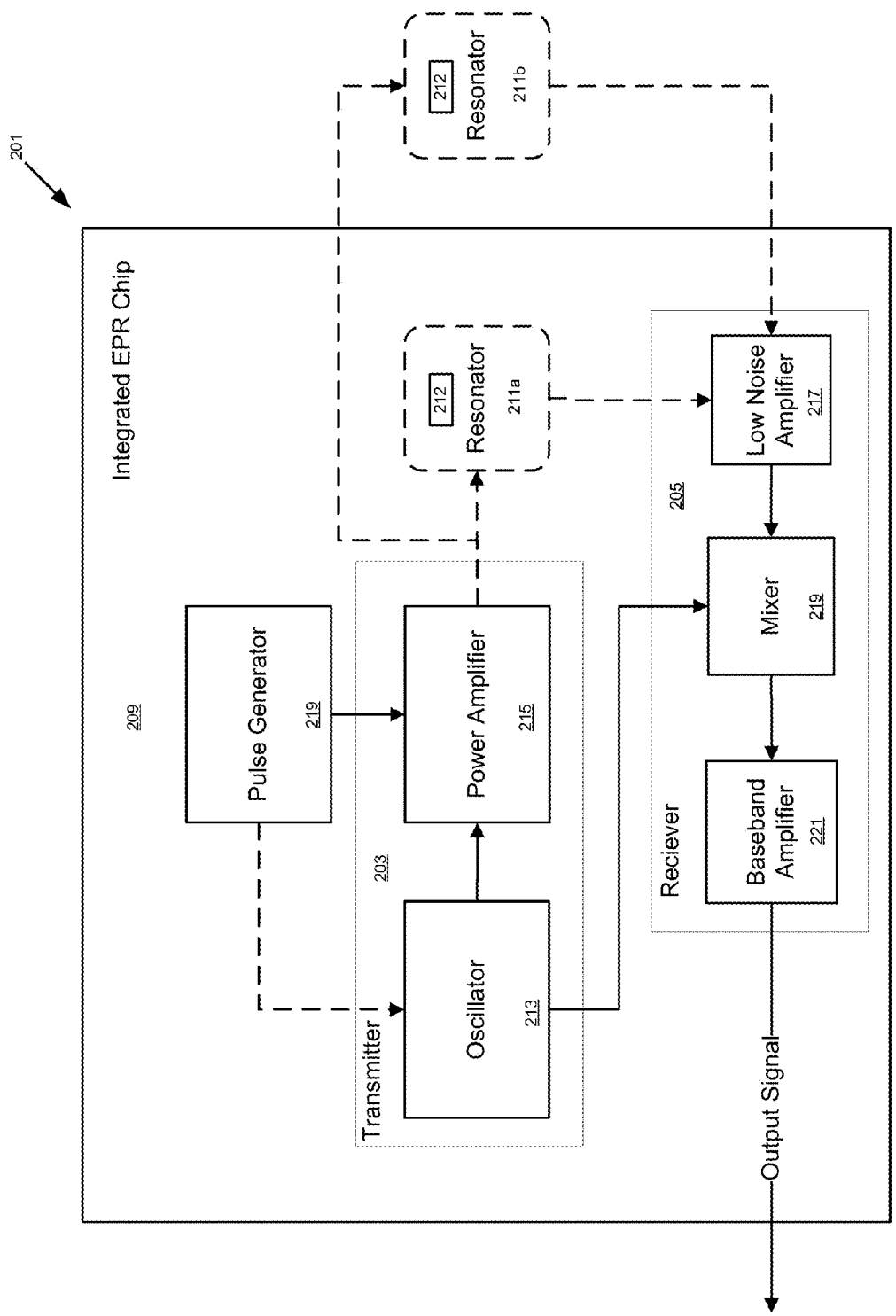
FIG. 2 show an integrated electron spin resonance (ESR) spectrometer in accordance with one or more embodiments of the invention.
Figure 6A:
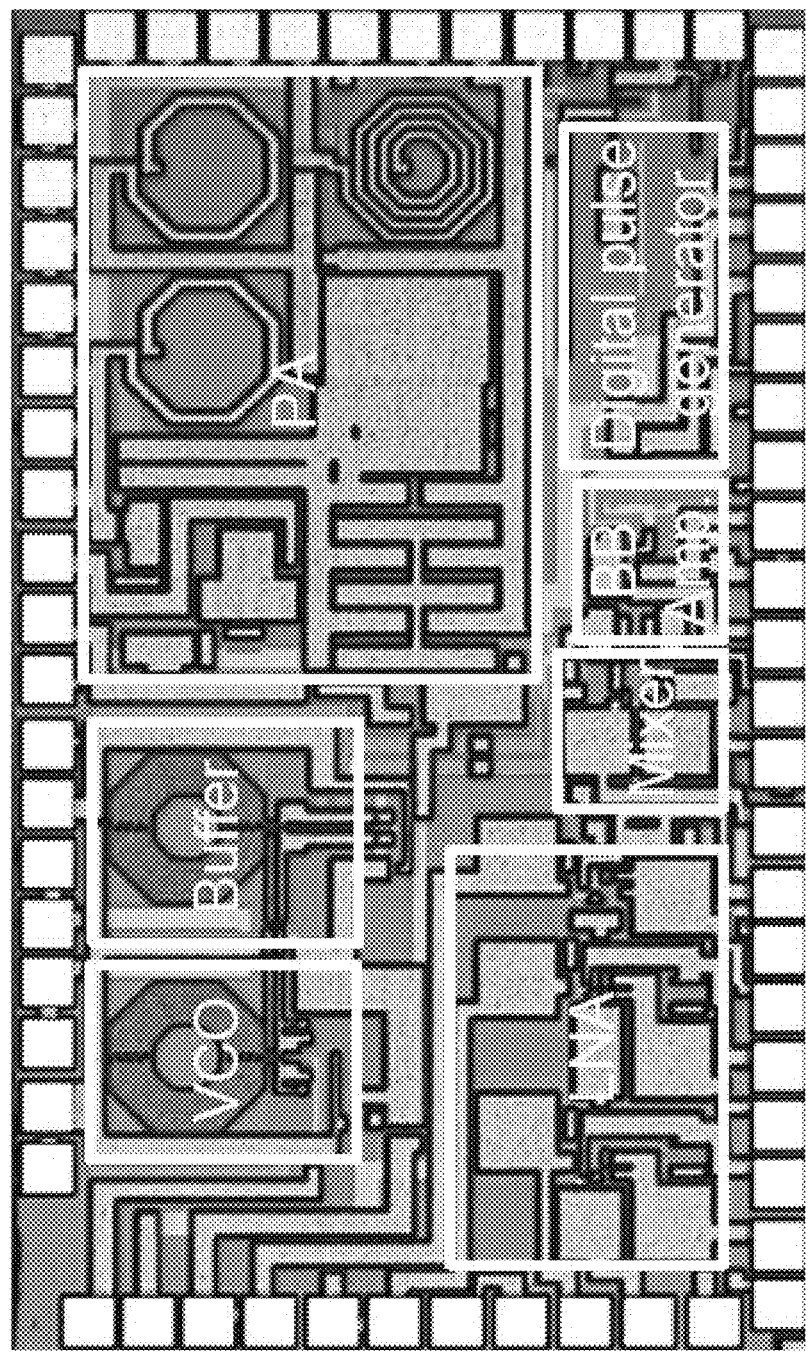
FIG. 6A shows a micrograph of an integrated transceiver circuit in accordance with one or more embodiments of the invention.
Figure 6B:
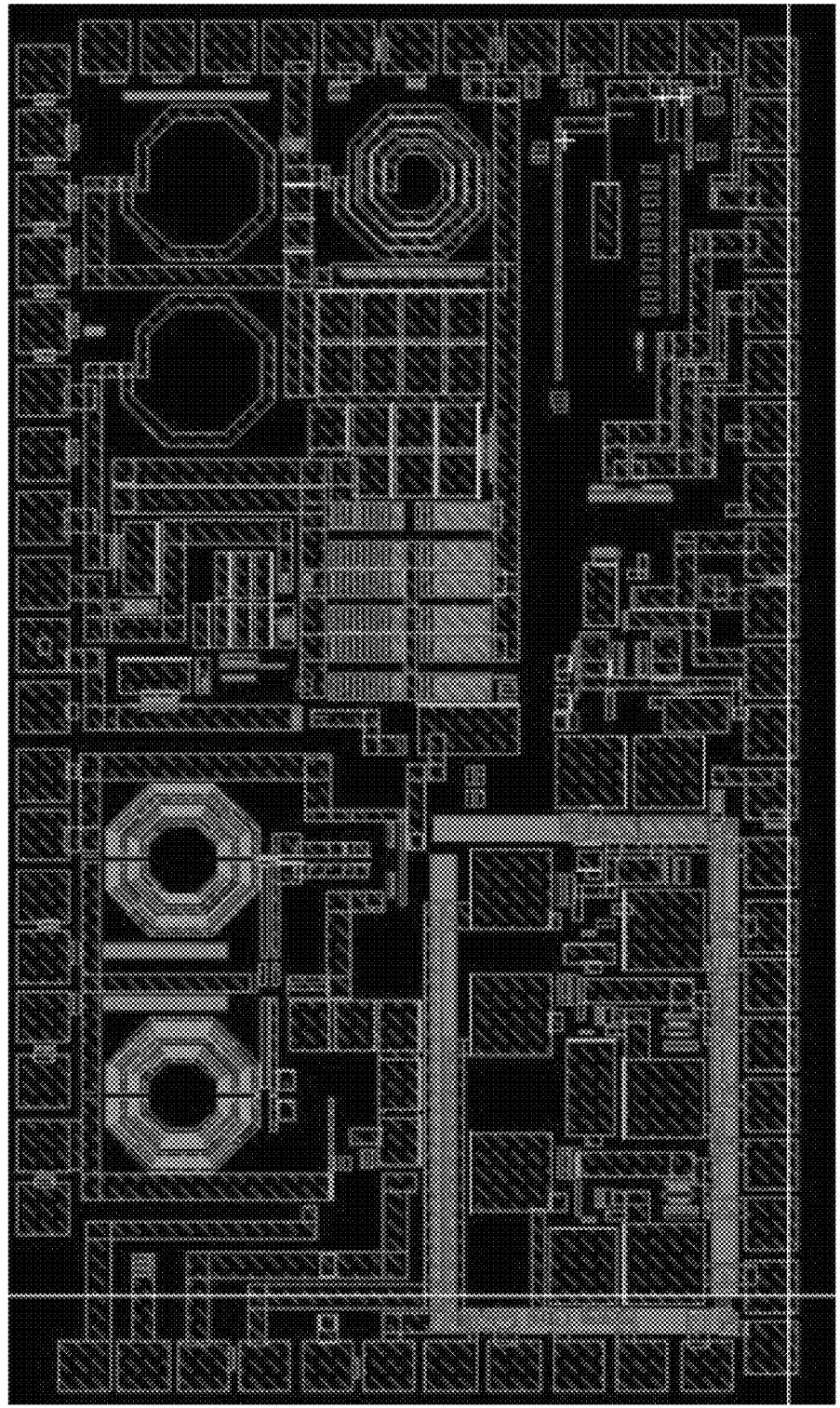
FIGS. 6B-6H show the metal layers of a multi-layer chip layout in accordance with one or more embodiments of the invention.
Figure 6C:
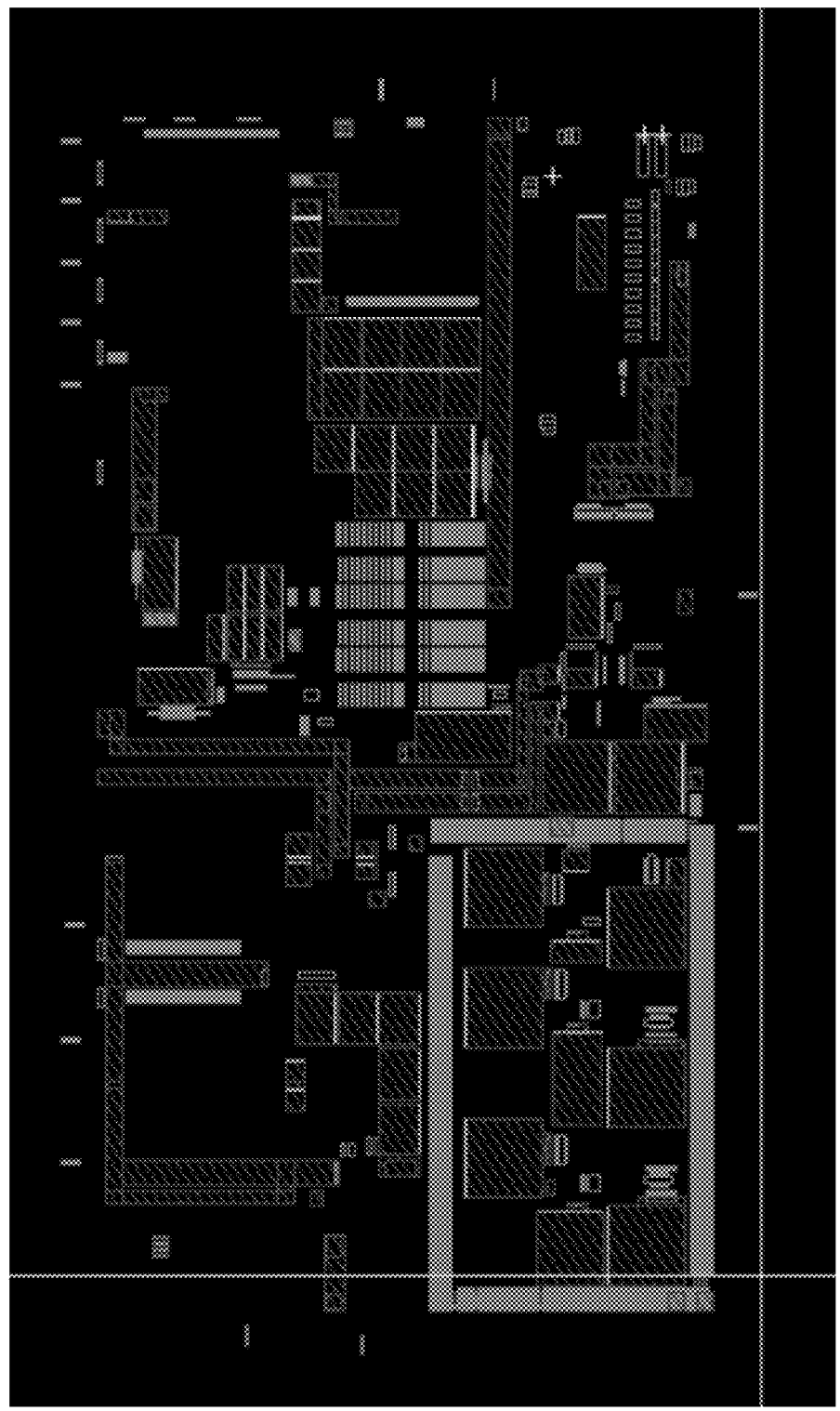
Figure 6D:
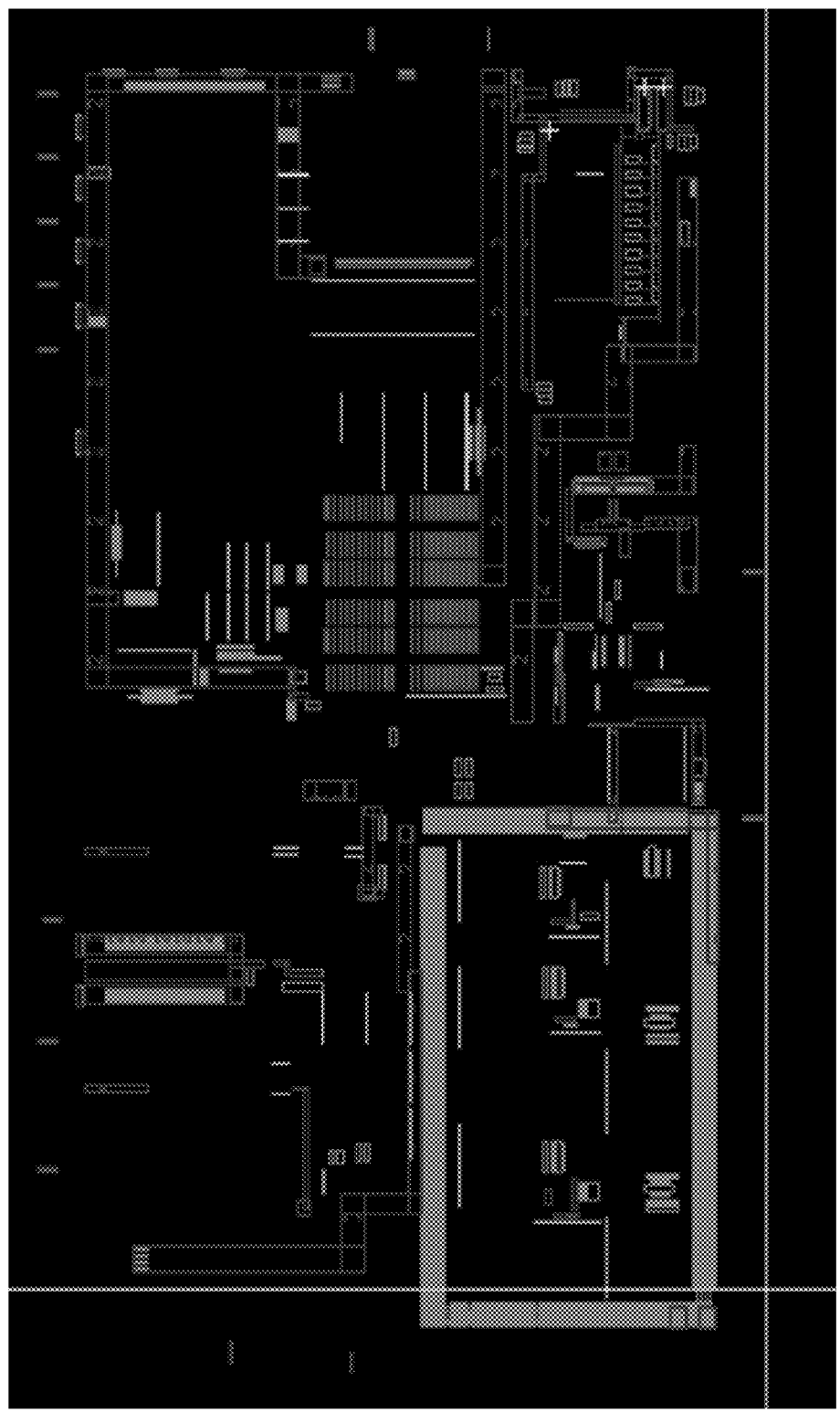
Figure 6E:
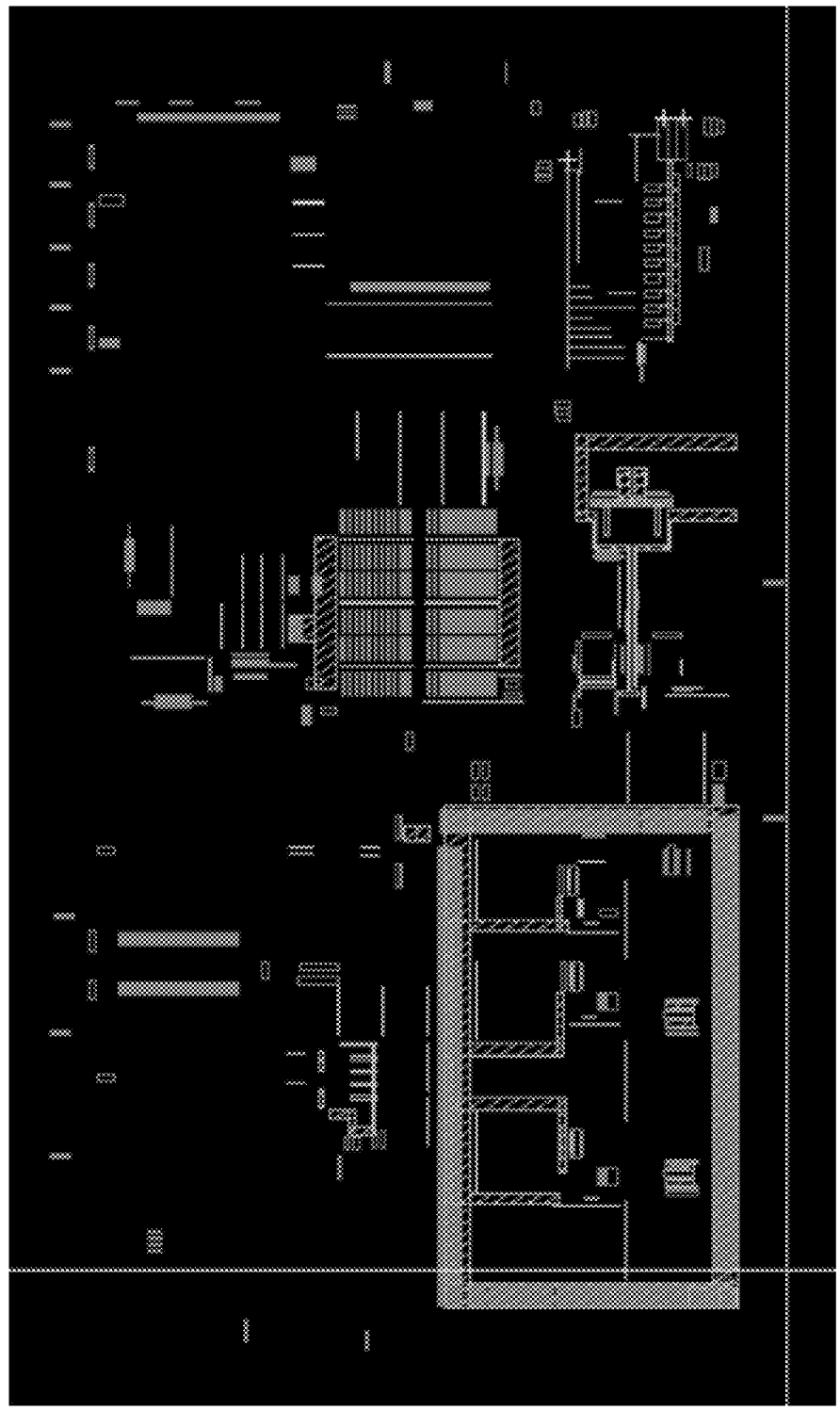
Figure 6F:
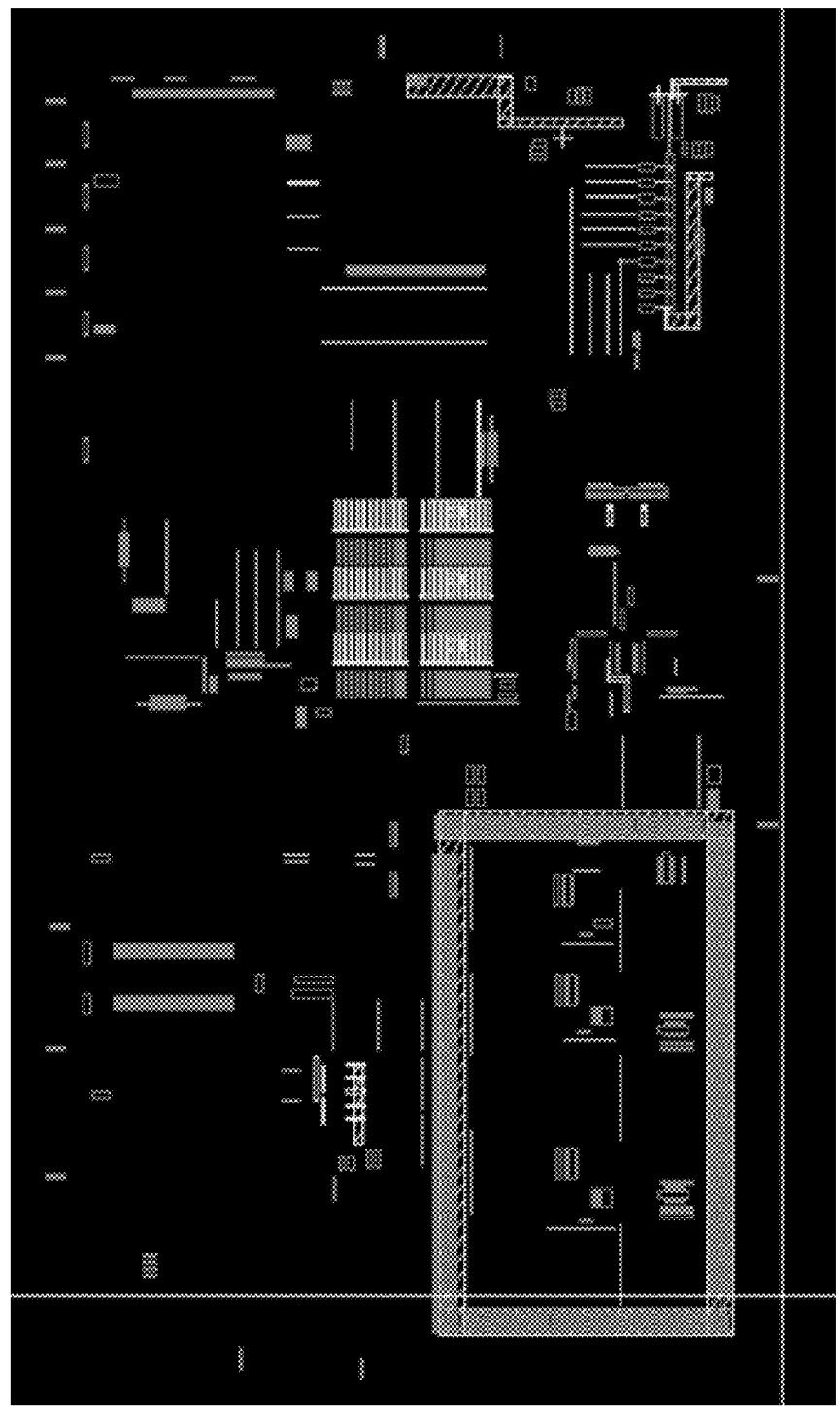
Figure 6G:
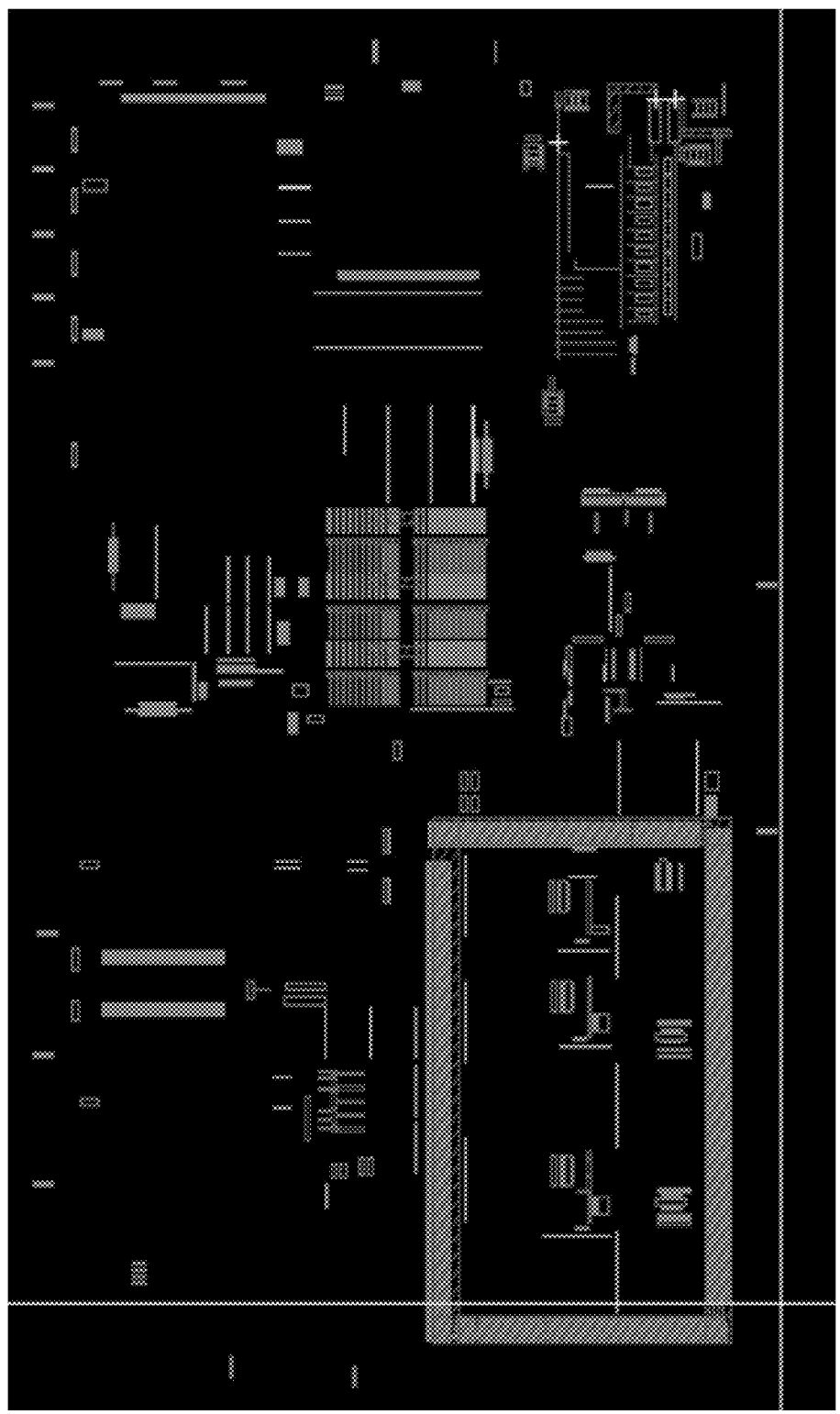
Figure 6H:
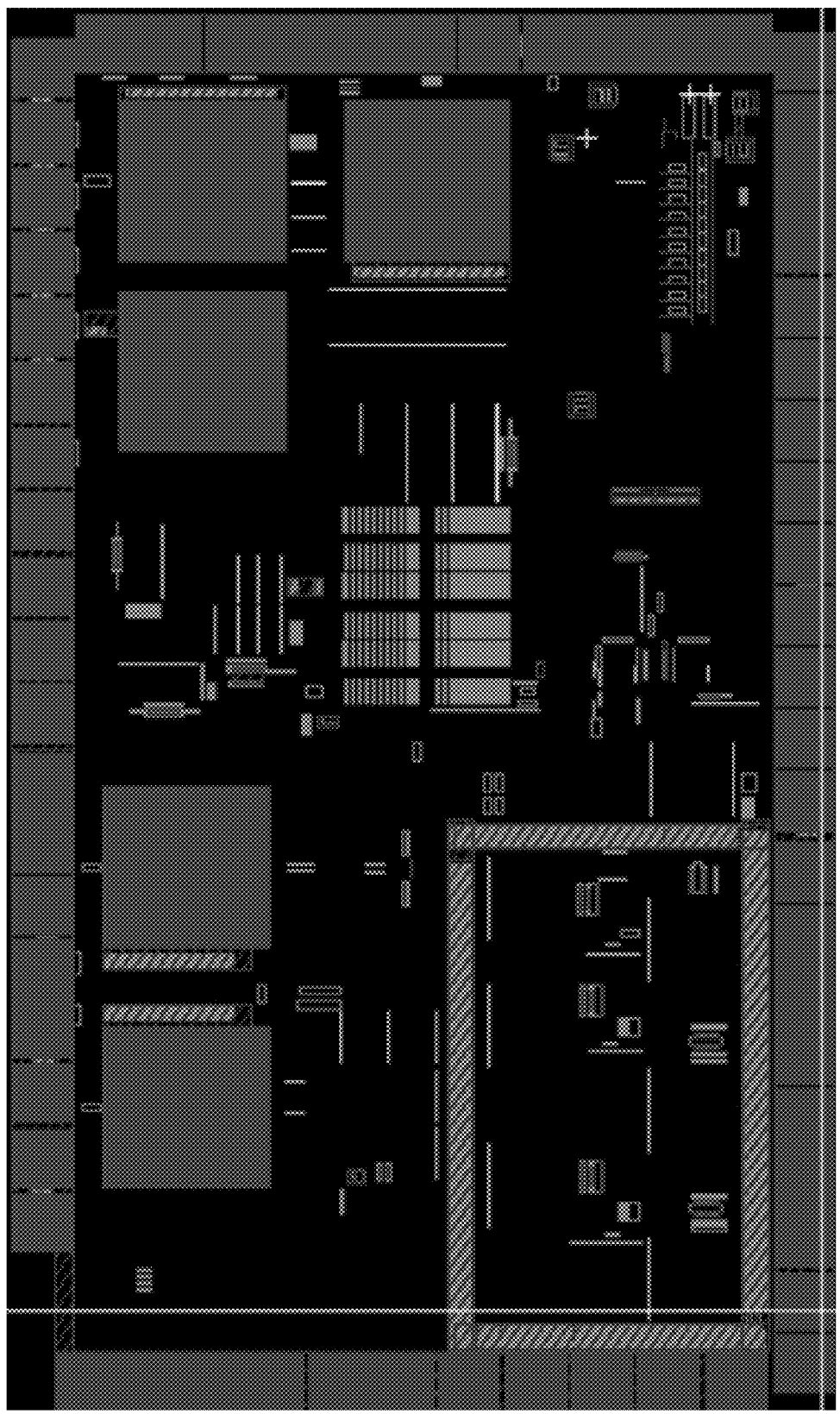
Figure 7A:
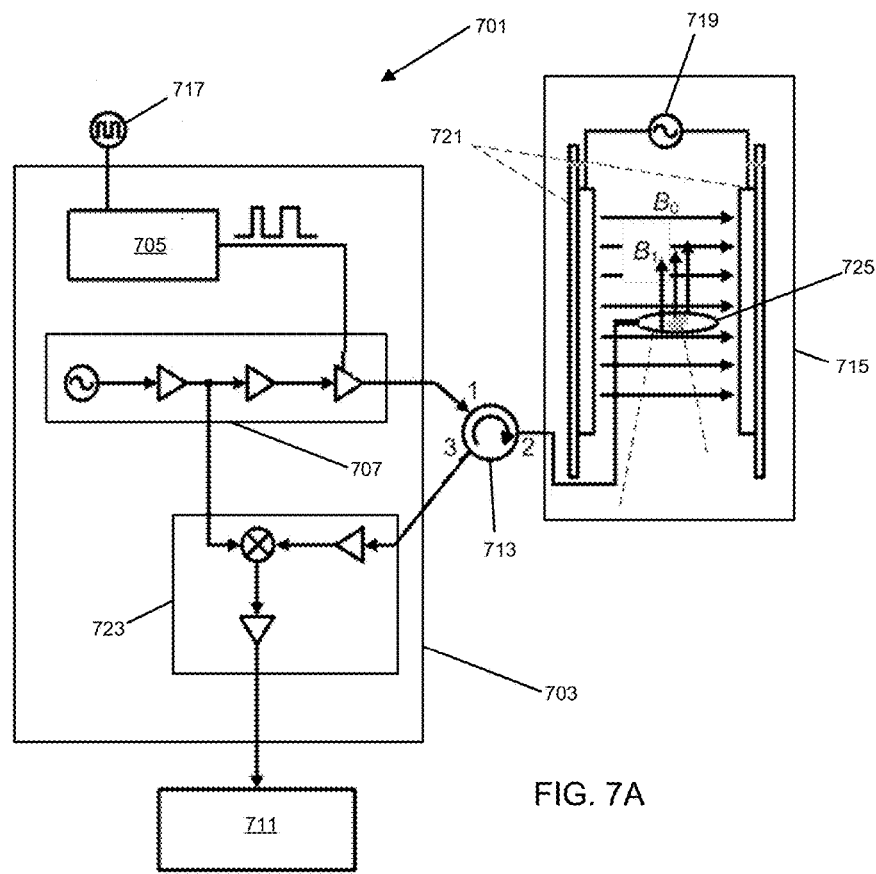
FIGS. 7A-7C show an integrated ESR spectrometer in accordance with one or more embodiments of the invention.
Figure 7B:
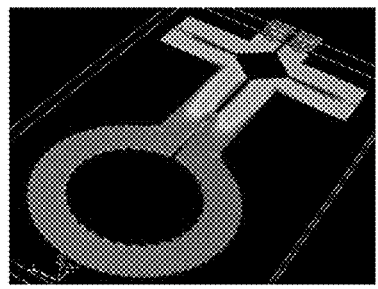
Figure 11A:
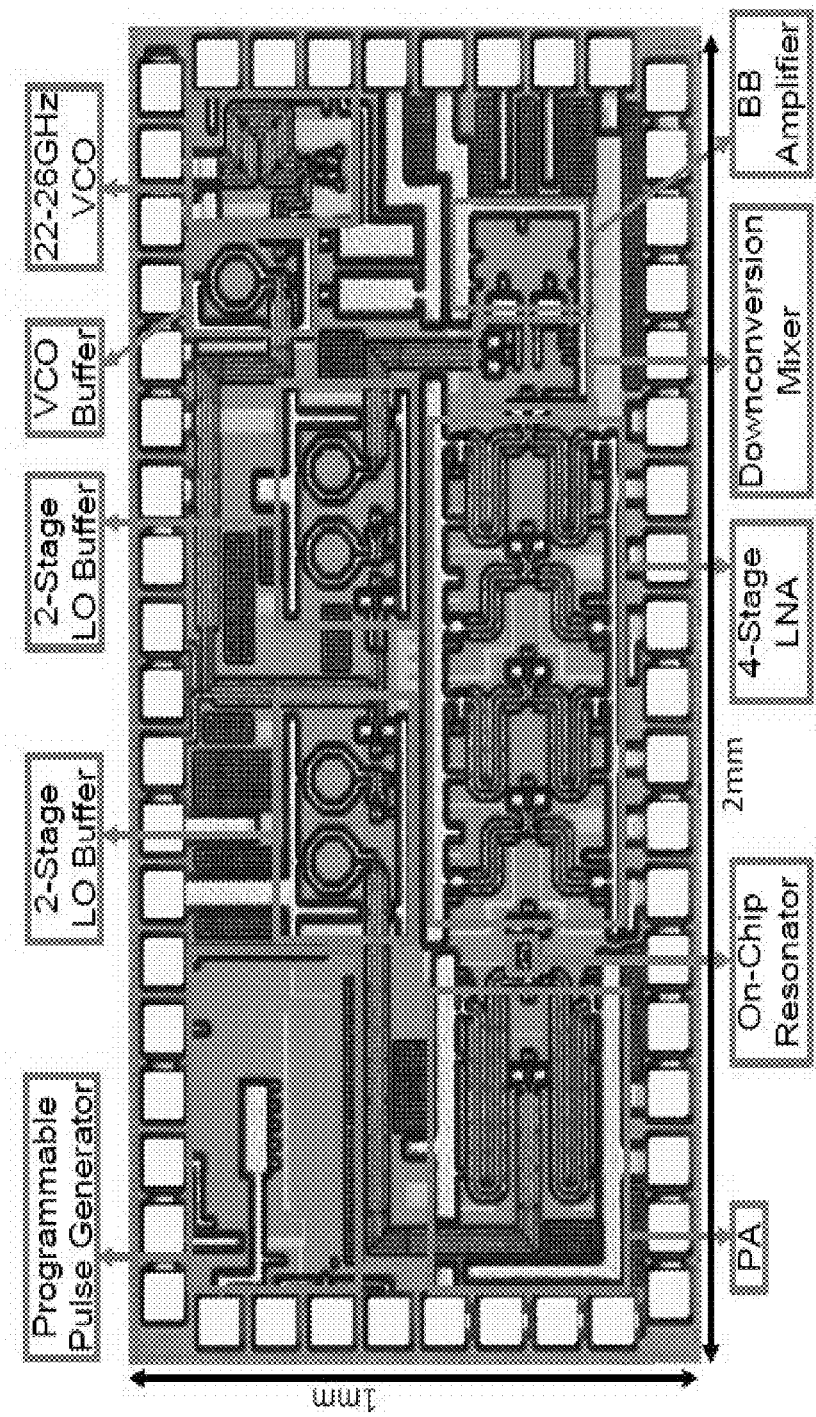
FIG. 11A shows a micrograph of an integrated transceiver circuit in accordance with one or more embodiments of the invention.
Figure 11B:
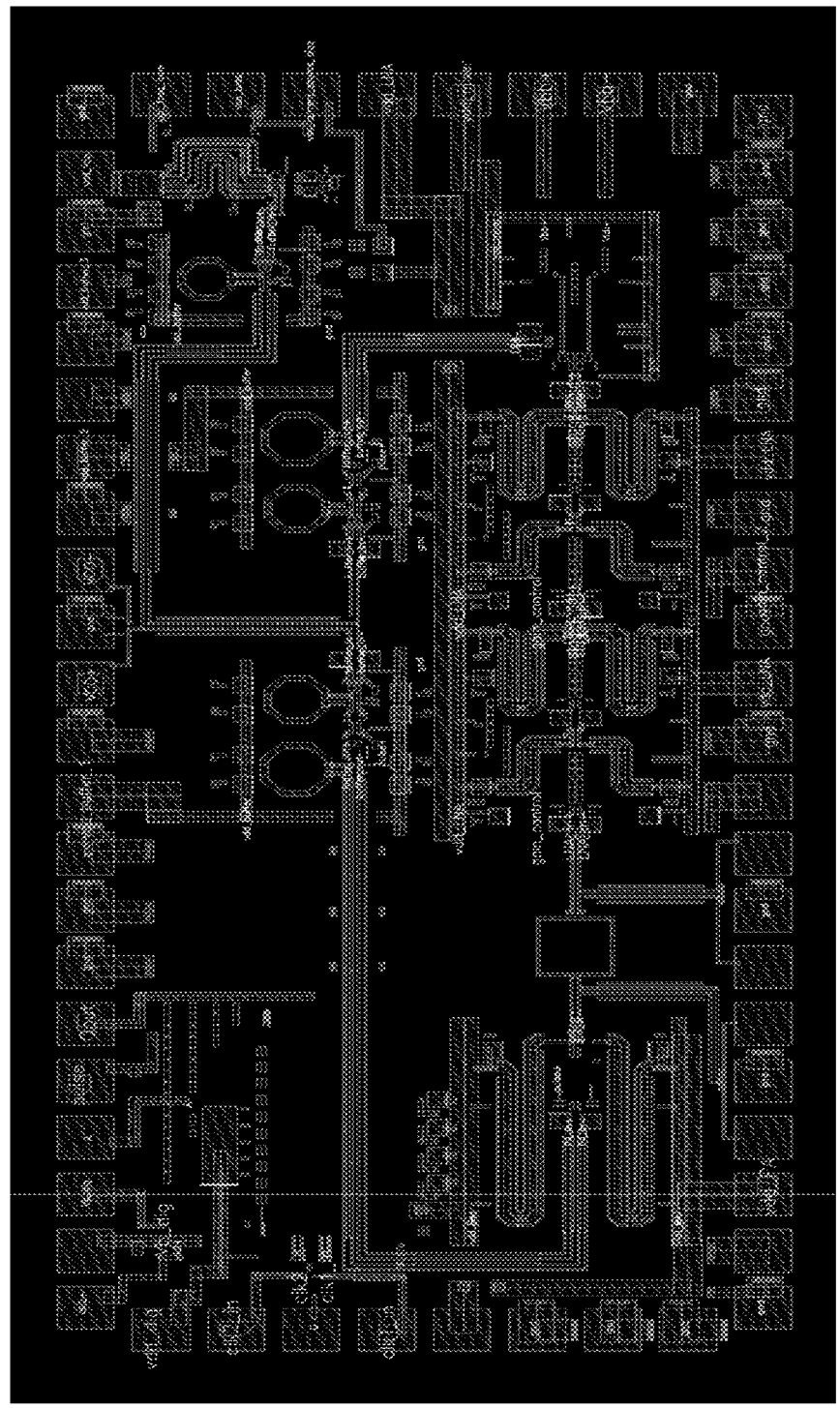
FIGS. 11B-11H show the metal layers of a multi-layer chip layout in accordance with one or more embodiments of the invention.
Figure 11C:
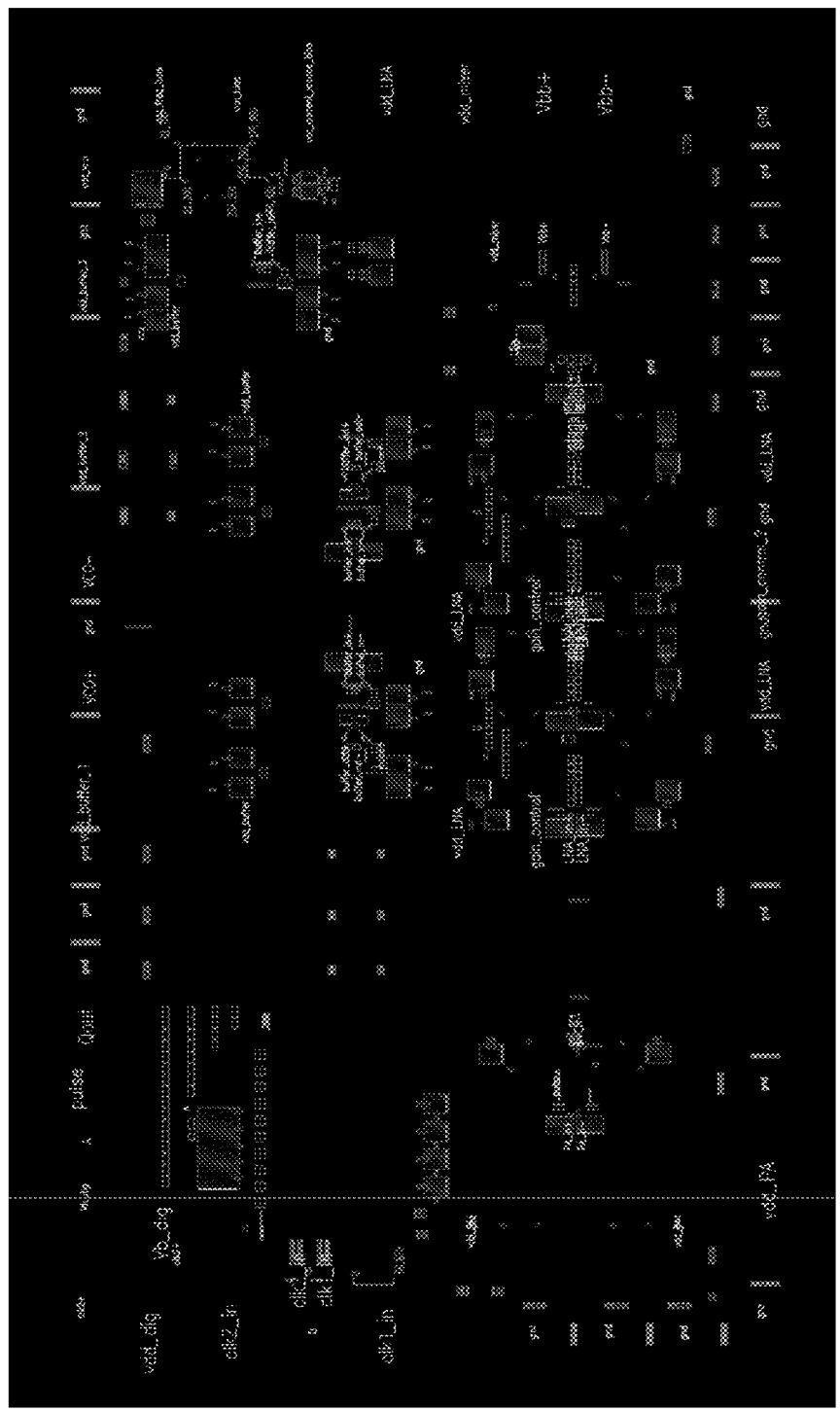
Figure 11D:
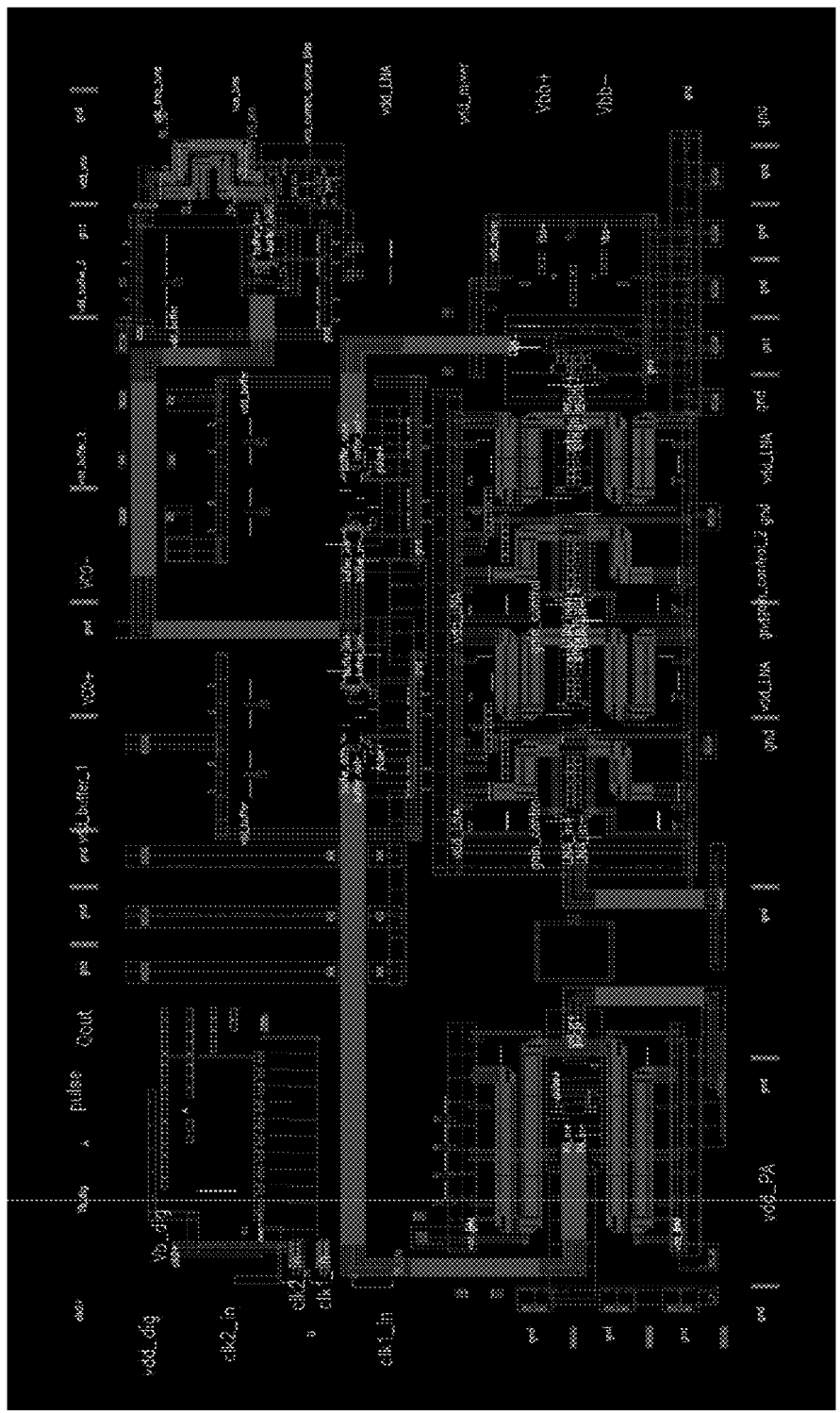
Figure 11E:
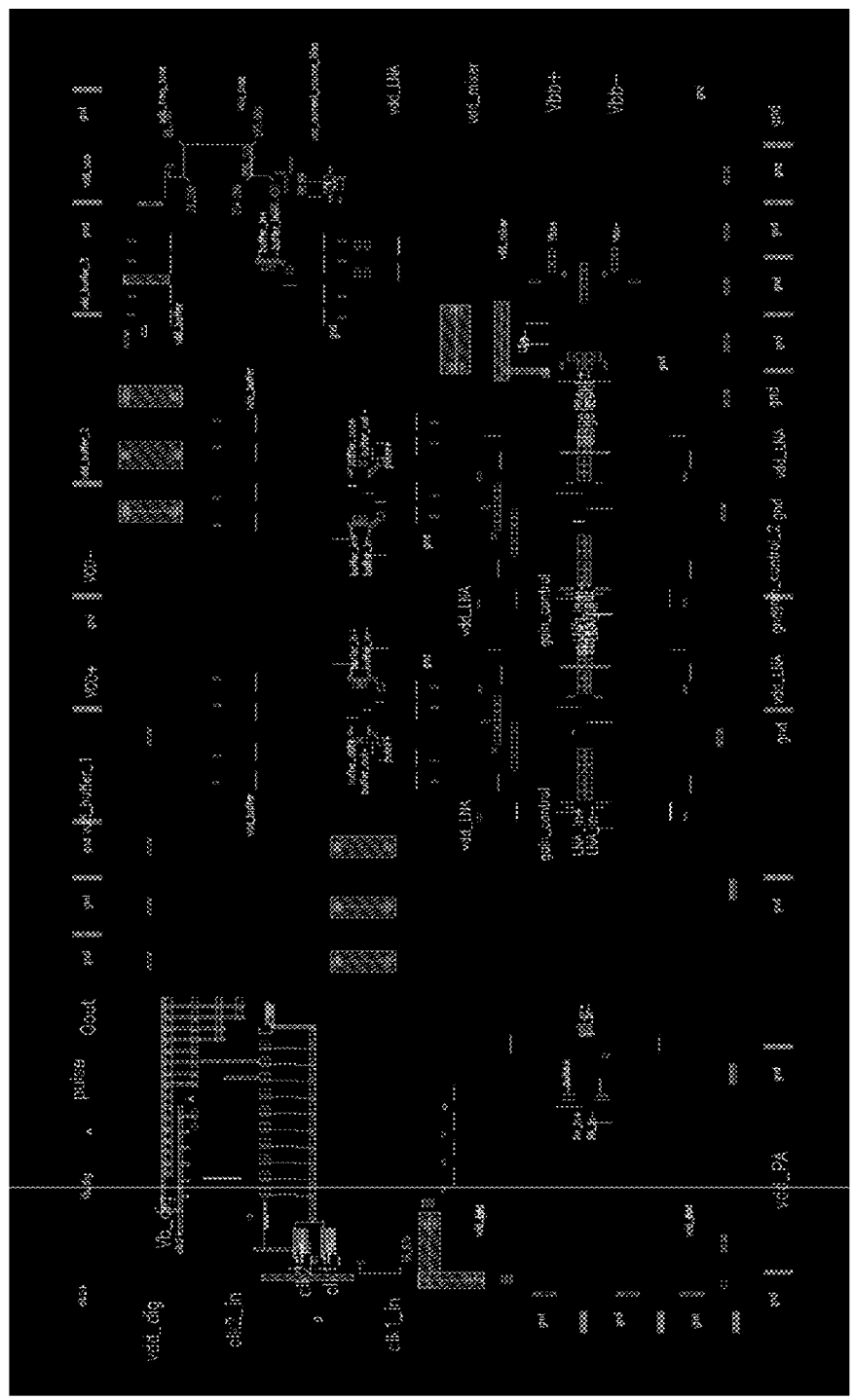
Figure 11F:
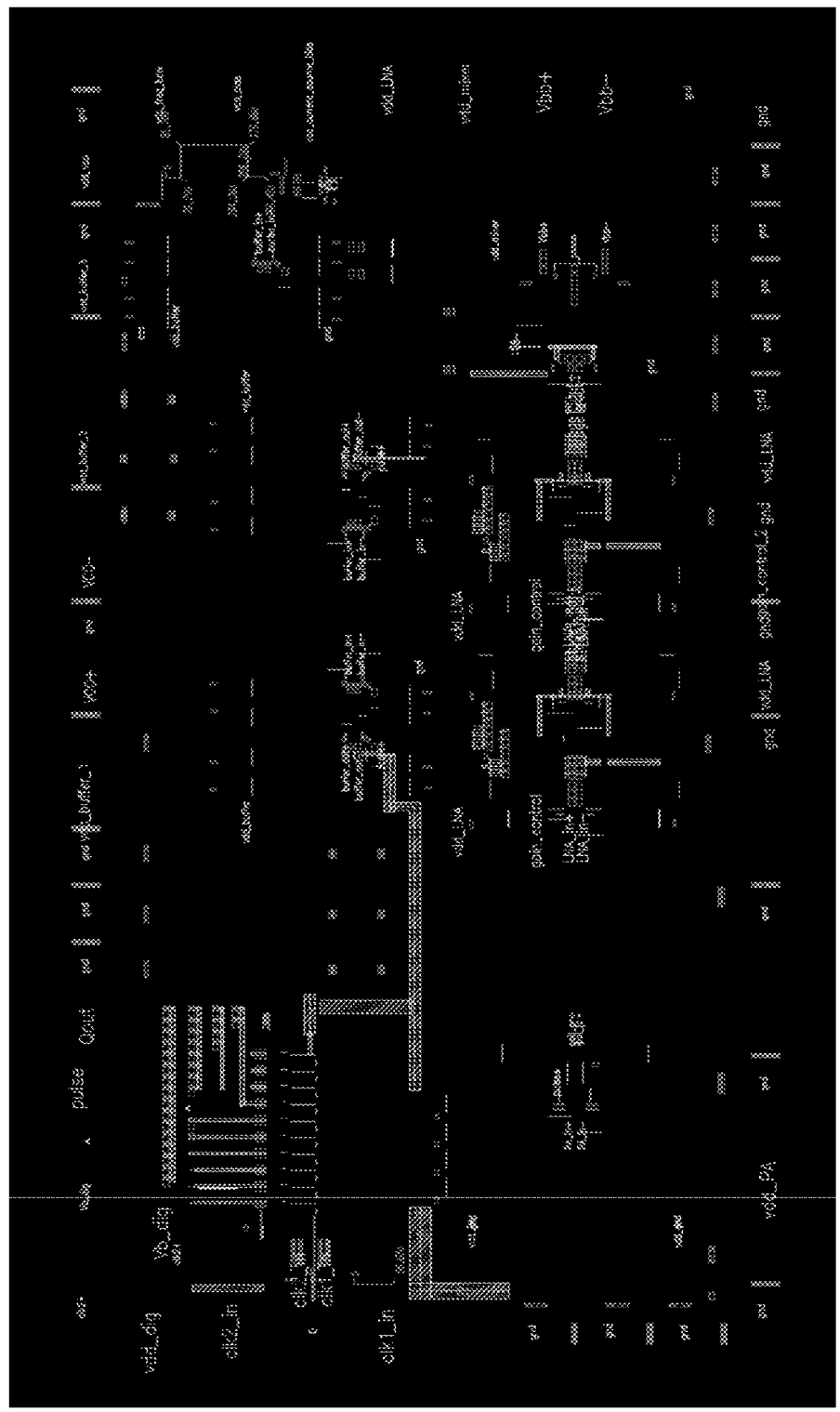
Figure 11G:
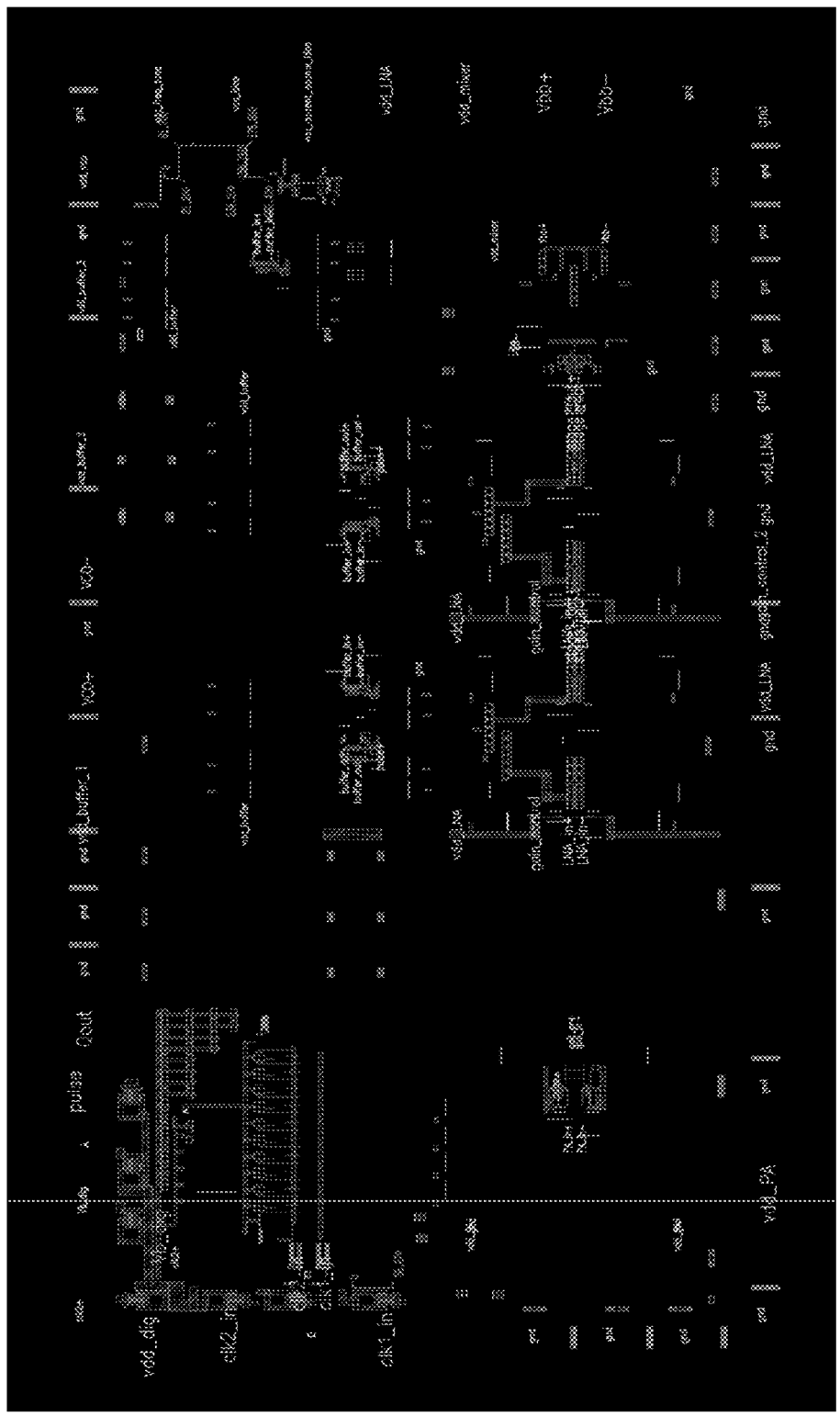
Figure 11H:
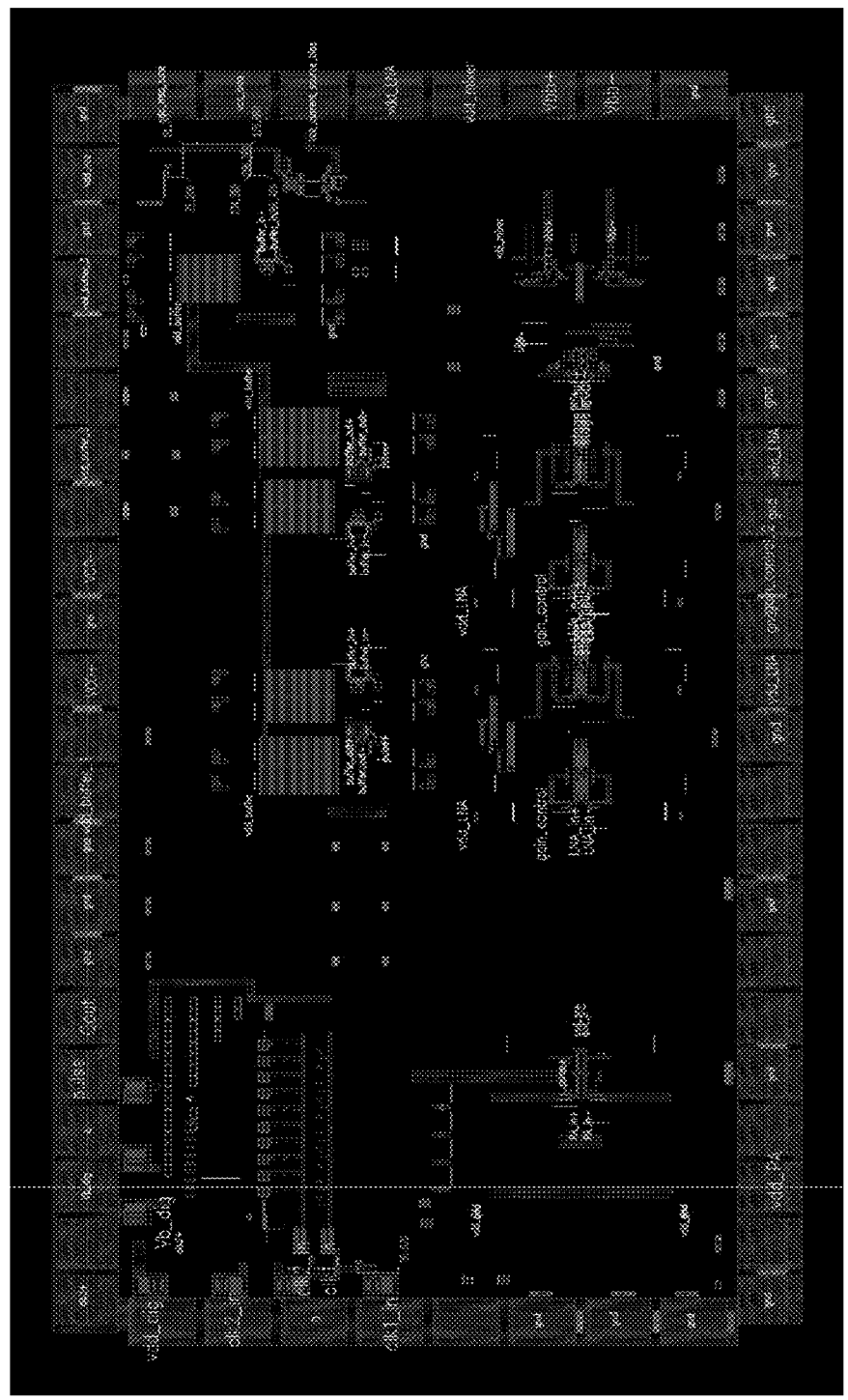

FIG. 2 shows an integrated ESR transceiver chip in accordance with one or more embodiments. The integrated ESR transceiver chip 201, which may include both a transmitter circuit 203 and a receiver circuit 205, is implemented as a single chip using silicon-based fully integrated technology, e.g., CMOS process technology. Examples of the integrated ESR transceiver chip fabricated in a 0.13 µm SiGe BiCMOS process are shown in FIGS. 6A and 11A. In accordance with one or more embodiments, the transceiver chip 201 may be implemented as part of a CW or pulsed ESR system, as described above in reference to FIGS. 1A-1B. Furthermore, in one or more embodiments, a resonator 211a may be optionally fabricated on the same chip substrate 209 as the transmitter circuit 203 and the receiver circuit 205. In other embodiments, the resonator 211b may be physically separable from the transceiver chip 201, e.g., the resonator 211b may be a flat loop-gap resonator made using a printed circuit board (PCB) such as a 20 mil Rogers 4350 B PCB, e.g., as shown in FIG. 7B. In either case, the transmitter circuit 203 includes an oscillator circuit 213 electrically connected to a power amplifier (PA) circuit 215. In accordance with one or more embodiments, the oscillator circuit 213 is configured to generate an oscillating output signal, also referred to herein as RF power, that is then amplified by the PA circuit 215 and output by the PA circuit 215 as an amplified oscillating output signal. The amplified oscillating output signal is then provided to the resonator 211a (211b) for use in an ESR measurement, e.g., the pulsed or CW measurement as described in more detail above in reference to FIGS. 1A-1B. Accordingly, the amplified oscillating output signal is applied to a sample 212 in order to manipulate the electronic magnetic moments (or spins) of the sample 212 thereby causing an ESR signal that is detectable by the resonator 211a (211b). In one embodiment, the ESR signal may be in the form of a reduction in the amplified oscillating output signal that is reflected from the resonator 211a. In another embodiment, the response may be in the form of an ESR signal that is radiated, or emitted, from the sample and later detected by the resonator 211a (211b), e.g., the ESR signal may be a free induction decay signal, an inversion recovery signal, a spin echo signal, or any other type of ESR signal.

Figure 12A:
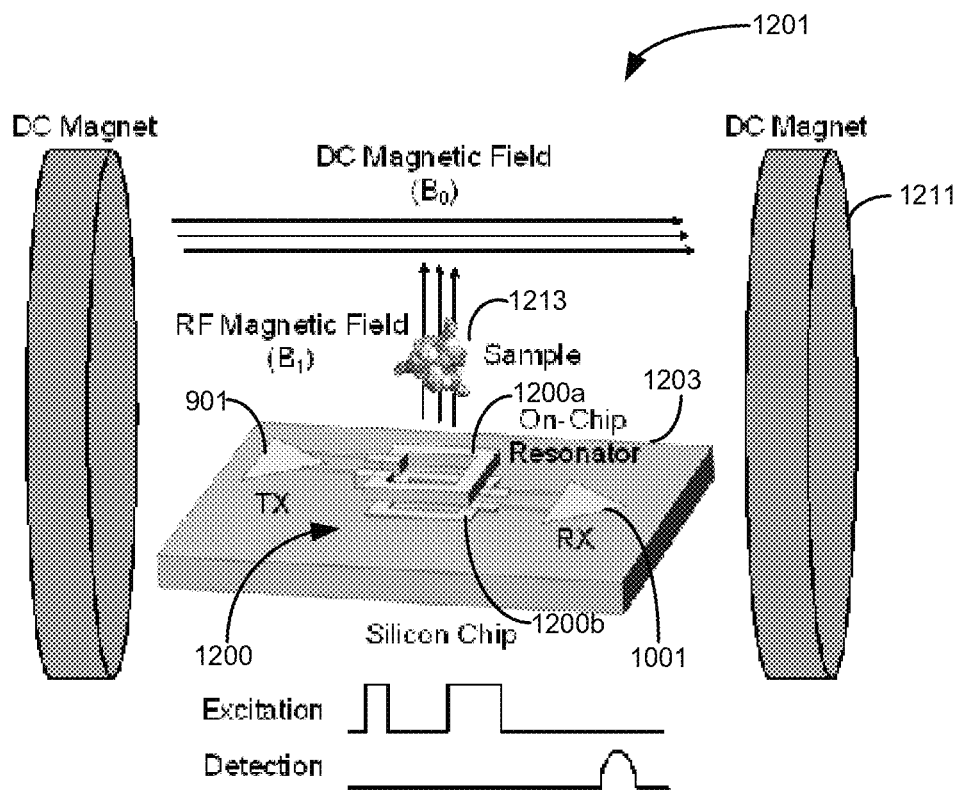
FIGS. 12A-12B show an integrated ESR spectrometer in accordance with one or more embodiments of the invention.
Figure 12B:
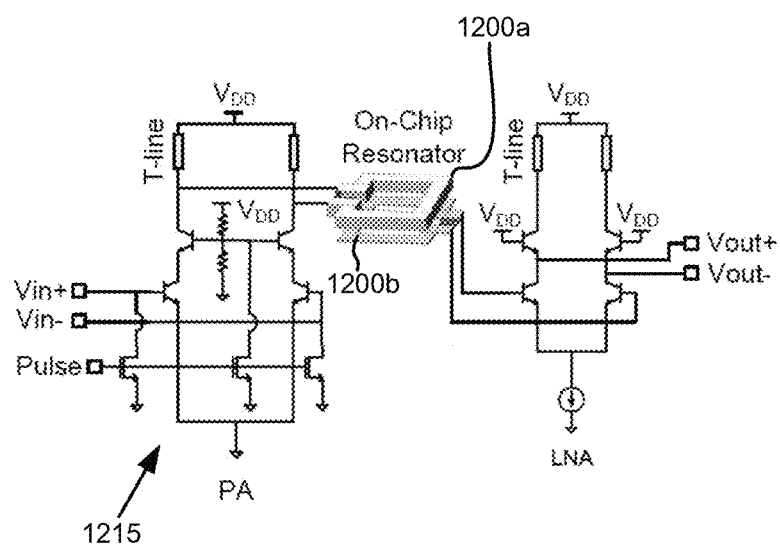

In accordance with one or more embodiments, the receiver circuit 205 of the integrated ESR transceiver chip is configured to receive the ESR signal from the sample by way of the resonator 211a (211b) which may be configured in full duplex mode using a circulator as described above in reference to FIGS. 1A-1B. In other embodiments, the resonator 211a (211b) may include two or more resonators that are designed as dedicated transmitter and receiver resonators. An example of this type of multi-resonator design is shown in FIGS. 12A-12B. In accordance with one or more embodiments, the receiver circuit 205 includes a receiver amplifier circuit 217 that is electrically connected to a mixer circuit 219 that is itself electrically connected to both the oscillator 213 of transmitter circuit 203 and a baseband amplifier circuit 221. In accordance with one or more embodiments, the receiver amplifier circuit may be implemented as a low noise amplifier (LNA). However, the receiver amplifier circuit need not be limited by a precise noise figure (NF) and, depending on the design constraints, the required noise figure may vary without departing from the scope of the present disclosure. In accordance with one or more embodiments, the mixer circuit receives an amplified ESR signal from the LNA circuit 217 and an local oscillator (LO) signal from the transmitter circuit 203 and down-converts the amplified ESR signal to a baseband signal that may be subsequently amplified by the baseband amplifier circuit 221. In accordance with one or more embodiments, the amplified baseband signal may be sent to a data acquisition system (DAQ)(not shown) for further processing, storage, and/or display.

In accordance with one or more embodiments, the transceiver chip 201 further includes an integrated programmable pulse generating (PPG) circuit 219 that is also fabricated on the same chip substrate 209 as the transmitter and receiver circuits. Furthermore, the PPG circuit 219 may be electrically connected to the PA circuit 215 and/or the oscillator circuit 213 and configured to switch the output of the transmitter circuit 203 by switching the oscillator circuit 213 and/or the PA 215, e.g., to perform pulsed ESR experiments.

Figure 3:
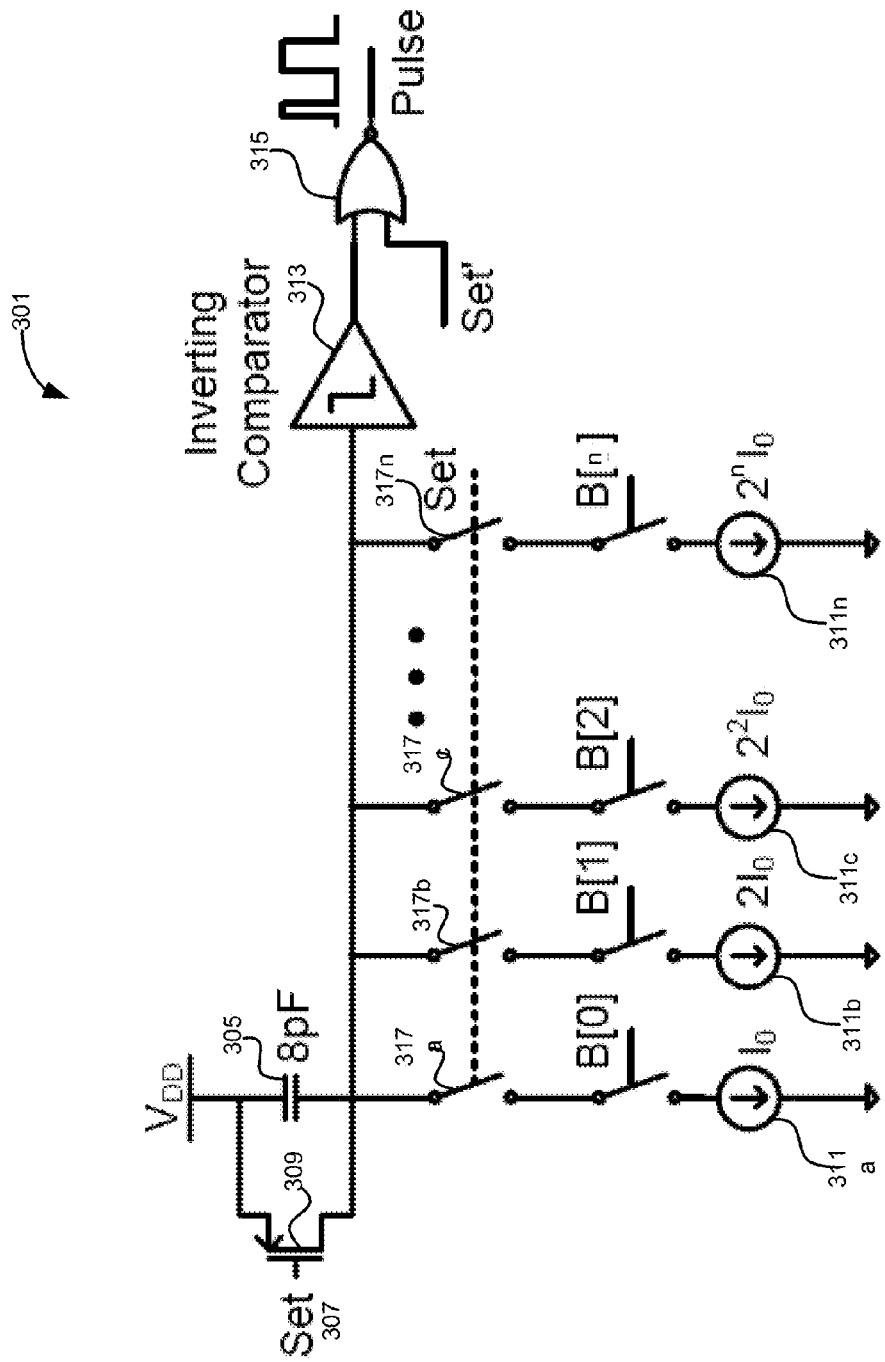
FIG. 3 show an integrated programmable pulse generator circuit in accordance with one or more embodiments of the invention.
Figure 13A:
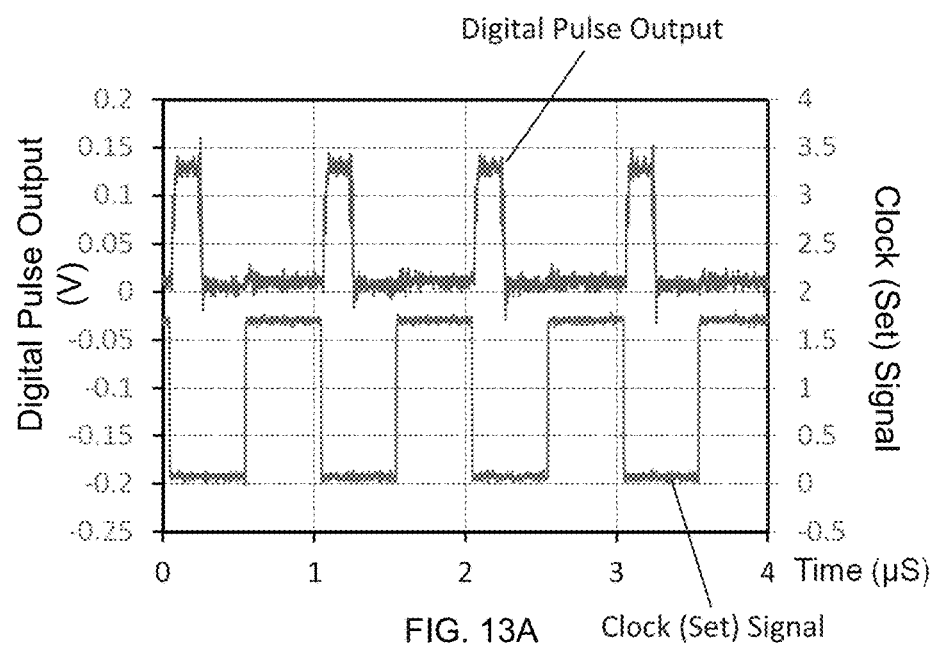
FIGS. 13A-13B show test data for an integrated programmable pulse generator circuit in accordance with one or more embodiments of the invention.
Figure 13B:
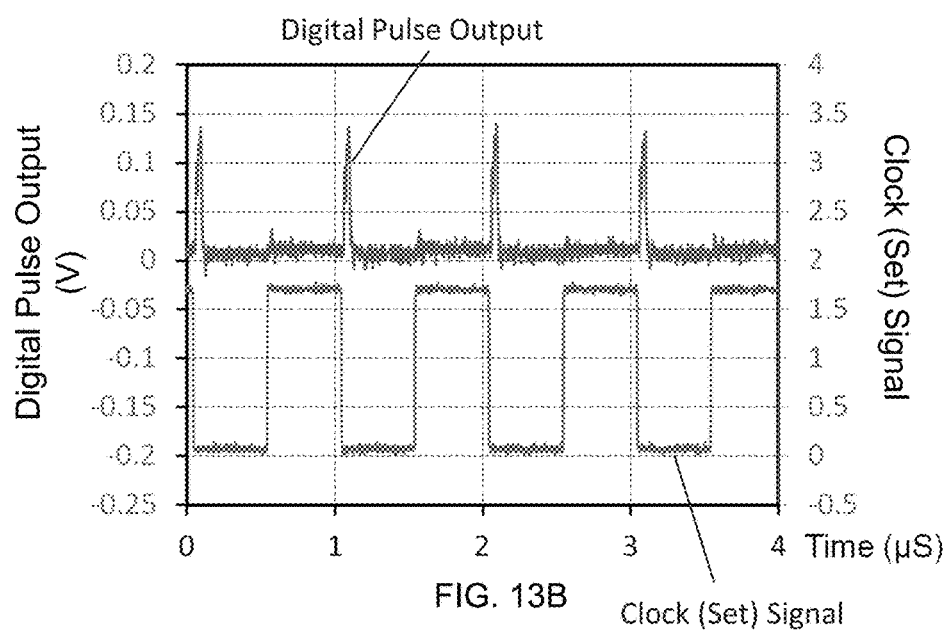

One or more embodiments of the integrated programmable pulse generating (PPG) circuit is shown in FIG. 3. The PPG 301 is capable of producing digital pulses with pulse widths ranging from 0.5 ns-500 ns and is integrated onto the chip substrate along with the transmitter and receiver circuits as shown, e.g., in the micrographs of FIG. 6A and FIG. 11A. In accordance with one or more embodiments, the pulse width is determined by the time it takes for the capacitor 305 to discharge from the supply voltage $V_{DD}$ to a threshold voltage. The "Set" signal 307 is derived from an external clock signal and charges the capacitor 305 on falling edges through the pull-up PMOS transistor 309 and discharges the capacitor 305 through the current sources 311a, 311b, 311c, . . . , 311n on rising edges. In accordance with one or more embodiments, ten binary scaled current sources may be used, each representing a digital bit, to control the rate at which the capacitor discharges and to therefore control the pulse width. However, any number of current sources may be used without departing from the scope of the present disclosure. In accordance with one or more embodiments, the pulse width can be adjusted with a resolution of 490 ps. In accordance with one or more embodiments, the discharge path through the current sources is controlled using a double switch design that employs a first set of switches 317a, 317b, 317c, . . . , 317n controlled by the set signal and a second set of switches B[0], B[1], B[2], . . . B[n] that are used to control the number of currents sources used for the discharge path, thereby setting the pulse width. Furthermore, the PPG 301 employs a comparator-NOR logic gate on the output that includes comparator 313 coupled to NOR gate 315. Test data showing output pulses of the PPG relative to the clock Set signal are shown in FIGS. 13A-13B. As seen from the data in FIG. 13B, the PPG can output pulses ranging from a few ns to a few hundred ns.

In what follows, FIGS. 4-8 describe an integrated ESR system in accordance with one or more embodiments of the invention. In these embodiments, the system is designed to operated in both pulsed and CW modes and to operate over a frequency range of 770 MHz to 970 MHz. Such a system may be implemented, e.g., in a handheld device and may be used in a wide range of non-invasive point-of-care (POC) applications, e.g., to image free radicals and/or perform oximetry. In accordance with one or more embodiments, the ESR system may be implemented as shown in FIG. 2 using an integrated ESR transceiver chip connected to an external resonator.

FIGS. 4A-4B show an integrated transmitter circuit in accordance with one or more embodiments of the invention. FIG. 4A shows a diagram of a transmitter circuit 401 that is suitable for an ESR spectrometer in accordance with one or more embodiments of the invention. The transmitter circuit 401 includes a voltage controlled oscillator circuit (VCO) 403, a VCO buffer circuit 405, an RF buffer circuit 407, and a power amplifier circuit (PA) 409. In accordance with one or more embodiments, the VCO 403 provides an oscillating signal having a voltage tunable frequency. The output of the VCO 403 is buffered by the VCO buffer circuit 405 and the RF buffer circuit 407. In accordance with one or more embodiments, the VCO buffer circuit 405 ensures that the oscillation frequency of the VCO 403 remains unchanged by keeping the VCO 403 load impedance constant during the transition from excitation phase (PA on) to detection phase (PA off). In this example, the VCO buffer circuit 405 is located between the output of the VCO 403 and the LO input of a mixer (not shown) used in the receiver, as described in more detail below. In accordance with one or more embodiments, the output of the transmitter circuit 401 is switched by switching the PA circuit 409 rather than switching the VCO. Furthermore, the switching of the PA circuit 409 is accomplished not by switching $V_{DD}$ but rather, by pulling down the bias voltage of an input transistor of the PA as described in more detail below in reference to FIG. 4B. Accordingly, the oscillating output signal of the transmitter may be very quickly turned on and off, i.e., it may be pulsed by providing pulses to the PA from the on-chip PPG, e.g., the PPG shown in FIG. 3. In accordance with one or more embodiments, the integrated transmitter may be switched in approximately 1-2 ns, thereby enabling pulsed ESR experiments to be performed with the system.

Figure 14A:
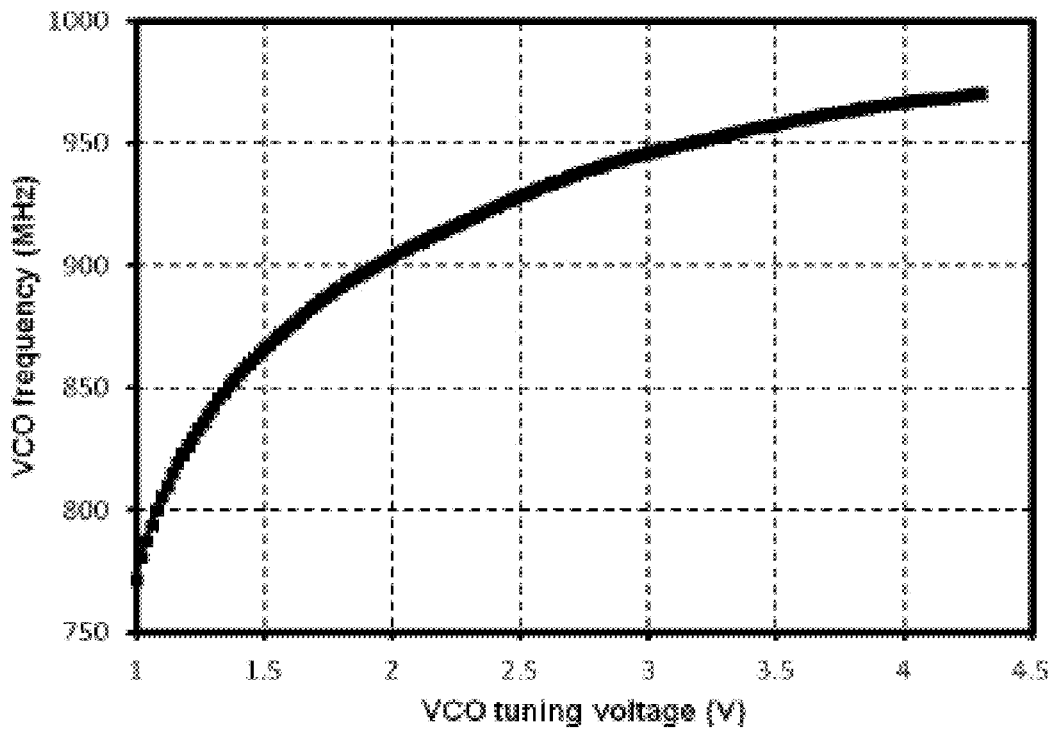
FIGS. 14A-14B show test data for an integrated voltage controlled oscillator circuit in accordance with one or more embodiments of the invention.

FIG. 4B shows the topology of an integrated transmitter circuit like that shown in FIG. 4A in accordance with one or more embodiments of the invention. VCO circuit 403 is connected to the PA circuit 409 that may be implemented on the ESR transceiver chip in accordance with one or more embodiments. The VCO circuit 403 adopts a fully differential negative resistance structure with an LC tank. The frequency of this VCO is determined by the LC tank resonance frequency. The application of a voltage $V_{tune}$ to the tuning terminal 413 of the VCO results in a frequency that can be tuned from 770 MHz to 970 MHz, as shown in the test data of FIG. 14A. In accordance with one or more embodiments, the frequency is tuned by applying $V_{tune}$ as a bias voltage on the two varactors 415 and 417 that are placed in parallel with the LC tank. A symmetric inductor 419 is used to improve the symmetry of the device. As the PN-junction capacitance reduces for an increasing negative bias, the VCO frequency will be increased as $V_{tune}$ increases. However, because the capacitance of varactors 415 and 417 are comparatively small, parallel fixed value capacitors 421 and 423 are used to further bring down the frequency to approximately 1 GHz. In accordance with one or more embodiments, the VCO signal is amplified by a differential buffer circuit 425 and is converted to a single-ended signal by signal converter 427. FIG. 4C shows one example of an integrated signal converter circuit 427 in accordance with one or more embodiments. The single-ended VCO signal is then fed to an on-chip PA circuit 409 for additional amplification. In accordance with one or more embodiments, the on chip PA circuit 409 has a cascode topology and provides a power gain of 15 dB. Furthermore, the output of the PA is matched to 50Ω by a combination of on-chip inductors and capacitors 429. While the VCO shown in FIG. 4B employs a fully differential negative resistance structure with an LC tank, any type of VCO structure may be employed without departing from the scope of the present disclosure. Likewise, while the PA shown in FIG. 4B employs a single ended cascode structure, any type of PA structure may be employed without departing from the scope of the present disclosure.

Figure 15:
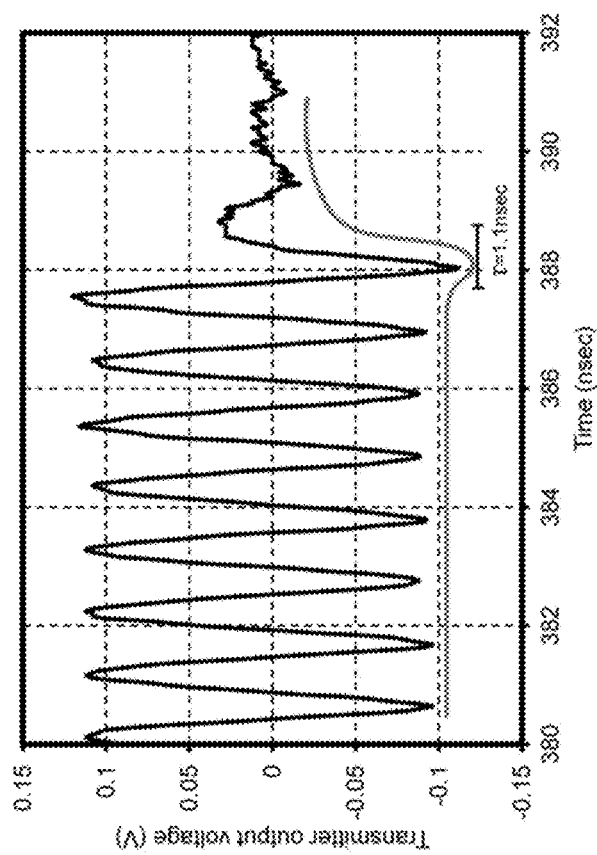
FIG. 15 shows test data for an integrated transmitter circuit in accordance with one or more embodiments of the invention.

In accordance with one or more embodiments, the transmitter circuit 401 may be operated in both CW and pulsed mode. Because the time scale for tuning off the VCO 403 is too slow for the demanding speed requirements of pulsed ESR, the transmitter circuit 401 in the integrated ESR transceiver is switched by switching off the PA circuit 409 while leaving the VCO 403 in the on state. In accordance with one or more embodiments, the PA circuit 409 may be turned off by pulling down the base voltage of its input transistor 431 using an N-channel metal-oxide-semiconductor field effect transistor (NMOSFET) driver 435. Generally speaking, for a pulse mode ESR spectrometer, the speed at which the transmitter may be switched off determines the dead time of the spectrometer (i.e., the minimum wait time before which ESR signals may be received from the sample). Since the ESR signal is usually much weaker than the RF excitation signal, it can only be detected after switching off the transmitter circuit 401. The amplitude of the ESR echo decays exponentially with wait time, and therefore, a small turn-off time is extremely important in the pulsed mode measurements. However, by employing the design shown in FIG. 4B, the transmitter may be switched off very quickly by using a high speed pull down circuit formed from the NMOSFET driver 435. In this example, the NMOSFET driver 435 is used to quickly pull down the base voltage of the input transistor 431. More specifically, when $V_{pulse}$ outputs a low voltage (e.g., approximately 0.1V), the transistor 435 is off. Therefore, the bias of transistor 431 depends only on the voltage $V_{b1}$ and the PA is in the on state. Then, if $V_{pulse}$ is a high voltage (e.g., approximately 1V), transistor 435 is turned on and thus, reduces the bias of bias of transistor 431. The size of transistor 435 is chosen so that when transistor 435 is on, the bias of transistor 431 is close to 0V and well below the threshold voltage of transistor 431. Accordingly, in the one or more embodiments that employ the switching design shown in FIG. 4B, the transmitter may be turned off in less than 1.2 ns thereby facilitating pulsed ESR measurements to be made using the integrated ESR transceiver chip. FIG. 15 shows test data for a turn off characteristic of the transmitter circuit 401 in accordance with one or more embodiments.

Figure 5A:
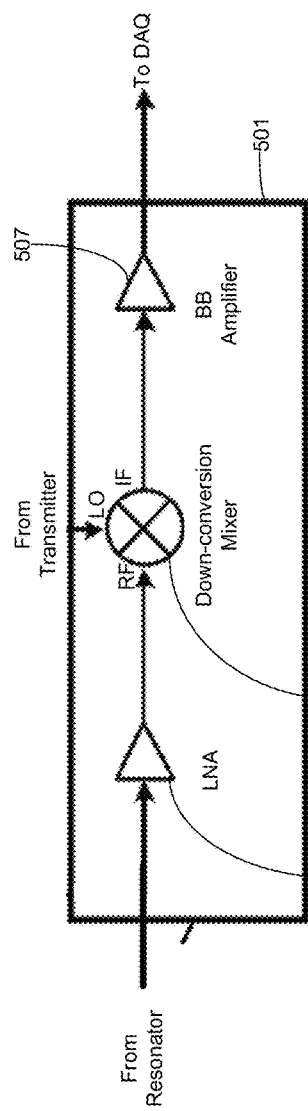
FIGS. 5A-5B show an integrated receiver circuit in accordance with one or more embodiments of the invention.

FIG. 5A shows an example of an integrated receiver circuit that may be employed as the receiver circuit in an integrated ESR transceiver ship in accordance with one or more embodiments. The receiver circuit 501 includes a low noise amplifier circuit (LNA) 503, a mixer circuit 505, and a baseband amplifier circuit 507. In accordance with one or more embodiments, the input of LNA circuit 503 is electrically connected to the resonator (not shown) and receives an ESR signal from sample (not shown) that is located in, or near, the resonator. The output of the LNA circuit 503 is electrically connected to the RF input port of the mixer circuit 505. Furthermore, as described above, the LO input port of the mixer circuit 505 is electrically connected to the VCO thereby providing the LO signal for the down conversion of the ESR signal to the baseband frequency. Furthermore, the IF output port of the mixer is electrically connected to the input terminal of the baseband amplifier circuit 507. Thus, after being amplified by the LNA circuit 503, the ESR signal is down-converted to baseband frequency and the baseband signal is then amplified by the baseband amplifier circuit 507. In accordance with one or more embodiments, the amplified baseband signal may be output to a data acquisition system (DAQ)(not shown). In accordance with one or more embodiments, any type of data acquisition system may be used without departing from the scope of the present disclosure.

Figure 5B:
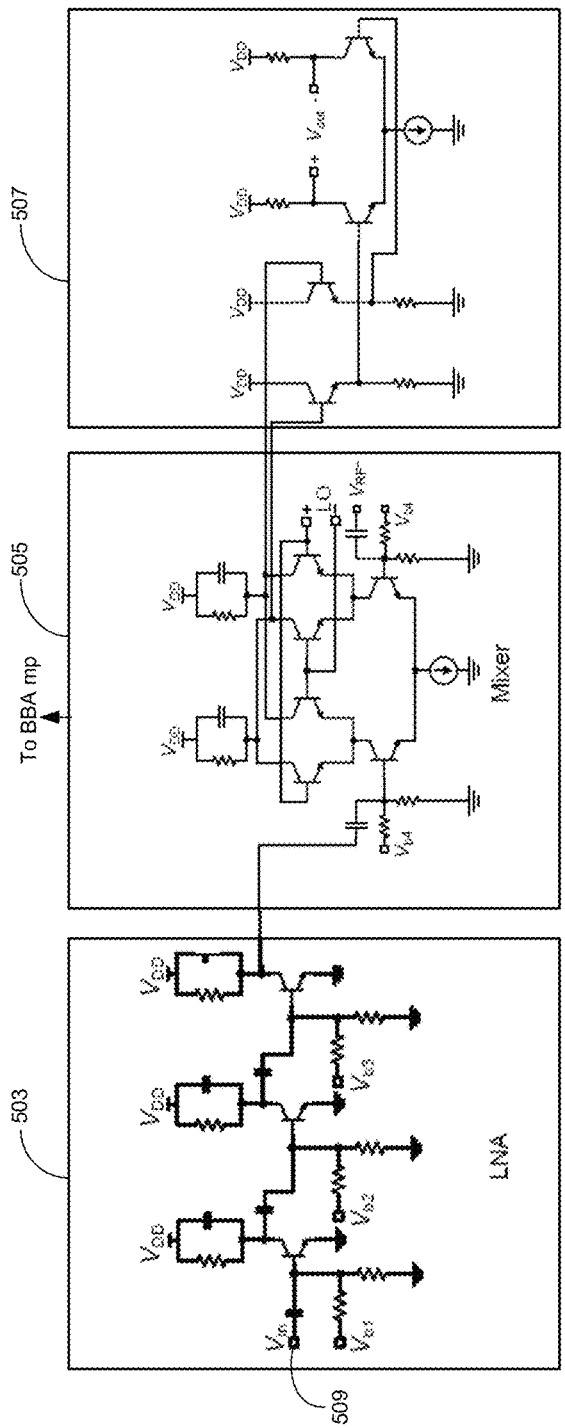

FIG. 5B shows the topology of an integrated receiver circuit like that shown in FIG. 5A in accordance with one or more embodiments of the invention. A direct-conversion architecture is adopted that includes LNA circuit 503, mixer circuit 505, and baseband amplifier circuit 507. The ESR signal from the sample is coupled to the input 509 of the LNA circuit 503. This signal is down-converted by the mixer circuit 505 and amplified by the baseband amplifier circuit 507. This amplified baseband signal is then sent to the DAQ for analysis. In accordance with one or more embodiments, the LNA circuit 503 has three stages and it is designed to have a power gain of 40 dB and a noise figure of 3.6 dB over the entire frequency range of the VCO. The LNA output 1 dB compression point is −15 dBm. Furthermore, in the physical layout of the LNA, a guard-ring with substrate contact may be used to prevent the substrate coupling from the transmitter to the receiver. While a three stage LNA is shown here as an example, one of ordinary skill will appreciate that any number of stages and topologies may be used for the LNA without departing from the scope of the present disclosure.

In accordance with one or more embodiments, the mixer circuit 505 has a Gilbert topology with a resistive load, as shown in FIG. 5B. In accordance with one or more embodiments, because the LNA is single-ended, only one transistor 511 in the mixer takes the output of the LNA and the other transistor 513 is tied to the same DC voltage. In accordance with one or more embodiments, the mixer may feed to a two stage baseband amplifier circuit 507. In a CW ESR measurement, the ESR signal after the mixer has a low frequency in the kHz domain and thus, DC block capacitors cannot be used after mixer for biasing purposes. Therefore, the first stage of the baseband amplifier may be a differential source-follower that serves to shift the DC voltage of the mixer output. The second stage may then be a common source amplifier with output matched to 50Ω. While the mixer shown in FIG. 5B employs the Gilbert topology with a resistive load, any type of mixer topology may be employed without departing from the scope of the present disclosure. Likewise, any topology for the baseband amplifier may be employed without departing from the scope of the present disclosure.

In accordance with one or more embodiments, the integrated ESR transceiver chip includes an integrated PPG as shown in FIG. 3, an integrated transmitter as shown in FIGS. 4A-4B, and an integrated receiver as shown in FIG. 5A-5B all located on the same chip substrate. As mentioned above, each of these components may be implemented in silicon, e.g., by way of a 0.13 μm SiGe BiCMOS process, or the like. To that end, FIG. 6A shows a micrograph of the fabricated integrated ESR chip that includes the on-chip transmitter (VCO, buffer, and PA), receiver (LNA and mixer), and PPG circuits described above in reference to FIGS. 1-5. In this example the chip size is 2.5 mm by 1.5 mm and the power consumption of the entire chip is less than 425 mW. In addition, FIGS. 6B-6H show one example of a layout of an integrated ESR transceiver chip, from top layer to bottom layer, respectively. FIG. 6A shows a micrograph of one example of a fabricated integrated transceiver chip in accordance with one or more embodiments having a size of 2.5 mm by 1.5 mm.

Figure 16:
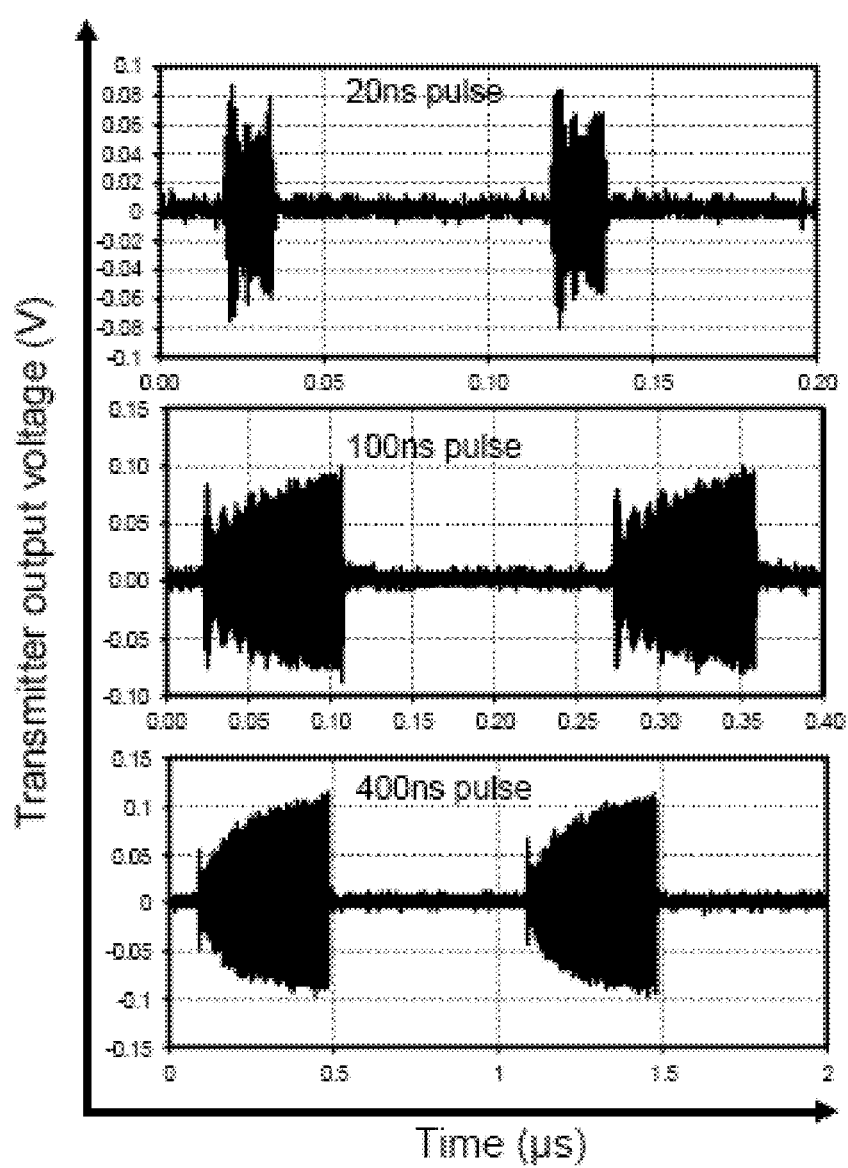
FIG. 16 shows test data for an integrated transmitter circuit in accordance with one or more embodiments of the invention.
Figure 17A:
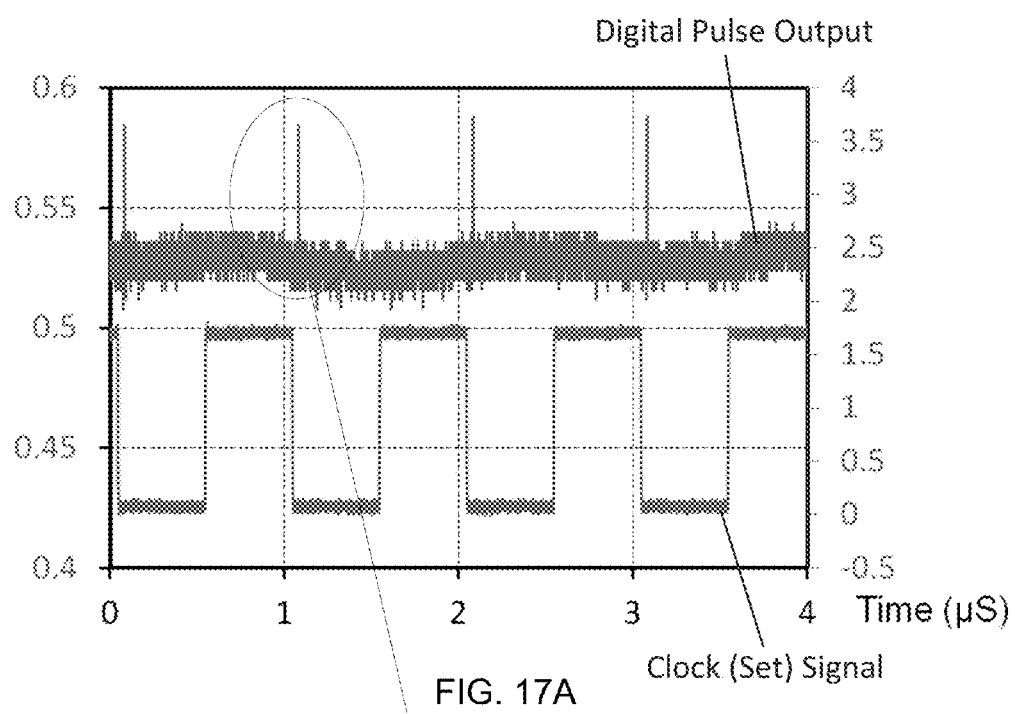
FIGS. 17A-17B show test data for an integrated transceiver circuit in accordance with one or more embodiments of the invention.
Figure 17B:
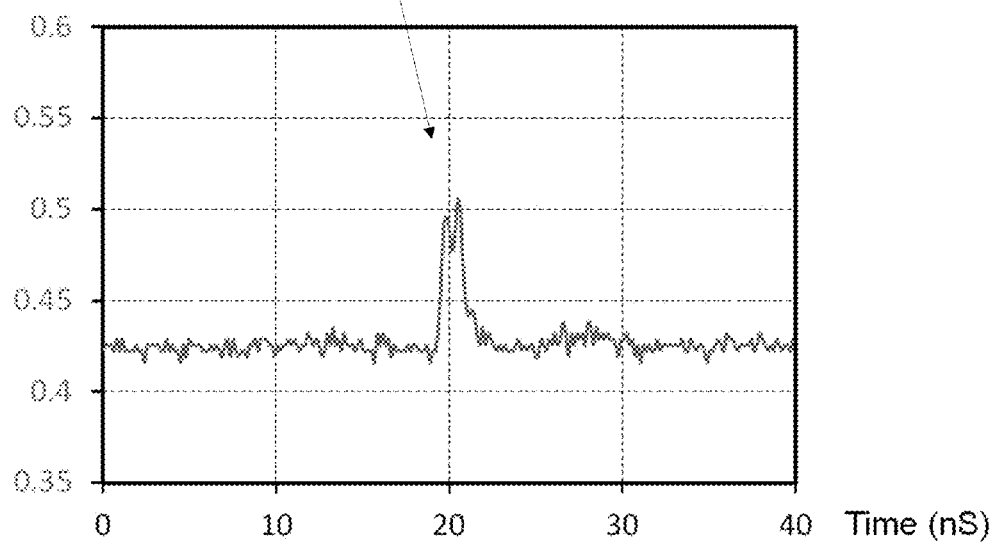

Furthermore, FIGS. 13-19 summarize test data and operational specifications of an integrated ESR transceiver chip shown in FIG. 6. FIG. 14A shows the measured tuning range data for the VCO described above in FIG. 4B and implemented as shown in the micrograph of FIG. 6A. FIG. 15 shows a measured turn off characteristic for the transmitter described in FIG. 4B that proves that the transmitter may be switched off in approximately 1 ns. FIG. 16 shows measured output pulse data for the transmitter described in FIG. 4B operating in pulse mode.

Figure 7C:
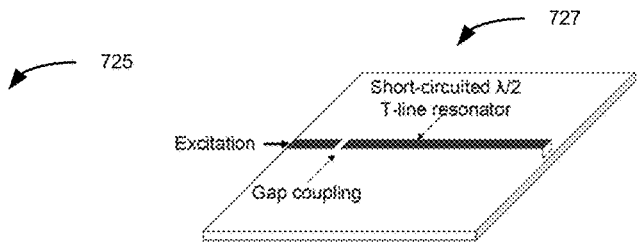

As briefly described above, the integrated ESR transceiver chip may be employed as part of an ESR spectrometer system in accordance with one or more embodiments. FIG. 7A shows a more detailed diagram of an ESR spectrometer 701 that employs an integrated ESR transceiver chip 703 like the one described above in reference to FIGS. 2-6. In accordance with one or more embodiments, the system 701 includes a receiver circuit 723, a DAQ 711, a circulator 713, and an ESR probe module 715. The interaction of these components is described in detail above in reference to FIG. 1A-1B. As already described in detail above, the ESR transceiver chip 703 includes an integrated PPG circuit 705, an integrated transmitter circuit 707, and an integrated receiver circuit 709. Furthermore, as described above, the converted baseband signal is output to DAQ 711. In accordance with one or more embodiments, ESR probe 715 of the ESR system 701 may be external to the ESR transceiver chip 703. Furthermore, in accordance with one or more embodiments, the output signal from the transmitter circuit 707 may be sent to a planar loop-gap resonator 725 via the circulator 713. A planar loop-gap resonator 725 in accordance with one or more embodiments is shown in FIG. 7B and may be fabricated on a printed circuit board (PCB), e.g., a 20 mil Rogers 4350B PCB. In this example, the loop has an inner and outer diameter of 4 mm and 5 mm, respectively. In accordance with one or more embodiments, the loaded quality factor Q of the resonator 725 is measured to be 60 and the resonance frequency may be tuned using one or more on-board tunable capacitors. Furthermore, in accordance with one or more embodiments, variable capacitors may be applied in parallel and series with the resonator 725 to tune the resonance frequency and match the input impedance of the resonator 725 to 50Ω. FIG. 7C shows another example of a resonator in accordance with one or more embodiments. More specifically, FIG. 7C shows a split-gap transmission line resonator in accordance with one or more embodiments. Other types of resonators may be used without departing from the scope of the present disclosure.

In accordance with one or more embodiments, the ESR system 701 may operate in pulse or CW mode. In pulse mode, the PPG circuit 705 may be driven by external clock 717. In CW mode, the PPG is set so that the transmitter is in the on-state and then the ESR signal is acquired by modulating the $B_0$ field using the signal generator 719 to modulate the current of the electromagnet 721 while simultaneously measuring the reflected power from the resonator 725, as described in more detail above in reference to FIG. 1A.

In accordance with one or more embodiments, during the CW measurement, the transmitter circuit 707 and the receiver circuit 723 are both in the on state. However, because a typical circulator 713 has an isolation value of only 20 dB, the leakage power from the transmitter to the receiver (e.g., through leakage from port 1 to port 3 of the circulator 713) may be considerably larger than the ESR signal from the sample. For example, assuming the excitation signal is 0 dBm, the leakage power at the input of the receiver is −20 dBm, while the ESR signal can be lower than −110 dBm. Therefore, in order not to saturate the ESR signal, the input referred LNA IIP3 of the LNA must be higher than −20 dBm, while the LNA still needs to provide high gain in order to reduce the noise contribution of the following stages in the receiver. Accordingly, in order to relax this demanding design specification of the LNA and the receiver, an active cancellation structure may be employed to cancel the leakage power from the transmitter, in accordance with one or more embodiments.

Figure 8:
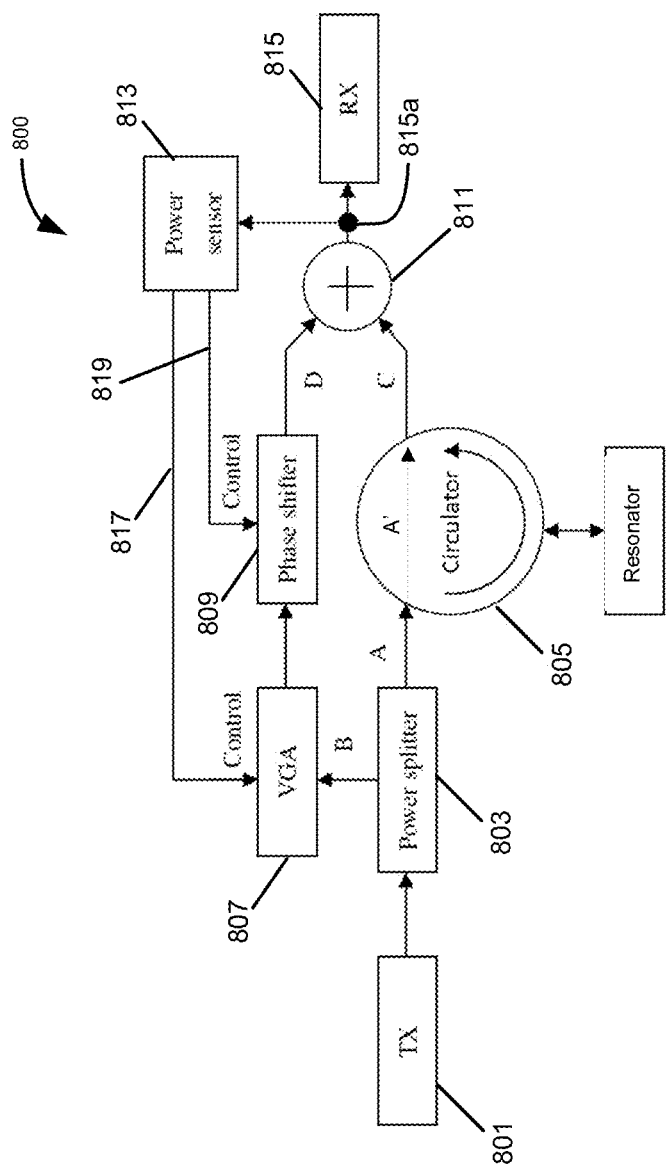
FIG. 8 shows an active leakage cancellation circuit in accordance with one or more embodiments of the invention.

FIG. 8 shows a diagram for the active leakage cancellation circuit 800 in accordance with one or more embodiments. In accordance with one or more embodiments, this active leakage cancellation circuit 800 may be employed using discrete or integrated RF components. In this example, the oscillating output signal from the transmitter circuit 801, which is the integrated transmitter circuit of the integrated ESR transceiver chip, is split to two parts A and B by the power splitter 803. The signal A goes through the circulator 805 and a small portion A' leaks to the point C. The signal B goes through a variable gain amplifier/attenuator (VGA) 807 and a phase shifter 809, and then arrives at point D. The signal at point C and point D is summed at the summing junction 811 and the summed signal is applied to the input of the receiver circuit 815, which is the integrated receiver circuit of the integrated ESR transceiver chip in accordance with one or more embodiments. A power sensor 813 with high input impedance monitors the power at the input 815a of the receiver, as shown. In accordance with one or more embodiments, the power sensor 813 has a high input impedance so as not degrade the matching and noise figure of the receiver circuit 815. In accordance with one or more embodiments, two control signals 817 and 819 are generated by the power sensor 813 to tune the VGA 807 and the phase shifter 809 such that the power measured by the power sensor 813 at the input of the receiver circuit 815 is minimized. Thus, the action of the VGA 807 and phase shifter 809 is to provide a signal at point D that has the same amplitude but 180 degree phase difference from the leakage signal A'. The addition of this signal to the leakage signal A' leads to a destructive interference between the two signals that causes a cancellation of the leakage signal A' at the input 815a. In accordance with one or more embodiments, the active cancellation circuit 800 may reduce the leakage signal A' by more than 40 dB as measured at the input 815a.

In what follows, FIGS. 9-13 describe a mm wave ESR system in accordance with one or more embodiments of the invention. In these embodiments, the system is designed to operated in both pulsed and CW modes and to operate over a frequency range of 22 GHz to 26 GHz. Such a system may be implemented, e.g., in a handheld device and may be used in a wide range of non-invasive point-of-care (POC) applications, e.g., for making direct measurements of partial pressure of oxygen ($pO_2$) of tissue and/or to diagnose melanoma. In accordance with one or more embodiments, the ESR system may be implemented as shown in FIG. 2 using an integrated ESR transceiver chip having a resonator that is integrated on-chip.

Figure 9A:
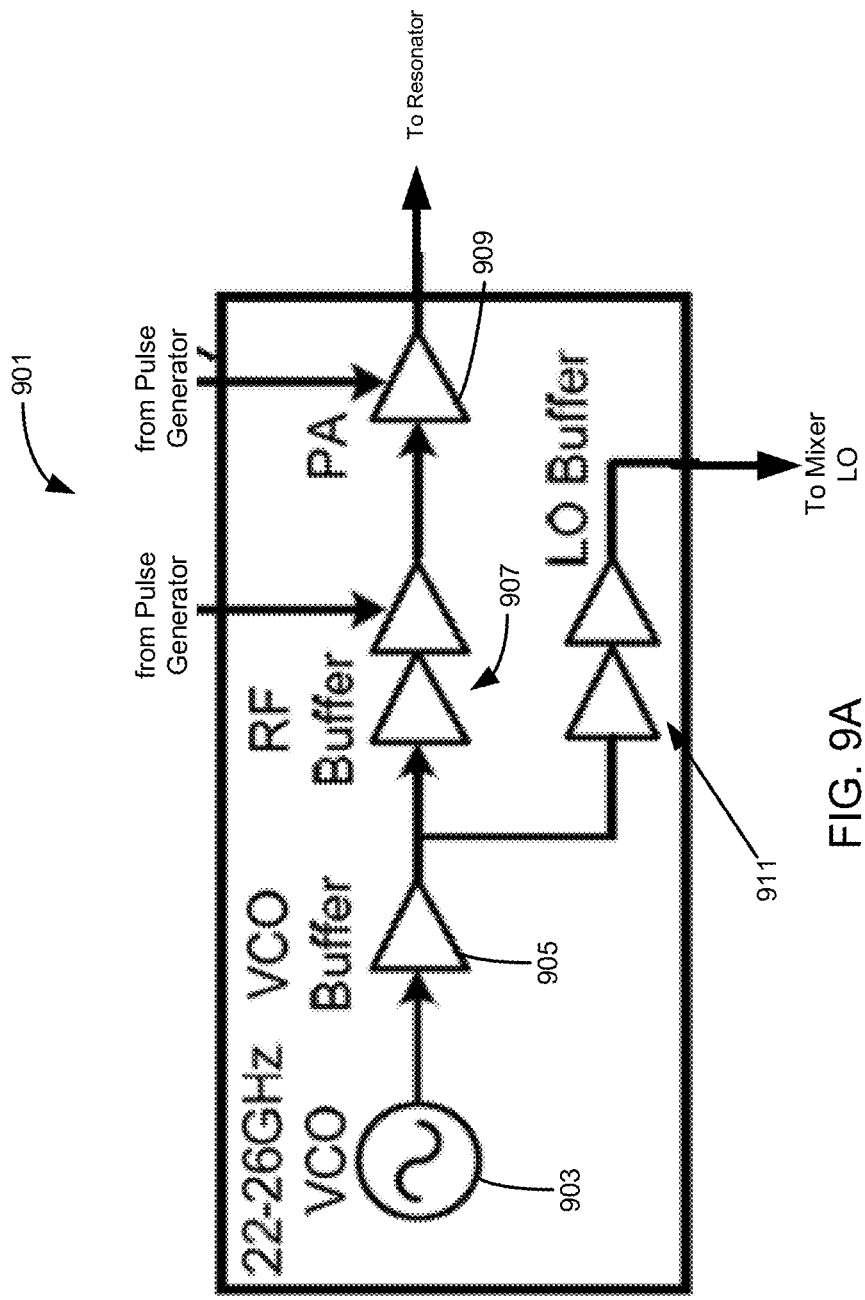
FIGS. 9A-9D shows an integrated transmitter circuit in accordance with one or more embodiments of the invention.

FIG. 9A shows a diagram of a transmitter circuit 901 that is suitable for an integrated ESR transceiver chip in accordance with one or more embodiments of the invention. The transmitter circuit 901 includes a voltage controlled oscillator (VCO) circuit 903, a VCO buffer circuit 905, a dual stage RF buffer circuit 907, a dual stage LO buffer circuit 911, and a power amplifier (PA) circuit 909. In accordance with one or more embodiments, the VCO circuit 903 provides an oscillating signal having a voltage tunable frequency. The output of the VCO circuit 903 is buffered by the VCO buffer circuit 905 and the dual stage RF buffer circuit 907. In accordance with one or more embodiments, the VCO buffer circuit 905 ensures that the oscillation frequency of the VCO circuit 903 remains unchanged by keeping the VCO circuit 903 load impedance constant during the transition from excitation phase (PA on) to detection phase (PA off). In accordance with one or more embodiments, the VCO buffer circuit 905 is located between the output of the VCO circuit 903 and the input of the dual stage LO buffer circuit 911. The output of the dual stage LO buffer circuit 911 is connected to the LO input of the mixer (not shown) used in the receiver, as described in more detail below. Furthermore, in this example, the dual stage RF buffer circuit 907 is located between the output of the VCO buffer circuit 905 and the input of the PA circuit 909. In accordance with one or more embodiments, in order to improve switching speed and switching isolation, the output of the transmitter circuit 901 is switched by switching the PA circuit 909 along with the second stage of the dual stage RF buffer circuit 907 rather than switching the VCO circuit 903. Furthermore, the switching of the PA circuit 909 is accomplished not by switching $V_{DD}$ but rather by employing NMOSFET switches connected to the biasing nodes of the PA. In accordance with one or more embodiments, the NMOSFET switches act as a high-speed pull-down circuit, as described in more detail below. By switching the PA in this manner, the oscillating output signal of the transmitter may be very quickly turned on and off, i.e., it may be pulsed by providing pulses to the PA from the on-chip PPG, e.g., the PPG shown in FIG. 3. In accordance with one or more embodiments, the integrated transmitter may be switched in approximately 1-2 nanoseconds, thereby enabling pulsed ESR experiments to be performed. Furthermore, by switching in this manner, isolation between the transmitter and receiver circuits of the integrated ESR transceiver chip may be improved.

Figure 9B:
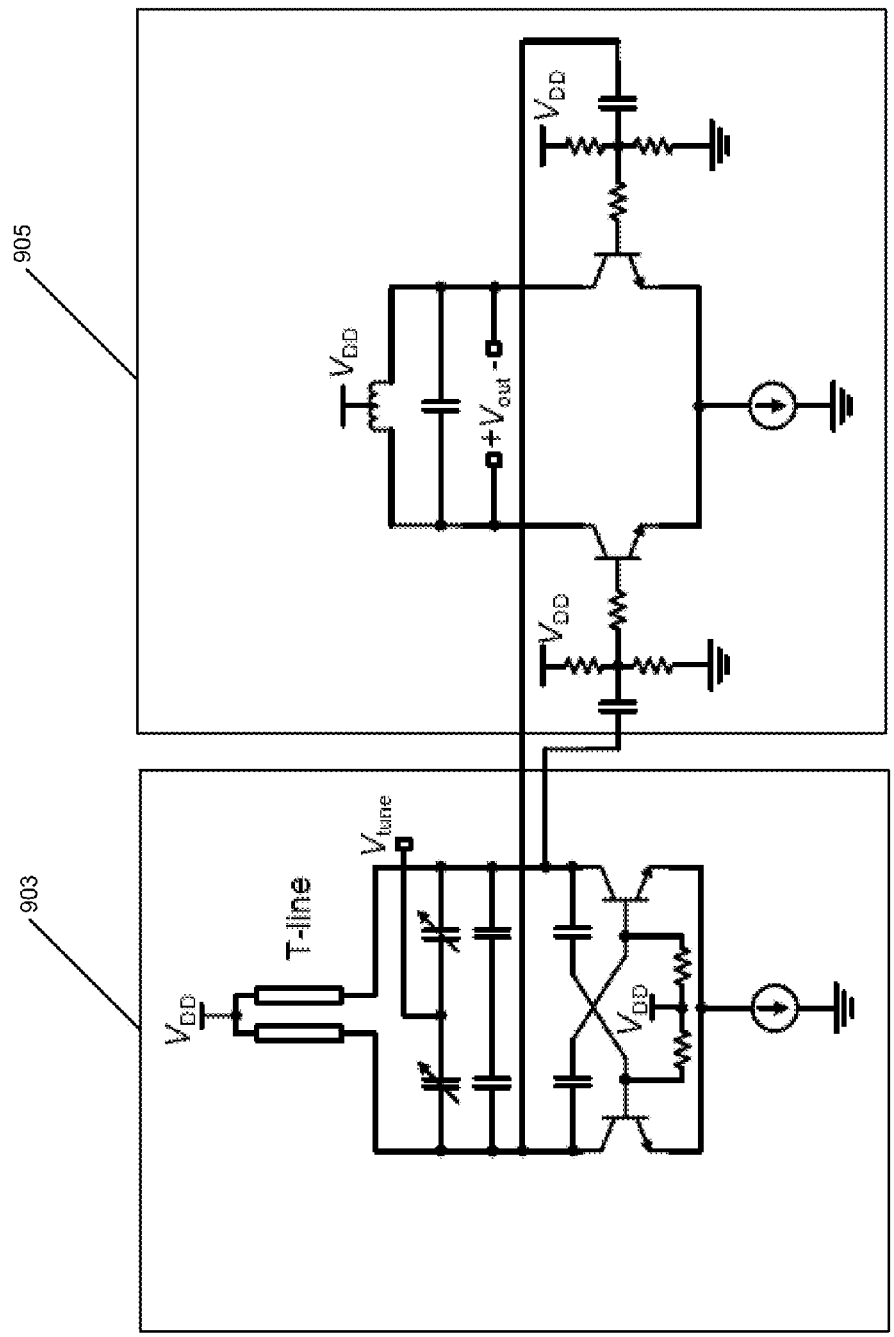
Figure 9C:
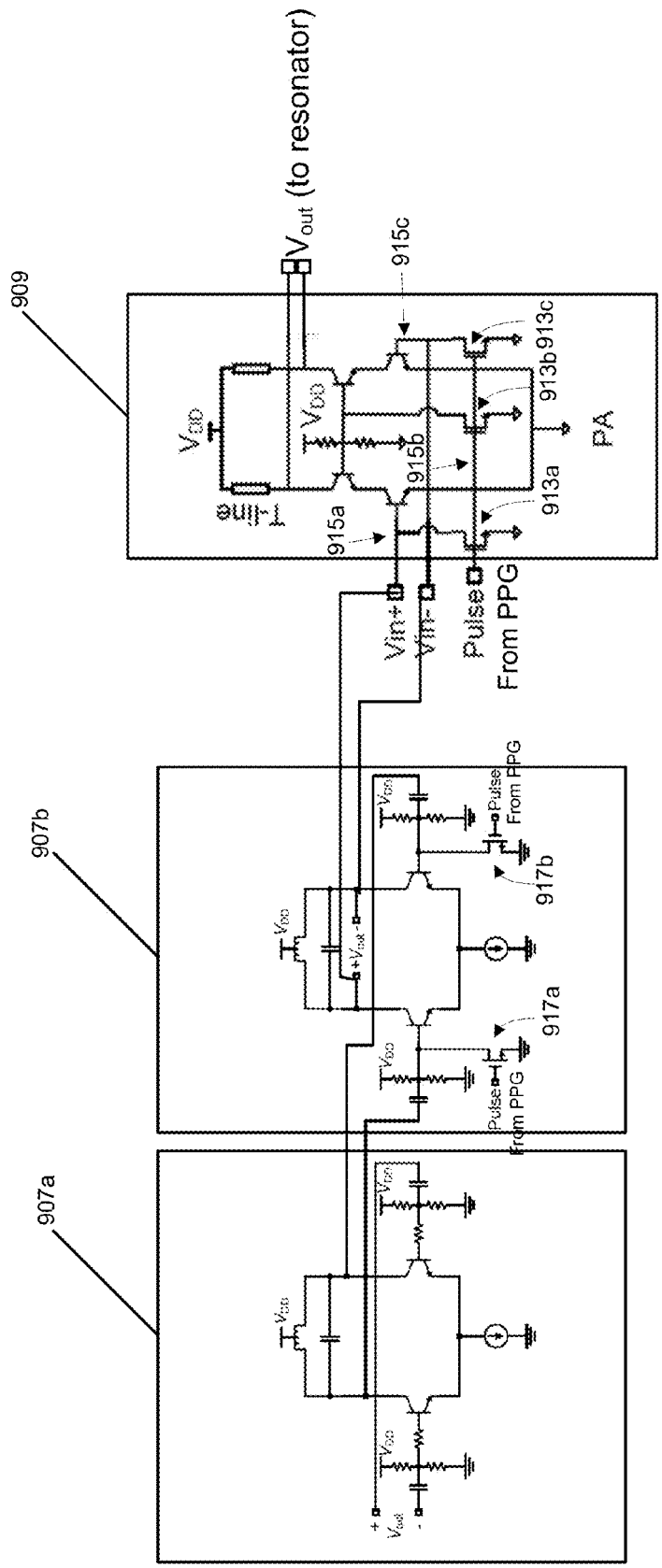
Figure 9D:
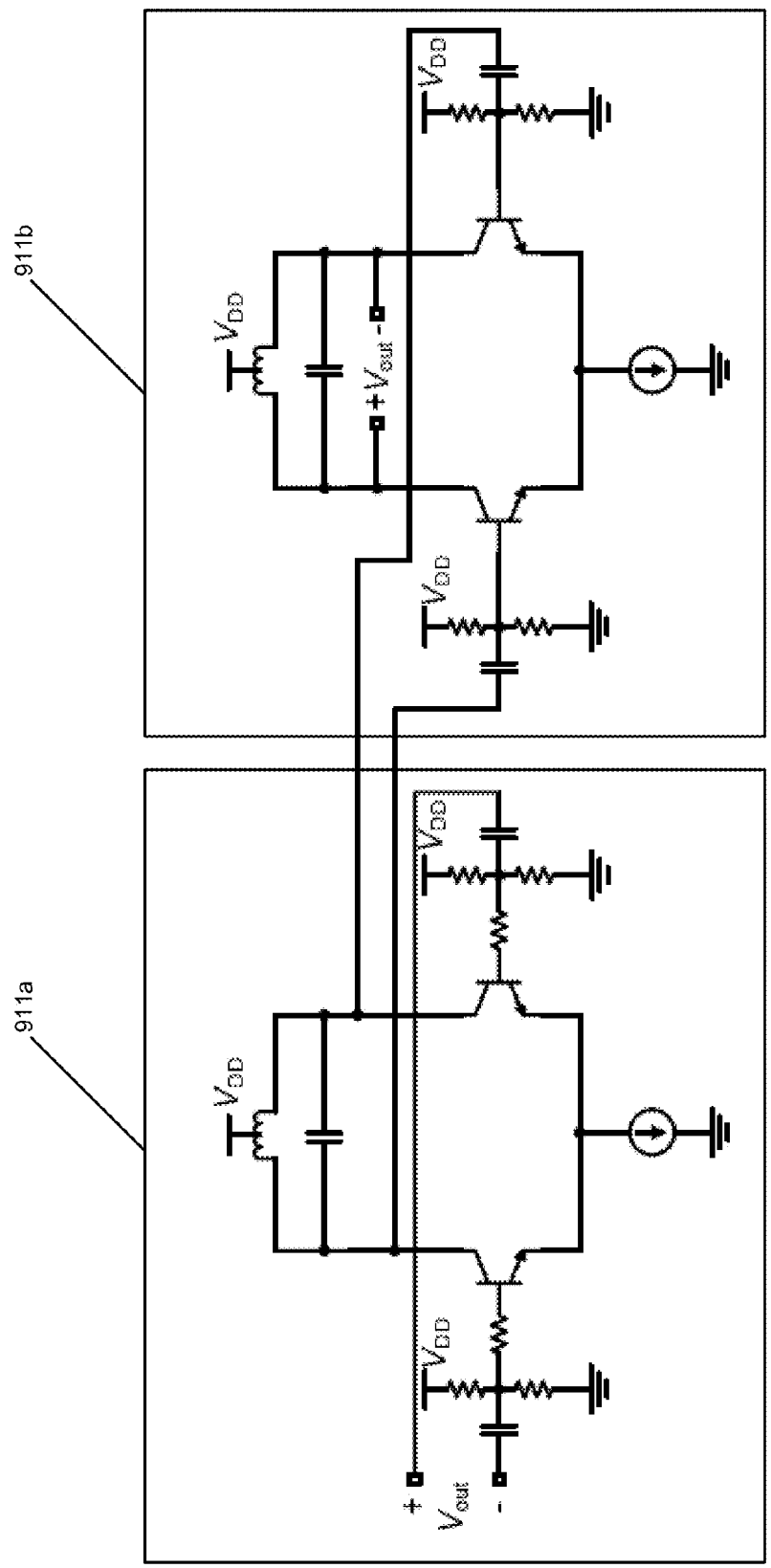

FIGS. 9B-9D shows the topology of a transmitter circuit like that shown in FIG. 9A in accordance with one or more embodiments of the invention. The transmitter circuit 901 includes a voltage controlled oscillator (VCO) circuit 903, a VCO buffer circuit 905, both shown in FIG. 9B; a dual stage RF buffer circuit 907a and 907b, both shown in FIG. 9C; a dual stage LO buffer circuit 911a and 911b, both shown in FIG. 9D, and a power amplifier (PA) circuit 909 shown in FIG. 9B. In accordance with one or more embodiments, the VCO topology used is a negative resistance cross-coupled transistor pair that provides the oscillator core. Differential transmission lines are used to bias the oscillator core as well as to serve as an inductor to resonate with the VCO varactors, which are implemented using reverse-biased diodes. The VCO is followed by a single-stage buffer that isolates the VCO from the PA and its preamplifier. The VCO signal is then routed to the RF and the LO paths, each through a two-stage buffer. In particular, the second stage 907b of the two-stage buffer in the RF path has a switches 917a, 917b that short its base voltage to ground, providing a high level of isolation between the VCO and the detection coil. The PA has a similar switching mechanism through base pull-down transistors. More specifically, fast switching is achieved through employing NMOSFET switches 913a, 913b, 913c that are connected to the biasing nodes 915a, 915b, 915c, respectively, of the PA. Accordingly, the NMOSFET switches act as a high-speed pull-down circuit. This high speed pull down circuit operates in a manner that is identical to that described above in reference to the pull down circuit of FIG. 4. In addition, switching the PA in this manner provides further isolation between the detection coil (not shown) and the VCO signal. This operation allows for the VCO to remain on throughout all stages, eliminating start-up time issues. The combined effect of switching the buffer 907b and the PA 909 results in a 55 dB on/off ratio for the current on the excitation coil.

Figure 10A:
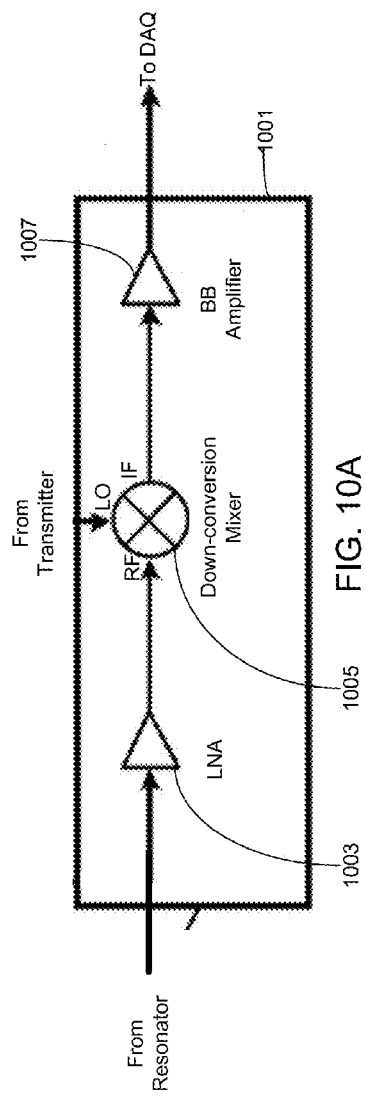
FIGS. 10A-10C show an integrated receiver circuit in accordance with one or more embodiments of the invention.

FIG. 10A shows an example of an integrated receiver circuit that may be employed as the receiver circuit in an integrated ESR transceiver chip in accordance with one or more embodiments. The receiver circuit 1001 includes a low noise amplifier (LNA) circuit 1003, a mixer circuit 1005, and a baseband amplifier circuit 1007. In accordance with one or more embodiments, the input of LNA circuit 1003 is electrically connected to the resonator (not shown) and receives an ESR signal from sample (not shown) that is located in, or near, the resonator. The output of the LNA circuit 1003 is electrically connected to the RF input port of the mixer circuit 1005. Furthermore, as described above, the LO input port of the mixer circuit 1005 is electrically connected to the VCO thereby providing the LO signal for the down conversion of the ESR signal to the baseband frequency. Furthermore, the IF output port of the mixer is electrically connected to the input terminal of the baseband amplifier circuit 1007. Thus, after being amplified by the LNA circuit 1003, the ESR signal is down-converted to baseband frequency and the baseband signal is then amplified by the baseband amplifier circuit 1007 and output to a data acquisition system (DAQ)(not shown). In accordance with one or more embodiments, any type of data acquisition system may be used without departing from the scope of the present disclosure.

Figure 10B:
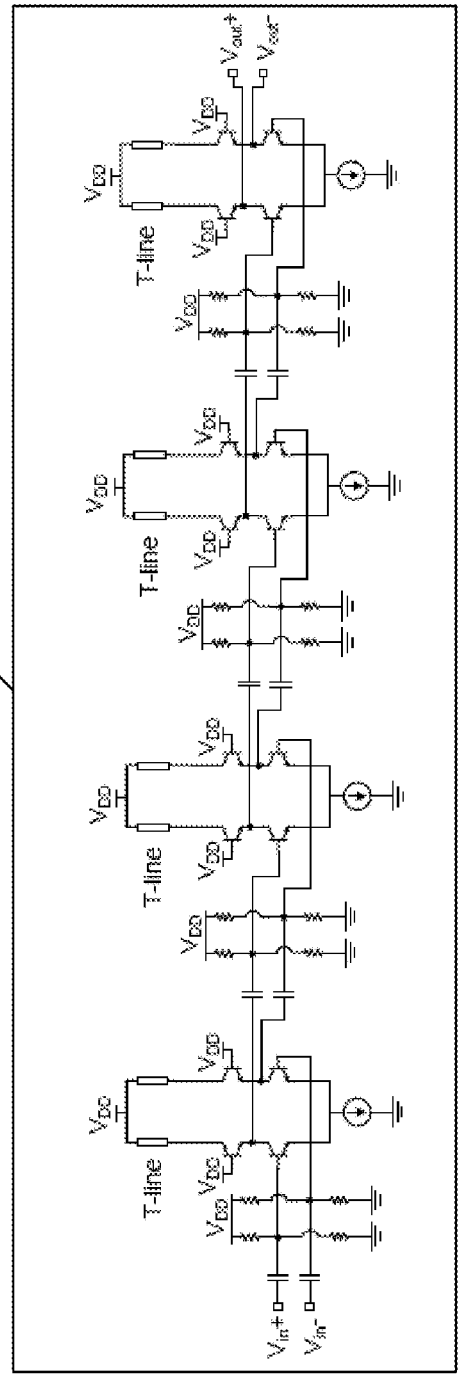
Figure 10C:
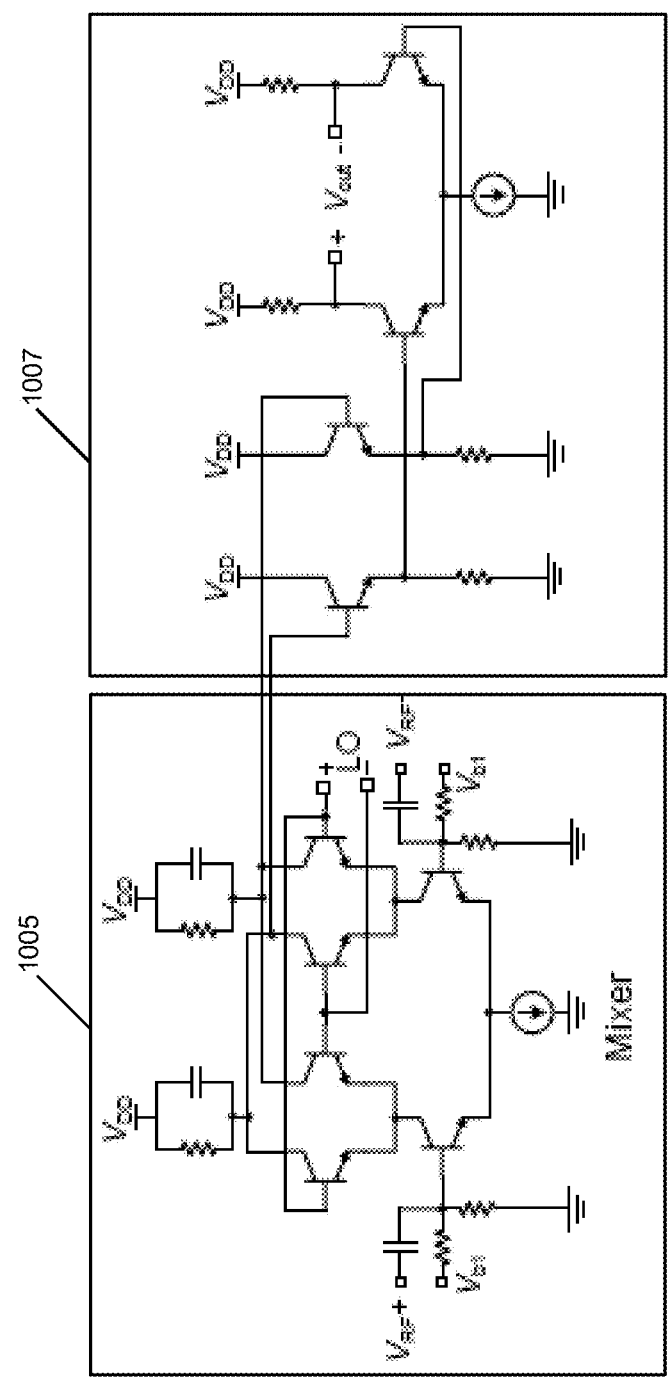

FIGS. 10B-10C show the topology of an integrated receiver circuit like that shown in FIG. 10A in accordance with one or more embodiments of the invention. The receiver circuit includes four-stage variable-gain LNA circuit 1003, shown in FIG. 10B; and mixer circuit 1005 and baseband amplifier circuit 1007, shown in FIG. 10C. The ESR signal from the sample is coupled to the input 1009 of the LNA circuit 1003. This signal is down-converted by the mixer circuit 1005 and amplified by the baseband amplifier circuit 1007. This amplified baseband signal is then to the DAQ for analysis. In accordance with one or more embodiments, the LNA circuit 1003 is a four-stage variable-gain LNA providing a maximum voltage gain of 61 dB. Each stage of the LNA uses a differential cascode topology. The LNA input matching circuit is designed to maximize the LNA gain and to provide a match to the detection resonator coil (not shown). In accordance with one or more embodiments, the mixer circuit 1005 uses a double balanced Gilbert cell topology. Furthermore, in accordance with one or more embodiments, 50Ω resistors are used to degenerate the mixer in order to improve its linearity. After being down-converted by the mixer, the signal is amplified by the baseband amplifier circuit 1007. In accordance with one or more embodiments, the baseband amplifier includes a differential stage matched to a differential output impedance of 100Ω.

Figure 14B:
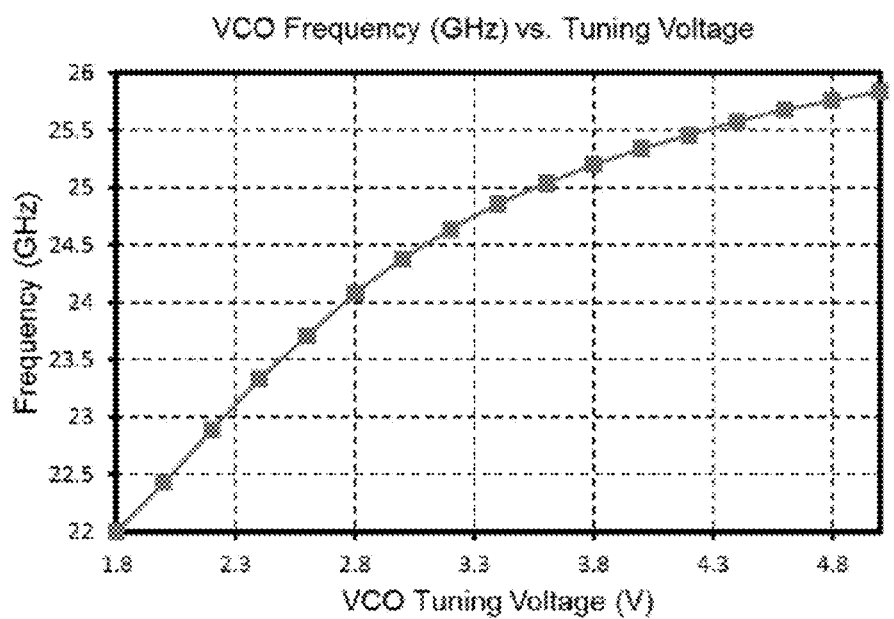

In accordance with one or more embodiments, the integrated ESR transceiver chip may include an integrated PPG as shown in FIG. 3, an integrated transmitter as shown in FIGS. 9A-9D, and an integrated receiver as shown in FIG. 10A-10C all located on the same chip substrate. As mentioned above, each of these components may be implemented in silicon, e.g., by way of a 0.13 μm SiGeBiCMOS process, or the like. To that end, FIG. 11A shows a micrograph of the fabricated integrated ESR chip that includes the programmable pulse generator, as described in FIG. 3, the on-chip transmitter (VCO, VCO buffer, two-stage RF buffer, two-stage LO buffer, and PA), receiver (4-stage LNA, mixer, and BB amplifier), and an integrated (on-chip) resonator. In this example the chip size is 2 mm by 1 mm and the power consumption of the entire chip is less than 385 mW. In addition, FIGS. 11B-11H shows the layout of the layers of the chip, from top layer to bottom layer, respectively, fabricated as shown in the micrograph of FIG. 11A. Furthermore, FIGS. 14-18 summarize test data and system specifications of an integrated ESR transceiver chip like the one shown in FIG. 11. FIG. 14B shows measured tuning range data for the VCO described above in FIG. 9B and implemented as shown in FIG. 11A.

As briefly described above in reference to FIG. 2, the integrated ESR transceiver chip may be employed as part of an ESR spectrometer system in accordance with one or more embodiments. FIGS. 12A-12B show a more detailed diagram of an ESR spectrometer 1201 that employs an integrated ESR transceiver chip 1203 like the one described above in reference to FIGS. 9-10. The functional details of an integrated ESR system have already been described above in reference to FIGS. 1A-1B and FIG. 7 and will not be reproduced here. However, the integrated ESR system shown in FIGS. 12A-12B differs from that described, e.g., in FIG. 7 because it employs an integrated resonator 1200 that includes a transmitter coil 1200a and a receiver coil 1200b. As already described in detail above in reference to FIGS. 9-10, the ESR transceiver chip 1203 includes an integrated transmitter circuit 901 and an integrated receiver circuit 1001. In this example, integrated ESR system includes external electromagnet 1211 for providing $B_0$. A sample 1213 may be located near the integrated resonator 1200.

FIG. 12B shows a more detailed view of the elements of the integrated ESR system in accordance with one or more embodiments. In this example, the PA circuit 1215 of the transmitter circuit converts the input RF power from the VCO to a current in the transmitter coil 1200a. This current generates the RF magnetic field pulse ($B_1$ pulse) that may be used to manipulate the spins of the unpaired electrons in the sample. After the $B_1$ pulse, the PA and its pre-driver buffer are switched off to allow the receiver circuit 1209 to sense the ESR signal. In accordance with one or more embodiments, the PA may employ an output matching network that is optimized using on chip-transmission lines. In accordance with one or more embodiments, the top metal layers having relatively low sheet resistances (0.007Ω/□ for AM and 0.37Ω/□ for MQ) may be used for the ESR resonator coils 1200a and 1200b in order to maximize the quality factor of the resonator. Furthermore, the coil size may be 20 μm and thus, the coil may produce a $B_1$ field of 20 G with an excitation current of 16 mA. Like the system described above in reference to FIG. 7, in accordance with one or more embodiments, the ESR system shown in FIGS. 12A-12B may operate in pulse or CW mode.

Figure 19A:
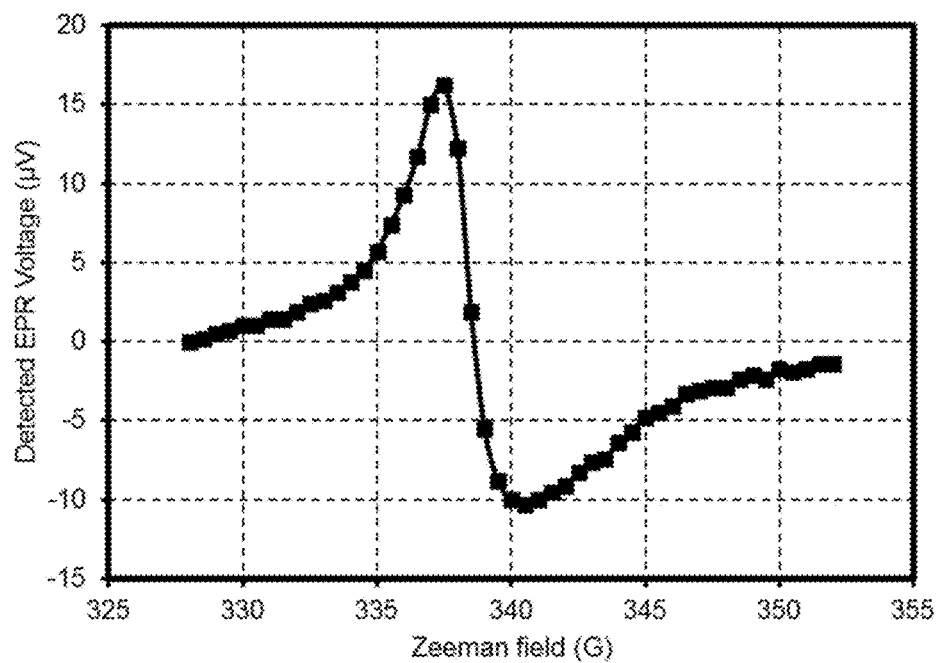
FIGS. 19A-19B show test data for an integrated transceiver circuit in accordance with one or more embodiments of the invention.
Figure 19B:
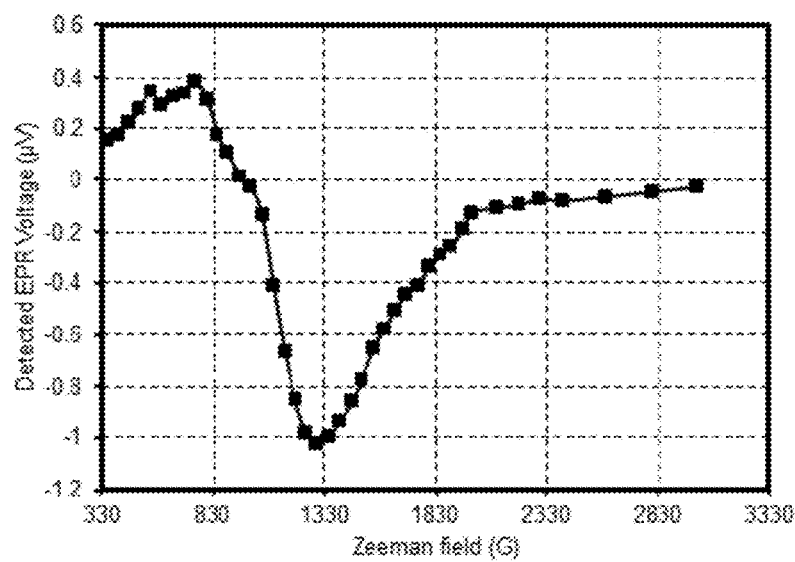

FIG. 19A shows an example ESR spectrum obtained using the CW ESR method as described above with a 50 mg room temperature sample of 2,2-diphenyl-1-picrylhydrazyl (DPPH), which is a powder composed of stable free-radical molecules commonly used as a standard for position and intensity of ESR measurements. In this measurement, the Zeeman magnetic field $B_0$ is swept from 330 G to 352 G. The VCO frequency is kept constant at 954 MHz, which is the resonance frequency of the loop-gap resonator in this example. In this example, the integrated transmitter sent an optimum power of 2 dBm to the resonator without saturating the ESR signal. This amount of RF power generates about 0.6 G magnetic field at the center of the resonator. $B_0$ is further modulated by a 2 kHz signal with 0.27 G amplitude to reduce the Flicker (1/f) noise. The response curve in FIG. 19A is the first-derivative of the Lorentzian absorption line. FIG. 19B shows the results of a similar experiment using $Fe_3O_4$ nanoparticles.

Figure 20:
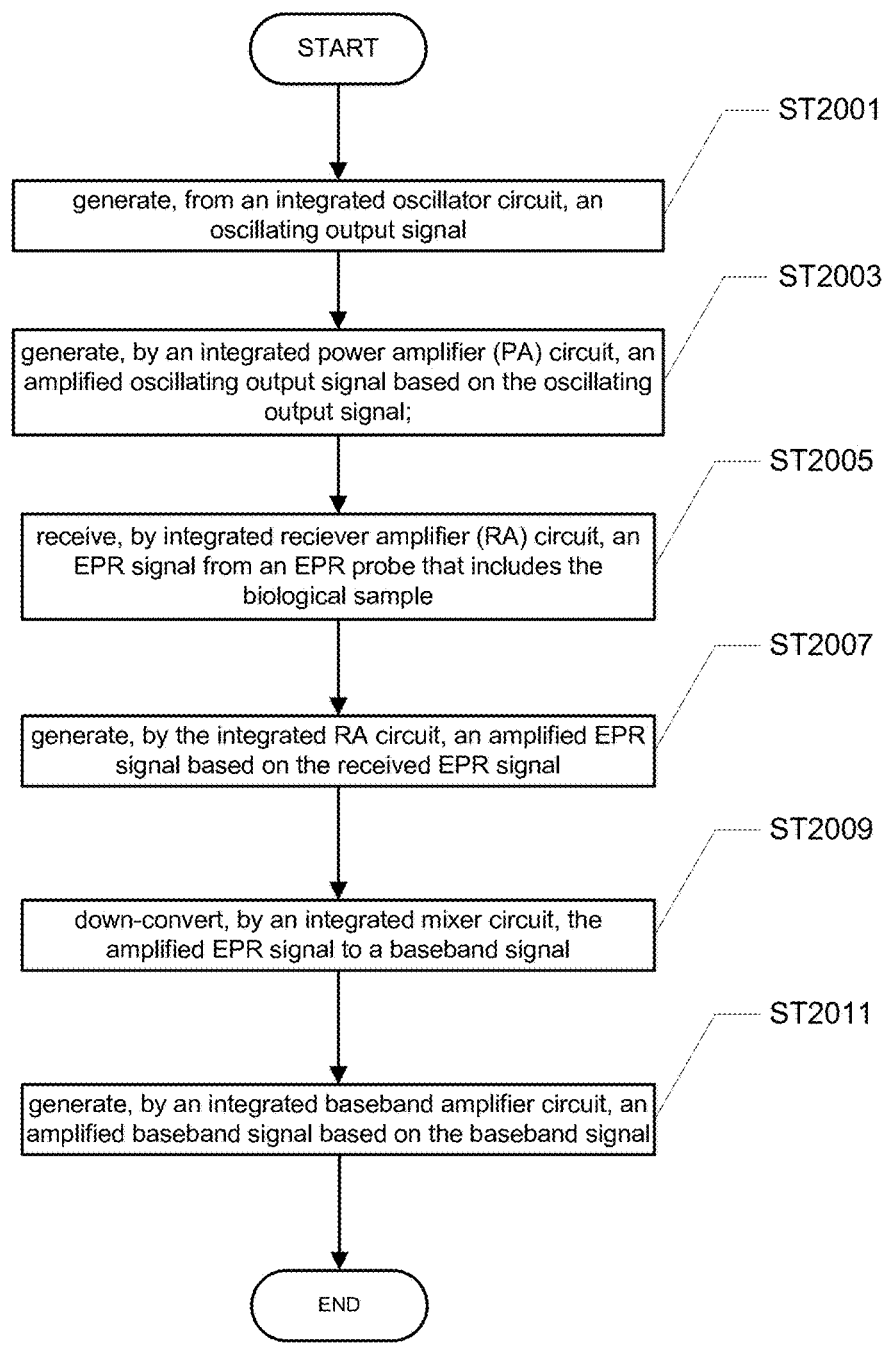
FIG. 20 shows a method in accordance with one or more embodiments of the invention.

FIG. 20 shows a method of obtaining an ESR signal from a biological sample in accordance with one or more embodiments. Generally speaking, this method may be used in conjunction with known methods and systems for obtaining a magnetic resonance image from an ESR signal. For the sake of conciseness, these known systems and methods for obtaining an image from an ESR signal will not be reproduced here. In accordance with one or more embodiments, the method shown in FIG. 20 may be employed through the use of an integrated ESR spectrometer system that employs an integrated ESR transceiver as described above in reference to FIGS. 1-19. Furthermore, when employed in the context of an ESR imaging system, the integrated ESR system described above may be adapted to include, e.g., one or more gradient coils, computers, processors, memory, displays, user interface devices, etc. that are commonly employed with an ESR imaging system. General background information regarding ESR imaging may be found in J. A. Weil et al., "Electron Paramagnetic Resonance: Elementary Theory and Practical Applications," New York: John Wiley & Sons, Inc. 1994.

Returning to FIG. 20, in step 2001, an integrated oscillator circuit generates an oscillating output signal. In accordance with one or more embodiments, the integrated oscillator circuit may be an integrated voltage controlled oscillator circuit similar to those described above in reference to FIGS. 2, 4A, 4B, 9A, 9B, 14A, 14B, and FIGS. 18A-18B. In step 2003, an integrated power amplifier (PA) circuit receives the oscillating output signal from the oscillator circuit and generates an amplified oscillating output signal. In accordance with one or more embodiments, the PA circuit may be similar to those described above in reference to for the PA circuit described in FIGS. 2, 4A, 4B, 9C, and FIGS. 18A-18B. For example, in one embodiment, the PA circuit may amplify the oscillating output signal by 15 dB.

In accordance with one or more embodiments, the amplified oscillating output signal is a current signal used to drive a transmitting resonator used to generate an oscillating transverse magnetic field in an ESR probe, as described above in reference to FIGS. 1A-1B, 7A-7C, and 12A-12B. Furthermore, in accordance with one or more embodiments, a biological sample, or more precisely a magnetic species located within a biological sample, may be excited by the oscillating transverse magnetic field from the probe. As a result of the excitation of the biological sample, the magnetic species within the sample emit an ESR signal. In accordance with one or more embodiments, the excitation may be a CW excitation for frequency domain imaging or may be a pulsed excitation for time-domain imaging.

Optionally, if a pulsed excitation is used, the method may also include generating a voltage pulse sequence using an integrated programmable pulse generator circuit as described above in reference to FIG. 3. Furthermore, the pulsed amplified output signal may be generated by switching the PA circuit and/or an RF buffer circuit. The PA circuit may be switched by supplying the voltage pulse sequence to an NMOSFET driver that is configured to pull down a base voltage of an input transistor of the PA circuit. This process is described in more detail above in reference to FIGS. 4B and 9A-9D and results in a very quick switching process, e.g., approximately 1 ns in accordance with one or more embodiments. Accordingly the method disclosed herein is suitable for ESR medical applications that may use magnetic species or spin markers that have a short relaxation time.

Returning to FIG. 20, in step 2005, the ESR signal emitted by the magnetic species of the biological sample detected by an integrated receiver of the integrated ESR transceiver chip. More specifically, in accordance with one or more embodiments, the integrated receiver includes an integrated receiver amplifier that is electrically connected to a receiving resonator of the ESR probe. The receiving resonator receives the ESR signal that is emitted by the sample and this ESR signal is then is directed to an integrated receiver amplifier where it is amplified. In accordance with one or more embodiments, the receiving resonator may be the same resonator as the transmitting (excitation) resonator, known as a duplex configuration. Such a configuration is described above in more detail in reference to FIGS. 7B-7C. Furthermore in accordance with one or more embodiments, the method may employ an active leakage cancellation scheme as described above in reference to FIG. 8. In other embodiments, the receiving and transmitting resonators may be separate resonators. Further embodiments may employ separate resonators that are also integrated into the integrated ESR transceiver chip, as described in more detail above in reference to FIGS. 11A-12B. Furthermore, in accordance with one or more embodiments, the integrated receiver amplifier may be a LNA circuit like those described in FIGS. 2, 5A-5B, 10A-10C, and 18A-18B. For example in accordance with one or more embodiments, the LNA may have an noise figure of 3.7 dB and a power gain of 40 dB.

In step 2009, the amplified ESR signal is down-converted in the frequency domain to a baseband signal. As described above in reference to FIGS. 2, 5, and 10, this down-conversion is accomplished by way of an integrated mixer circuit.

In step 2011, the down-converted baseband signal is sent to a integrated baseband amplifier circuit for amplification. In accordance with one or more embodiments, the integrated baseband amplifier may be like those described in more detail above in reference to FIGS. 2, 5, and 10.

In accordance with one or more embodiments, the integrated oscillator circuit, the integrated PA circuit, the integrated receiver amplifier circuit, the integrated mixer circuit, the integrated baseband amplifier circuit, and the integrated programmable pulse generator circuit may be disposed on the same chip substrate, thereby forming an integrated ESR transceiver chip. Examples of such devices fabricated using a 0.13 µm SiGeBiCMOS process are shown in the micrographs of FIGS. 6A and 11A.

In accordance with one or more embodiments, the ESR signals obtained using the above method have a number of uses in the biomedical arena. Generally speaking an ESR signal from a biological sample includes information regarding a number of physical properties of the biological sample. As used herein, the term biological sample is used broadly to refer to any sample that is of interest in biology or medicine and may include solid, liquid, and gaseous samples. For example, biological samples may include tissue samples, tumors, or tumor samples, or phantoms that include one or more biological molecules mixed within.

Generally speaking, one or more embodiments of the ESR system and method may detect any magnetic species within the biological sample, e.g., para- or dia-magnetic molecules, atoms, ions, free radicals, and/or nanoparticles. A few examples of possible applications of the method will be described below for the sake of example. Accordingly, the system and/or method described above should not be limited to only these examples.

In accordance with one or more embodiments, the biological sample may be enhanced with nanoparticles that exhibit a high ESR response. Such a particle is known as a marker nanoparticle and/or a spin marker nanoparticle. For example, FIG. 19B shows an example ESR spectrum obtained using the CW ESR method as described above with a sample of $Fe_3O_4$ nanoparticles. In this measurement, the Zeeman magnetic field $B_0$ is swept from 330 G to 3300 G. The VCO frequency is kept constant at 954 MHz, which is the resonance frequency of the loop-gap resonator in this example. In this example, the integrated transmitter sent an optimum power of 2 dBm to the resonator without saturating the ESR signal. This amount of RF power generates about 0.6 G magnetic field at the center of the resonator. $B_0$ is further modulated by a 2 kHz signal with 0.27 G amplitude to reduce the Flicker (1/f) noise. The response curve in FIG. 19B is the first-derivative of the Lorentzian absorption line.

Furthermore, in accordance with one or more embodiments, the nanoparticles may be functionalized so that these nanoparticles may be directed to particular cells of interest within the biological sample. For example, functionalized super paramagnetic iron oxide nanoparticles (SPIONs) may be used in accordance with one or more embodiments. Furthermore, any type of nanoparticle marker may be used without departing from the scope of the present disclosure.

As an additional example, the integrated ESR system and method in accordance with one or more embodiments may be used to obtain ESR images of spin labeled biological samples that in turn may be used to determine three-dimensional biomolecule conformations (e.g., protein conformations). In addition, the ESR system disclosed herein may be used to study the transition metal ions involved in enzymatic biochemical pathways.

Furthermore, ESR signals obtained using the ESR system and method in accordance with one or more embodiments may be used to study and diagnose disease. For example, the understanding the physiological heterogeneity of tumors is essential for studying pathways for the initiation and progression of cancer, the role of micro-environmental factors, and, in turn, the tumor-drug and tumor-radiation interaction. To that end, the ESR system and method in accordance with one or more embodiments may facilitate quantitative, non-invasive, in vivo imaging techniques with sufficient spatial and temporal resolution to study the complexity of physiological variations in tumors, and to compare and contrast them to normal tissue. For example, the ESR signals obtained using the ESR system and method in accordance with one or more embodiments, may further elucidate the role of free radicals and oxidative stress within tumors.

In addition, the ESR images may provide a quantitative, spatially resolved map of the oxygen distribution in solid tumor cancers. Such a map allows staging of tumors in terms of their resistance to radiation and chemotherapy because hypoxic (low oxygen molecule concentration, referred to herein as $[O_2]$) tumors tend to have more aggressive phenotype with higher resistance to radiation. In accordance with one or more embodiments, the ESR system and method may be used to perform oximetery based on the interaction of oxygen unpaired electrons with a reporter molecule that may be an inert, biologically stable, free radical. Some examples of such reporter molecules include carbon particulates, e.g., India Ink, molecules with one or more nitroxides bonds, and/or tri-aryl-methyl (trityl) molecules with a protected electron on the central methyl carbon. These reporter molecules are given here merely for the sake of example and are not intended to limit the scope of the present disclosure. Furthermore, in accordance with one or more embodiments, the ESR system and method operating in pulse mode may be used to measure and/or image the temporal relaxation properties of the reporter molecules, e.g., by measuring the ESR relaxation properties such as $T_1$, $T_2$, and/or $T_2^*$. Because the change in the reporter molecule relaxation rate is proportional to the local concentration of oxygen and not the concentration of the reporter molecules themselves, ESR spectroscopy/imaging using the system and methods disclosed herein provides an accurate estimation of tissue oxygenation.

Furthermore, depending on the type of spin marker, other physiological parameters of interest such as acidity, viscosity, presence of free radicals, and temperature in tumors may be measured noninvasively and quantitatively using the ESR system and method in accordance with one or more embodiments. In the case of cardiovascular diseases, the ESR system may be used to study the generation of free radicals and small signaling molecules, e.g., nitric oxide, during various pathologies, e.g., as a mechanism for ischemia reperfusion injury. In addition, because melanin pigments act as spin traps, these pigments can be detected using the ESR system and method thereby allowing the ESR system in accordance with one or more embodiments to be used to detect and study melanomas. The ESR system in accordance with one or more embodiments may be used for studying the superficial skin lesion in addition to metastasis to other organs.

In addition, one or more embodiments of the ESR system disclosed herein may be used to study reactions with free radicals, that may be generated as intermediates or products. To this end, one or more embodiments of the ESR system may be used in a radiation dosimeter system, where the dose of ionizing radiation may be determined by ESR measurement of the amount of free radicals generated in a standardized sample, (e.g., an alanine block) or in-vivo measurement of exposure to ionizing radiation (e.g., during a nuclear catastrophe) by ESR measurement of free radicals in tooth enamels of potential victims.

In accordance with one or more embodiments, the integrated ESR system may be used in a system for the early detection of cancer. Accordingly, the biological sample may include magnetic nanoparticles that are functionalized with a cancer-specific antibody. This cancer-specific antibody causes the nanoparticles to attach to cancerous cells. The ESR sensor is then used to detect the ESR signal from the magnetic nanoparticles that are attached to cancerous cells. This is because unlike an NMR signal, which is generated by protons in tissues, the ESR signal is generated by the unpaired electrons that exist in nanoparticle and not in the tissue. Thus, this form of ESR based detection is extremely versatile and may be used to detect a number of different cancers by appropriate functionalization of the nanoparticle. Accordingly, one or more embodiments of the integrated ESR system proposed herein can be used in a non-invasive manner by using target-specific functionalized nanoparticles as surrogate markers (i.e., the integrated ESR system and nanoparticle serve as an integrated sensor-antenna reporter system).

In accordance with one or more embodiments, a magnetic nanoparticle, e.g., SPIONs, or the like, may be functionalized to detect Prostate-Specific G-protein coupled Receptor (PSGR). PSGR is specifically expressed in human prostate tissues. Furthermore, it has been shown that Prostatic Intra-epithelial Neoplasia (PIN) is the precursor of prostate cancer and is marked by the overexpression (approximately 10-fold) of PSGR. Thus, in accordance with one or more embodiments, anti-PSGR functionalization may be used to direct the magnetic nanoparticles to PIN cells and enable their detection by the ESR sensor. In accordance with one or more embodiments, the ESR sensor may detect the presence, location, and concentration of PSGR. Thus, in accordance with one or more embodiments, the system and method disclosed herein may be used for early detection of prostate cancer.

In accordance with one or more embodiments, a magnetic nanoparticle, e.g., SPIONs, or the like may be used to detect μ-Opioid expression in lung tissue. It has been recently shown that there is a 5- to 10-fold increase in μ-Opioid expression in lung samples from patients with human Non-Small Cell Lung Cancer (NSCLC). μ-Opioid Receptor (MOR) is an important regulator of lung cancer progression. MOR overexpression increases Akt and mTOR activation, proliferation, and extravasation in human bronchioloalveolar carcinoma cells. Accordingly, in accordance with one or more embodiments, MOR-expressing NSCLC can be targeted by anti-MOR-functionalized magnetic nanoparticle, e.g., a SPION, or the like, that can serve as a magnetic beacon and indicate the presence, location, and concentration of NSCLC by an ESR sensor. Thus, in accordance with one or more embodiments, the system and method disclosed herein may be used for early detection of lung cancer.

In accordance with one or more embodiments, cancer cells may be targeted by nanoparticles having molecular specificity towards tumor-associated antigen (TAA). Accordingly, one or more embodiments of the invention allow for early detection of cancers by looking at an organ of origin for pre-invasive lesions rather than the serum markers released by cancer cells. For example, pathologic analysis of prophylactic removal of the fallopian tubes and ovaries in women with increased risk, i.e., BRCA+, has revealed a possible precursor lesion in the lumen of the distal fimbriated end of the fallopian tube. Thus, one or more embodiments of the ESR system may avoid the miss-classification of fallopian tube cancers as ovarian cancer, and further expand the opportunities for early-detection.

Due to its small size, the integrated ESR system in accordance with one or more embodiments of the invention may be inserted into a living patient, e.g., into the fallopian tube of a patient in the example described above. Accordingly, increased ESR signal may be obtained due to the proximity of the ESR detector, e.g., the receiver resonator, to the biological sample being investigated, in this case, e.g., a pre-invasive lesion in a fallopian tube.

In accordance with one or more embodiments, the voltage amplitude of the ESR signal at the receiver can be calculated by the following equation $$V_s = \chi'' \eta Q \sqrt{P Z_0}$$

where, $V_s$ is the ESR signal at the end of the transmission line connected to the resonator, $\eta$ is the filling-factor, Q is the quality-factor of the resonator, $Z_0$ is the characteristic impedance of the transmission line, and P is the microwave power. As used herein the filling factor $\eta$ is defined as the ratio of the sample volume to the volume of the resonator, where the cubic or spherical resonator volume is defined to the volume bounded by a cube or sphere, respectively, centered on the resonator that has a side or diameter, respectively, that is equal to the largest dimension of the resonator. Thus, in accordance with one or more embodiments, because the size of the integrated sensor is several orders of magnitude smaller than conventional spectrometers, one or more embodiments of the invention significantly boosts the filling factor and the sensitivity of the device. For example, an integrated ESR resonator with volume of (0.1 mm)×(0.1 mm)×(0.1 mm)=$10^{-3}$ mm$^3$ to detect 10,000 nanoparticles in a sample volume of $10^{-3}$ mm$^3$, the filling factor would be around 1. Conventional ESR resonators have a volume of greater than 1000 mm$^3$, which results in a filling factor of $10^{-6}$. Accordingly, filling factors in a range between $10^{-6}$ to 1 are realizable in accordance with one or more embodiments. In a typical measurement, the range of filling factors may be 0.01-1, or 0.1-1. One of ordinary skill will appreciate that any number of filling factors up to 1 may be employed in accordance with one or more embodiments without departing from the scope of the present disclosure. The high filling factors possible in accordance with one or more embodiments of the present invention mean that the magnitude of the ESR signal produced by the sensor in accordance with one or more embodiments may be larger that traditional sensors by as much as a factor of $10^6$. Accordingly, one or more embodiments provides for a significant enhancement sensitivity over traditional devices.

In accordance with one or more embodiments, because the size of our integrated ESR resonator is very small, it can be mounted on a tiny probe (1 mm) and can be placed very close to the tissue. For example, in the case of ovarian cancer, the resonator may be placed very close to a cancerous tissue inside the living patient, e.g., in the ovary to maximize the filling factor.

In accordance with one or more embodiments, a drug may be loaded into or onto the surface of a collection of magnetic nanoparticles. The nanoparticles can then be placed in a carrier, e.g., a porous amorphous silicon carrier with diameter of 1 μm ($10^{-6}$ m). When the carrier releases the magnetic nanoparticles, its ESR spectrum changes. This is because when magnetic nanoparticles are in close proximity of each-other (less than 100 nm) their magnetic field changes the ESR spectrum of other nanoparticles. This means that the miniaturized ESR sensor can be used to monitor the quality (and occurrence) of drug delivery.

In the following figures, the measured ESR response for different samples with various concentrations is shown. From the measurements, it is shown that one or more embodiments of the invention may detect magnetic nanoparticles with a concentration of as small 0.1 ppm, which is a clinically significant number.

Figure 21A:
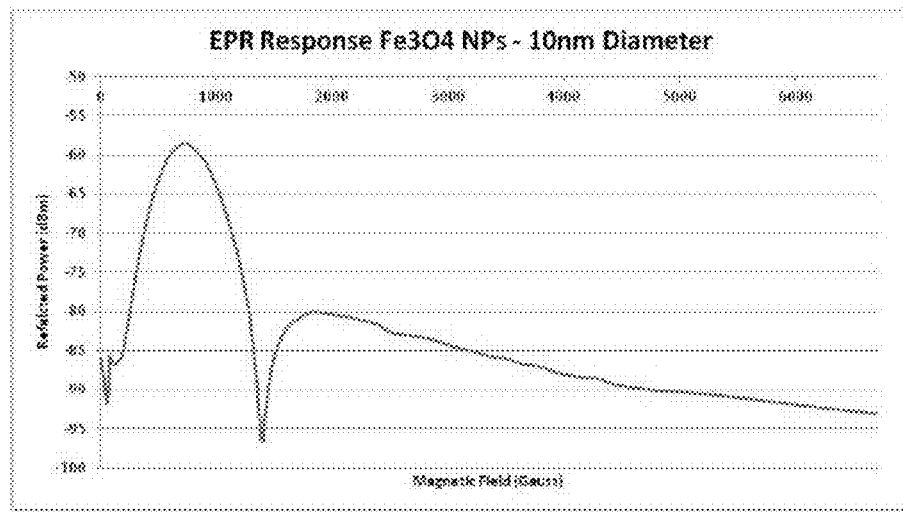
FIGS. 21A-21B show test data for an integrated transceiver circuit in accordance with one or more embodiments of the invention.
Figure 21B:
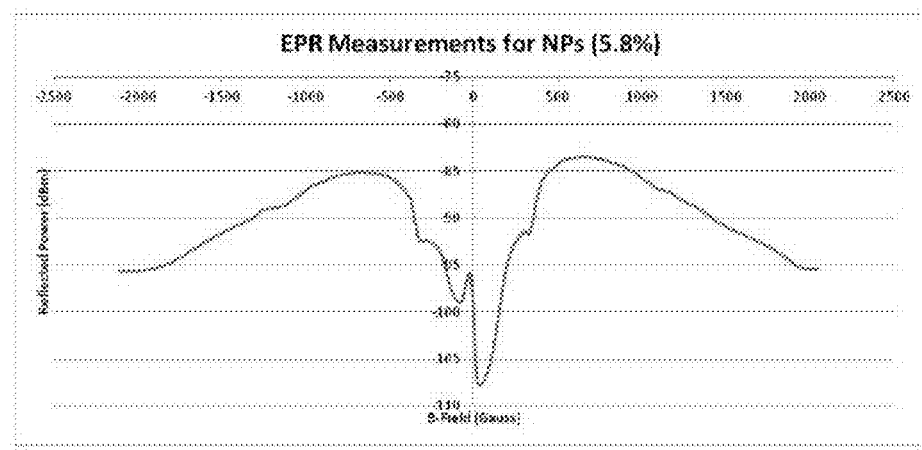
Figure 22A:
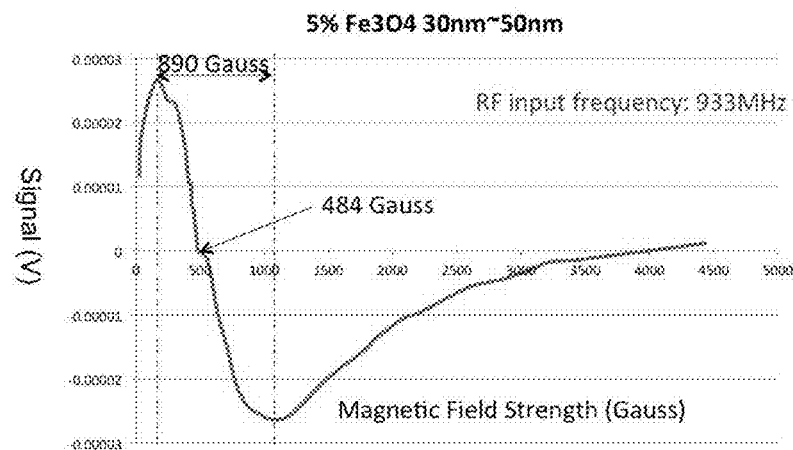
FIGS. 22A-22B show test data for an integrated transceiver circuit in accordance with one or more embodiments of the invention.
Figure 22B:
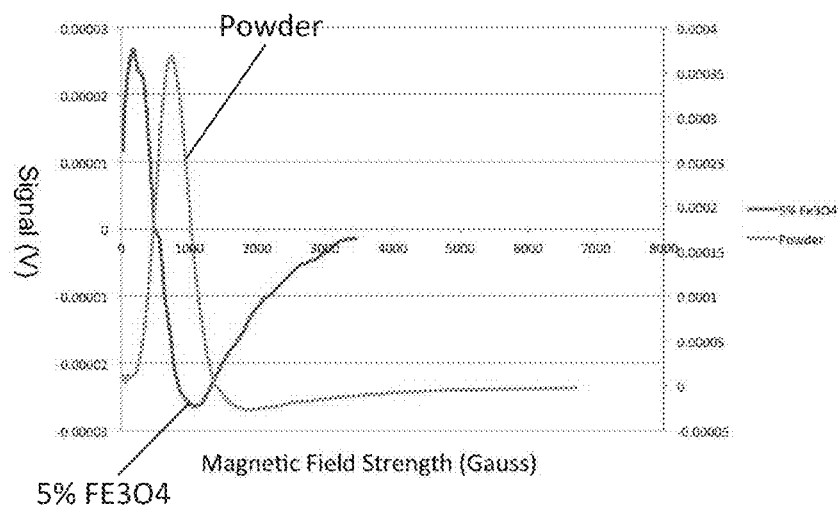

FIGS. 21A and 21B show the magnitude of the ESR signal (reflected power form the resonator) taken for powder Fe$_3$O$_4$ and in a solution with only 5.8% concentration of 10 nm nanoparticles Fe$_3$O$_4$, respectively. Similarly, FIGS. 22A and 22B show a similar measurement but using 30 nm-50 nm Fe$_3$O$_4$ powder and 5% solution (50 mg nanoparticles/1 ml of water). This data shows that the integrated ESR system in accordance with one or more embodiments can use magnetic nanoparticles to differentiate the environment surrounding the nanoparticles, i.e., it can probe interactions of magnetic nanoparticles with the surrounding environment.

Figure 23A:
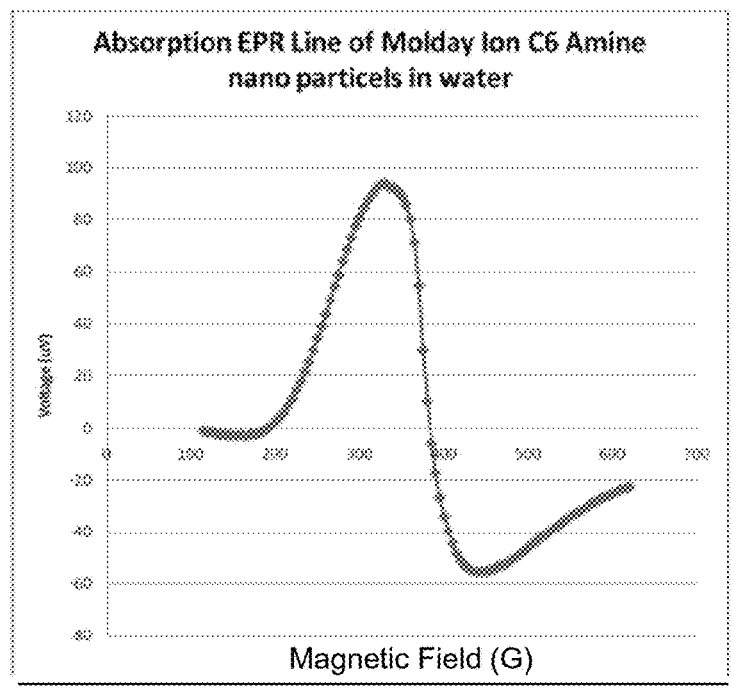
FIGS. 23A-23B show test data for an integrated transceiver circuit in accordance with one or more embodiments of the invention.
Figure 23B:
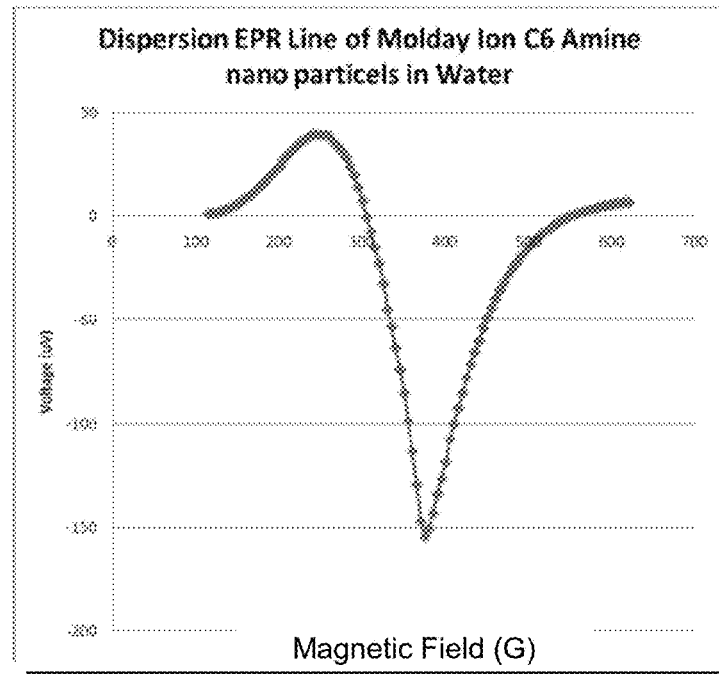

FIGS. 23A and 23B show the measured ESR absorption and dispersion spectrum, respectively, for Molday Ion C6 Amine nano-particles in water. In this example a concentration of 1% was used and voltage amplitude of 100 μV was achieved. Because in this example, the voltage sensitivity of the sensor is around 1 nV, this data shows that the sensor can measure concentrations as small as 0.1 ppm. In accordance with one or more embodiments, the sensor can detect an ESR signal from a small amount, e.g., 1,000 of magnetic nanoparticles that are within the resonator volume, where the resonator volume is defined to the volume bounded by a cube or sphere centered on the resonator are having a side or diameter, respectively that is equal to the largest dimension of the resonator. For example, for a square loop-gap resonator having an outer diameter of 5 mm, the spherical resonator volume would be the volume of a sphere having a diameter of 5 mm that is centered on the resonator. Likewise, the cubic resonator volume would be defined to be a cube centered on the resonator and having a sides of length 5 mm.

Figure 24A:
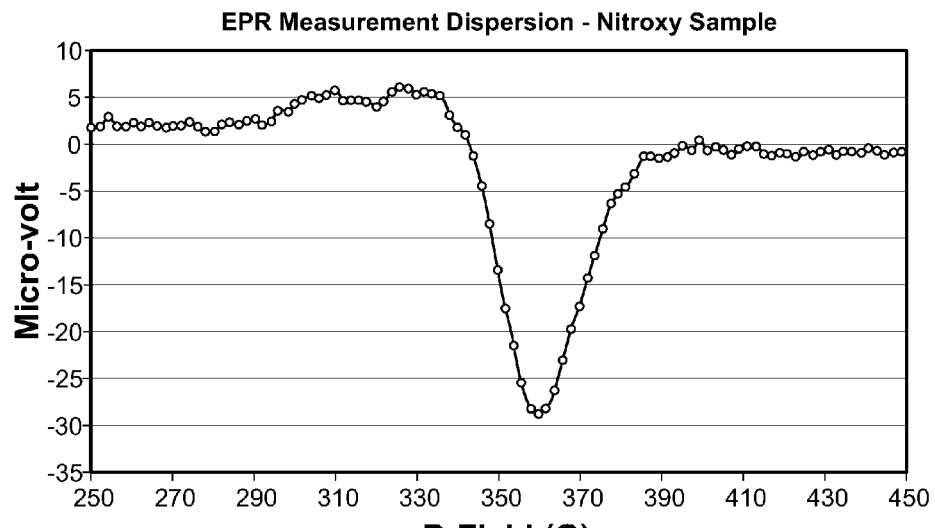
FIGS. 24A-24B show test data for an integrated transceiver circuit in accordance with one or more embodiments of the invention.
Figure 24B:
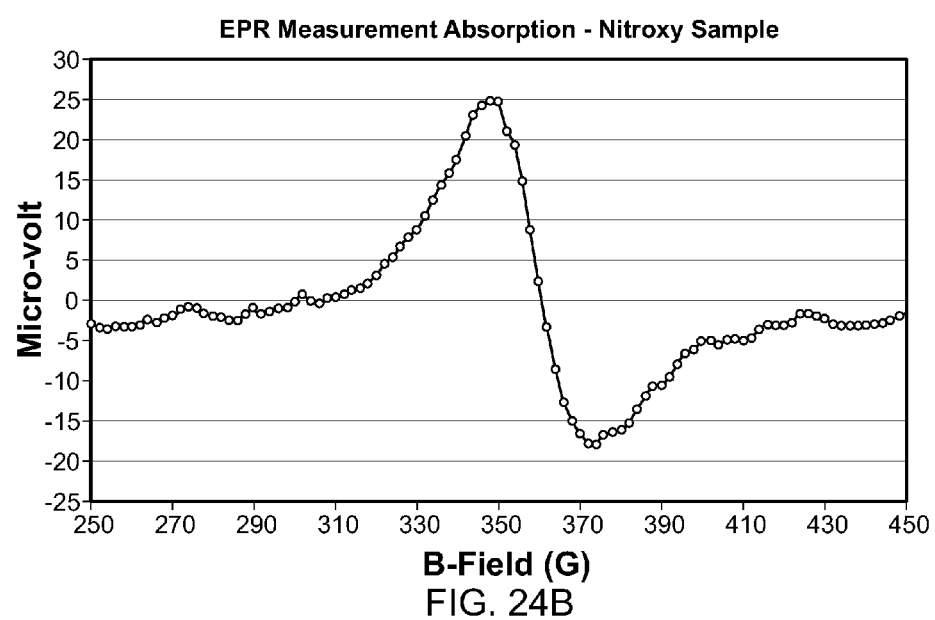

FIGS. 24A and 24B show the measured ESR absorption and dispersion spectrum, respectively, for a nitroxy sample in accordance with one or more embodiments.

In accordance with one or more embodiments, due to the high sensitivity of integrated ESR sensor, it can be used it in conjunction with a permanent magnet, e.g., a rare earth magnet to measure the ESR signal. A rare earth magnet has a large gradient of the magnetic field, which reduces the amplitude of the signal. However, due to the high sensitivity of the sensor, the ESR signal may still be measured from a distance of several cm.

Figure 25:
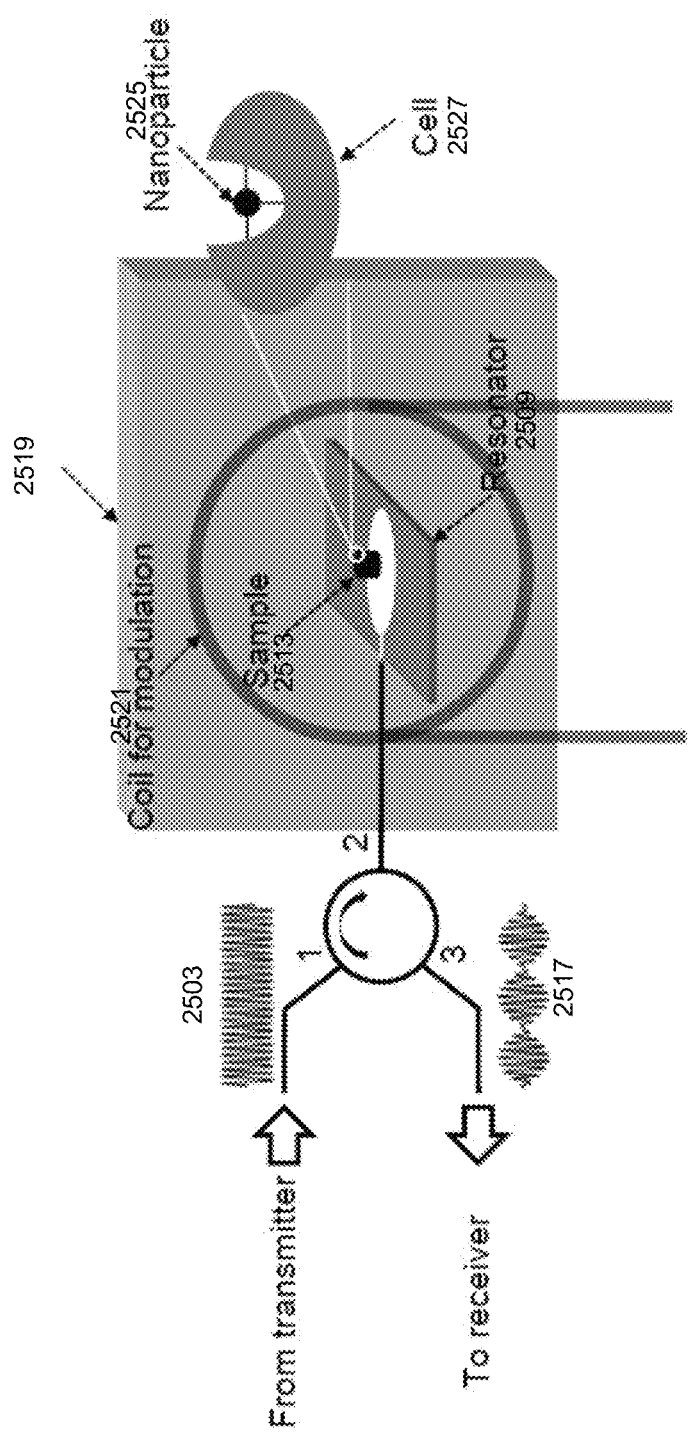
FIG. 25 shows an ESR system in accordance with one or more embodiments of the invention.

Accordingly, in accordance with one or more embodiments, a portable ESR system may be made using one or more permanent magnets, e.g., rare-earth magnets placed sideways in a robust setup with an inductor serving as the modulation coil. One of ordinary skill will appreciate that many different configurations of permanent magnets may be used without departing from the present disclosure, e.g., a Halbach array or the like. FIG. 25 shows an example of the ESR system in accordance with one or more embodiments. The sensor may include an integrated ESR transceiver chip (not shown) like that shown and described in detail above in reference to FIGS. 1-20. The ESR system shown in FIG. 25 is functionally similar to that shown and described above in reference to FIG. 1A in that it is configured to operate in the CW mode in accordance with one or more embodiments. In this example, a sinusoidal RF signal 2503 (the amplified oscillating output signal) is sent to the resonator 2509 and reflected RF power 2517 that is reflected from the resonator is measured to calculate the amount of the RF power absorbed by the sample 2513. The absorbed power varies with the strength of the $B_0$ field and thus, the RF power absorption curve, reflected in the reflected RF power 2517 as a function of $B_0$, reveals the magnetic properties of the sample 2513. In accordance with one or more embodiments, in order to reduce the low frequency noise (1/f), $B_0$ may be modulated at a frequency $f_{CW}$ and the reflected power 2517 may be measured at the same modulation frequency $f_{CW}$. Furthermore, in accordance with one or more embodiments, the $B_0$ field may be held constant and the RF frequency of the sinusoidal RF signal 2503 may be modulated to perform the CW measurement.

In accordance with one or more embodiments, $B_0$ may be provided by a small permanent magnet 2519, e.g., a rare earth magnet. Furthermore, the modulation of B0 may then be applied by sending an oscillating current through the modulation coil 2521. In this example, the sample 2513 may be located close to the resonator 2509. In accordance with one or more embodiments, the sample 2513 may be a biological sample, e.g., a human tissue, and may include one or more magnetic nanoparticles 2525, e.g., SPIONs, or the like. Furthermore, in accordance with one or more embodiments, the magnetic nanoparticles 2525 may be functionalized such that it may bind to a certain type of cell 2527, as described above. For example, if the nanoparticle may be functionalized with a certain tumor-associated antigen (TAA) such that the nanoparticle will be directed to a certain type of tumor cell. In accordance with one or more embodiments, the magnetic nanoparticle may be functionalized with the appropriate anti-receptor molecule, e.g., anti-μ-Opioid Receptor, anti-Prostate-Specific G-protein coupled Receptor, or any other appropriate functionalization. In accordance with one or more embodiments, the ESR signal of the magnetic nanoparticle may be detected by the integrated ESR transceiver ship and thus, the functionalized magnetic nano-particle may serve as an antenna or marker for certain biological molecules.

While the above portable ESR system is described in the context of a CW measurement that employs functionalized nanoparticles the device may be employed to do time domain ESR measurements as well. Furthermore, the system may be implemented using the integrated ESR transceiver chip that include an integrated resonator as described in detail above without departing from the scope of the present disclosure.

Figure 26:
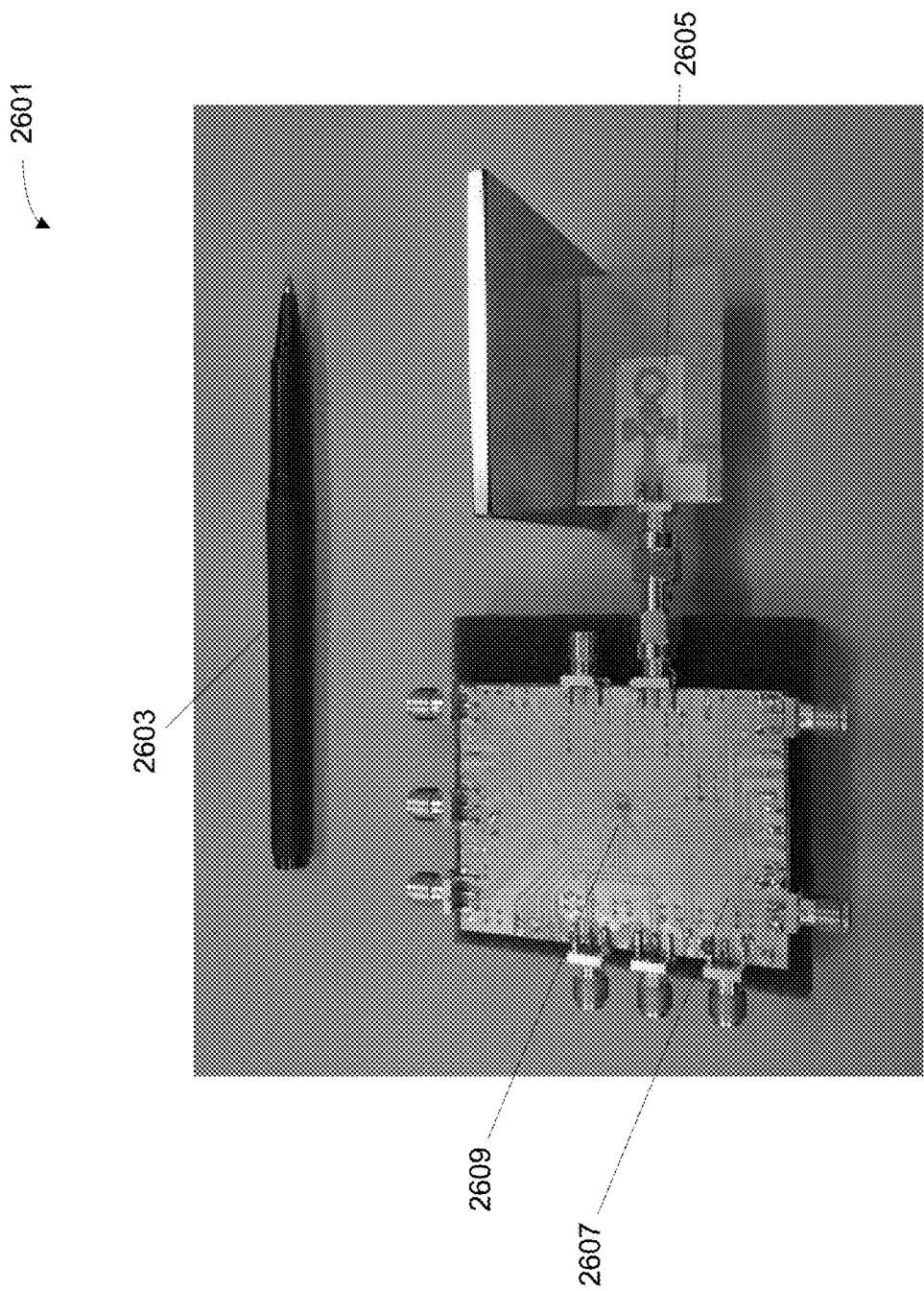
FIG. 26 shows an ESR system in accordance with one or more embodiments of the invention.

FIG. 26 shows a photograph of one example of the portable system in accordance with one or more embodiments. The system 2601 is located next to a common ball point pen 2603 to give a sense of scale. A planar loop-gap resonator 2605 is shown connected to a board 2607 which implements interconnects to the integrated ESR transceiver chip 2609. The size and scale of the example shown here is not intended to limit the scope of the present disclosure but is shows as merely one example.

Figure 27A:
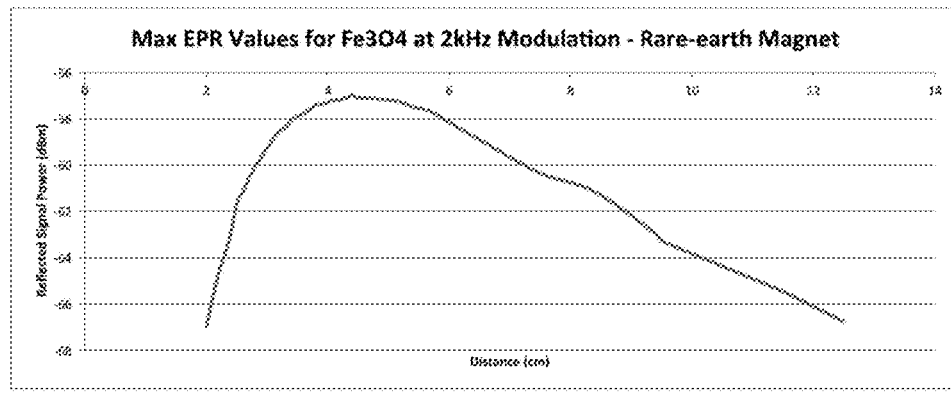
FIGS. 27A-27B show test data in accordance with one or more embodiments of the invention.
Figure 27B:
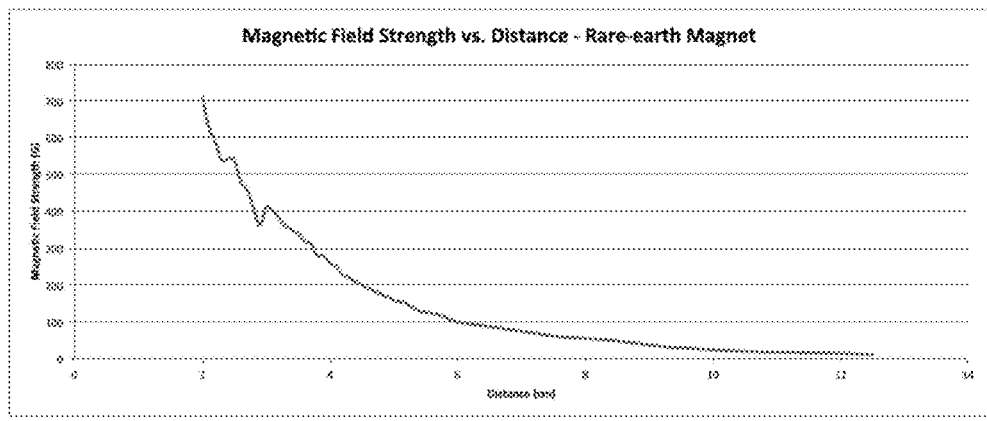

FIGS. 27A-27B show test data in accordance with one or more embodiments of the invention. FIG. 27A shows the detected ESR signal for a sample of $Fe_3O_4$ nanoparticles as a function of distance between the sample and the front surface of a permanent magnet. This measurement uses a fixed distance between a resonator and a sample. In this measurement, the line of displacement for the measurement is a line connecting the center of the resonator to the center of the magnet and is almost normal to the surface of the planar magnet. At the peak point, the sample is located at a position in space where the magnetic field generated by the permanent magnet is close to 350 Gauss, which is the field required to produce an strong ESR signal in the nanoparticle sample with a resonance frequency of around 1 GHz.

FIG. 27B shows the magnetic field as a function of distance from the same permanent magnet used to take the data shown in FIG. 27A. This measurement is used to calibrate the magnetic field of the permanent magnet. As expected, the magnetic field drops as a function of the distance from the magnet.

Figure 28A:
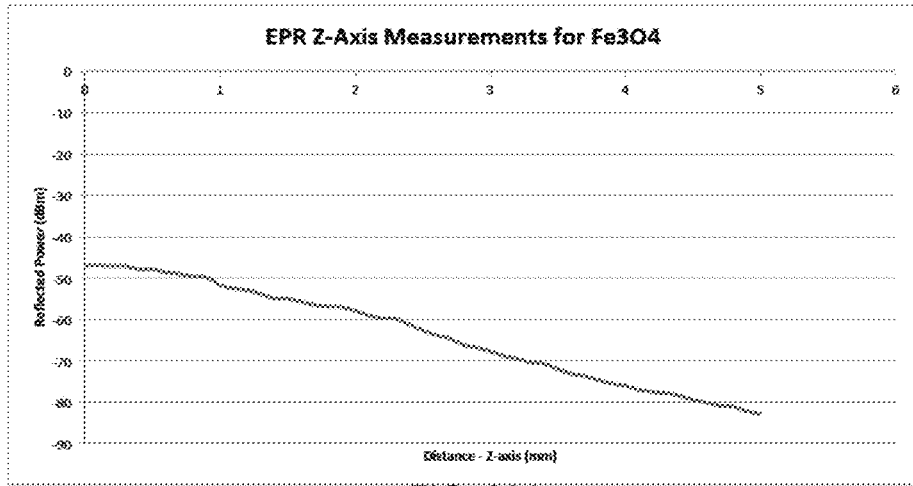
FIGS. 28A-28C show test data in accordance with one or more embodiments of the invention.
Figure 28B:
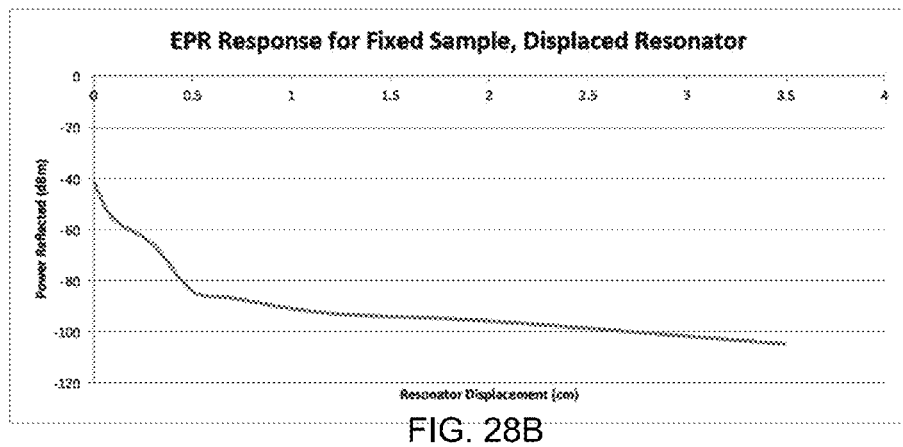
Figure 28C:
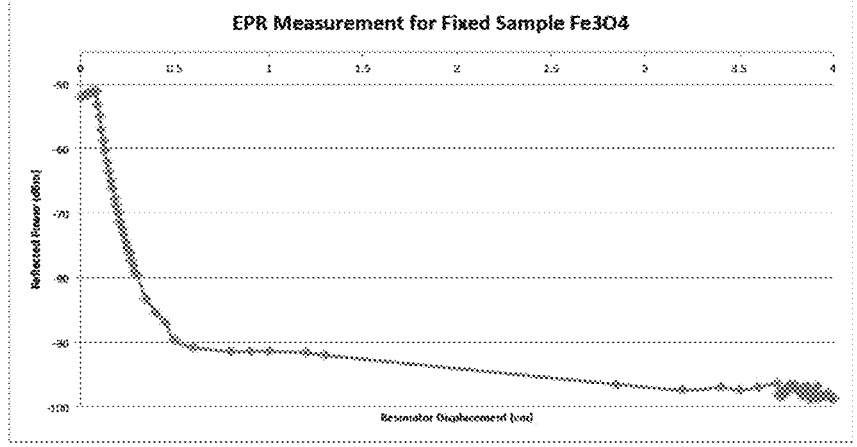
Figure 29:
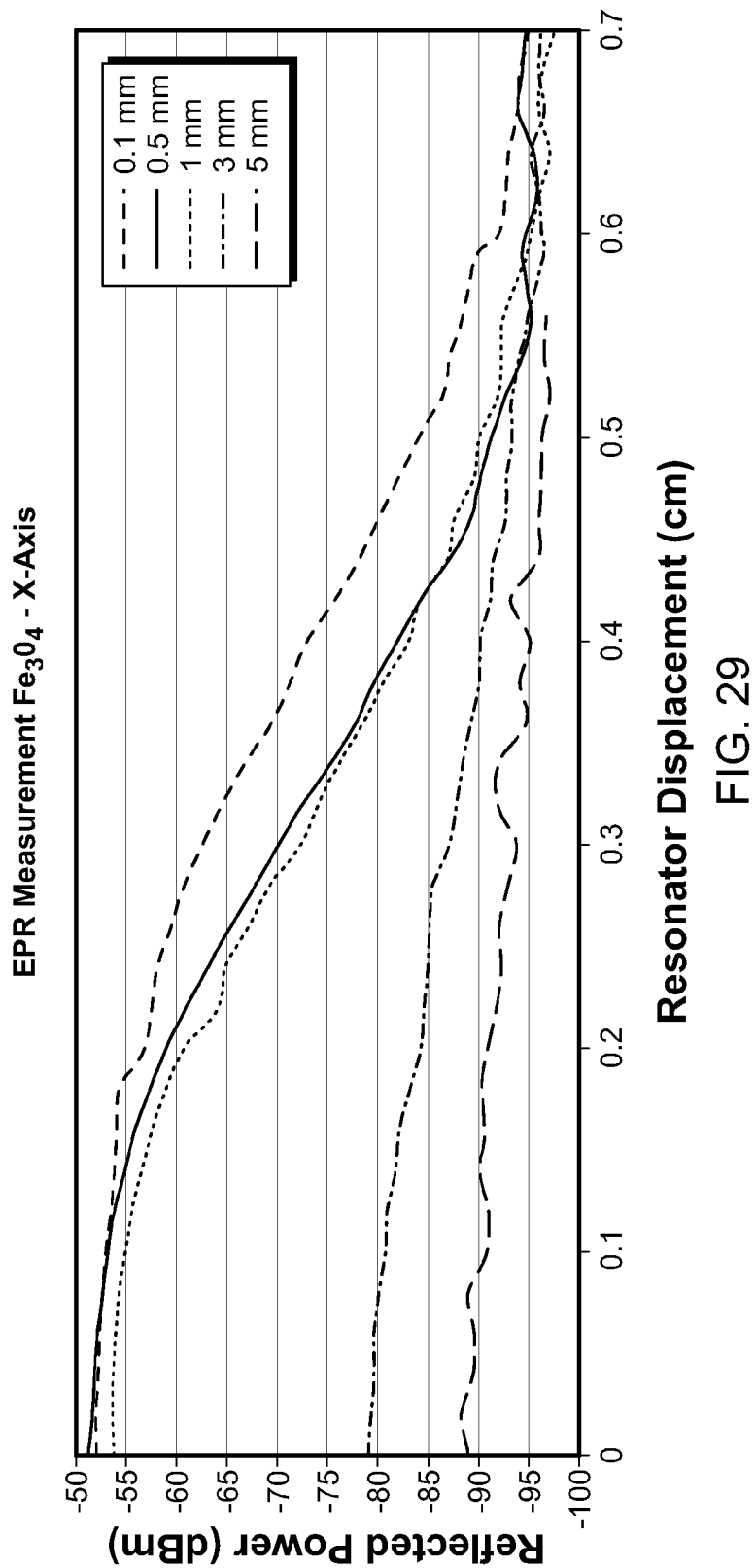
FIG. 29 shows a measured ESR signal as a function of displacement along a direction that is parallel to a front face of the permanent magnet and perpendicular to a table surface of the test bench. Several different separations between a sample and a resonator are shown.

FIGS. 28A-28C show test data in accordance with one or more embodiments of the invention. FIG. 28A shows the detected ESR signal for a varying distance (from 0 mm to 5 mm) between a resonator and a sample. In this measurement, the position of both the sample and the permanent magnet is fixed. To make the measurement, the resonator is moved away from the sample to reduce the filling factor. By reducing the filling factor, the magnitude of the ESR signal is correspondingly reduced. FIG. 28B shows the same measurement but over a larger scale of displacement (from 0 mm to 35 mm). FIG. 28C shows a similar measurement made using a resonator that is different from the resonator used to take the data shown in FIGS. 28A-28B. Both resonators are flat loop-gap made in-house using a 20 mil Rogers 4350B PCB. The loop has inner and outer diameters of 4 mm and 5 mm, respectively FIG. 29 shows a measured ESR signal as a function of displacement along a direction that is parallel to the front face of the permanent magnet and perpendicular to the table surface of the test bench. In this measurement, the surface of the magnet and the surface of the table are normal to each other. The distance between the center of the resonator and the center of the magnet can be calculated by $((4.5\ cm)^2+X^2)^{1/2}$, where the displacement X is shown on the horizontal axis in this figure. Several different separations between a sample and a resonator are shown. This measurement is performed with five different resonator-sample spacings: 0.1 mm, 0.5 mm, 1 mm, 3 mm, 5 mm.

Figure 30A:
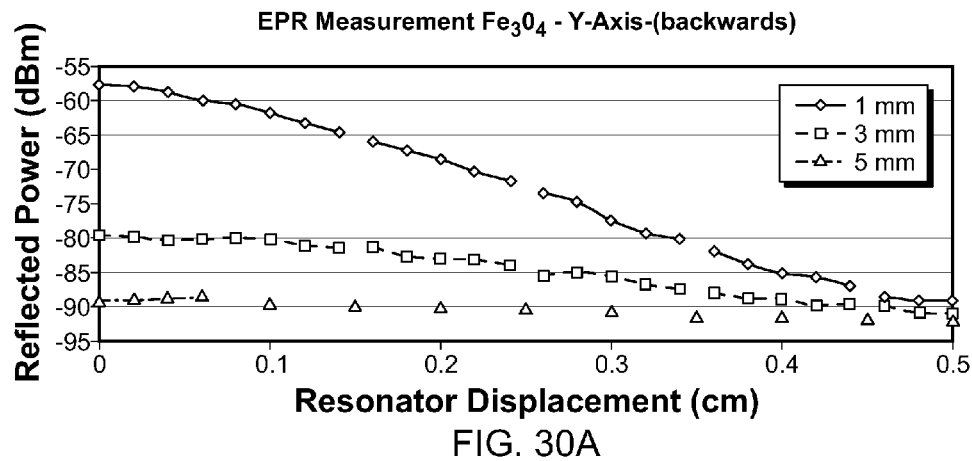
FIGS. 30A-30B show a measured ESR signal as a function of displacement (forward and backward) along a direction that is parallel to the front face of the permanent magnet and parallel to the table surface of the test bench. Several different separations between a sample and a resonator are shown.
Figure 30B:
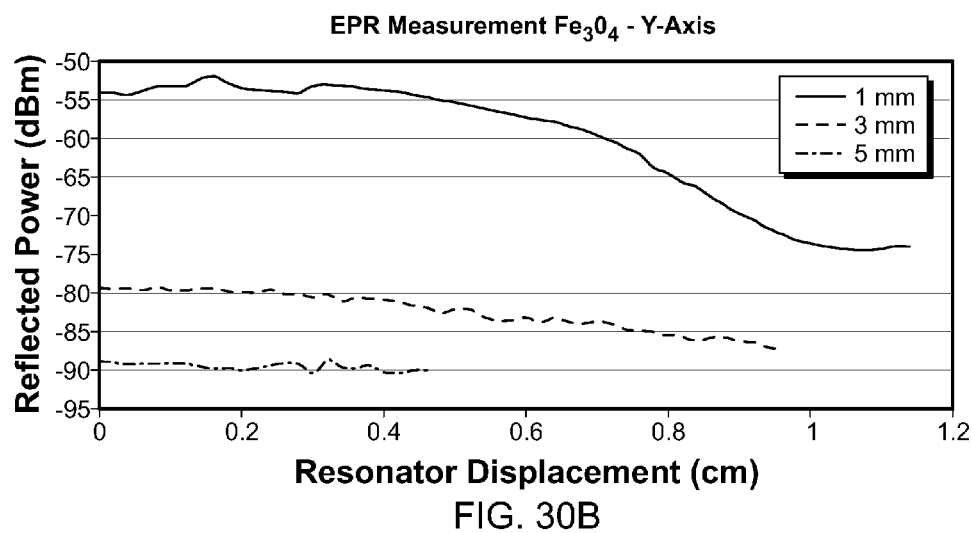

FIGS. 30A-30B show a measured ESR signal as a function of displacement backward (30A) and forward (30B) along a direction that is parallel to the front face of the permanent magnet and parallel to the table surface of the test bench. In this measurement, the surface of the magnet and the table are normal to each other. The distance between the center of the resonator and the center of the magnet can be calculated from this equation $((4.5\ cm)^2+Y^2)^{1/2}$, where the displacement Y is shown on the horizontal axis in this figure. This measurement is performed with three different resonator-sample spacings: 1 mm, 3 mm, 5 mm.

Figures 31A, 31B:
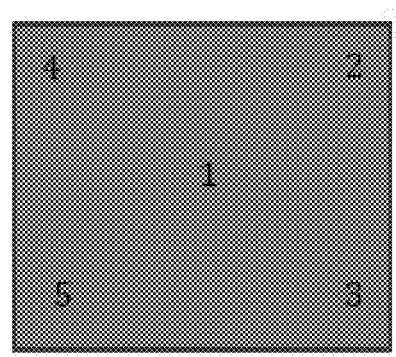
FIGS. 31A-31B show results of characterization of the magnetic filed produced by the permanent magnet used to produce the data of FIGS. 27-30.

FIGS. 31A-31B show results of a characterization of the magnetic filed produced by the permanent magnet used to produce the data of FIGS. 27-30. The magnetic field strength is measured as a function of distance from the front face of the permanent magnet for 5 different positions relative to the front face of the magnet, labeled 1-5 in FIG. 31A. The measurement is performed with starting points chosen at the center (1), top right corner (2), bottom right corner (3), top left corner (4), and bottom left corner (5) of the square planar magnet. In all of these measurement, the probe of the Gauss meter is moved away from the magnet on a line that is substantially perpendicular to the surface of the magnet.

Figure 32:
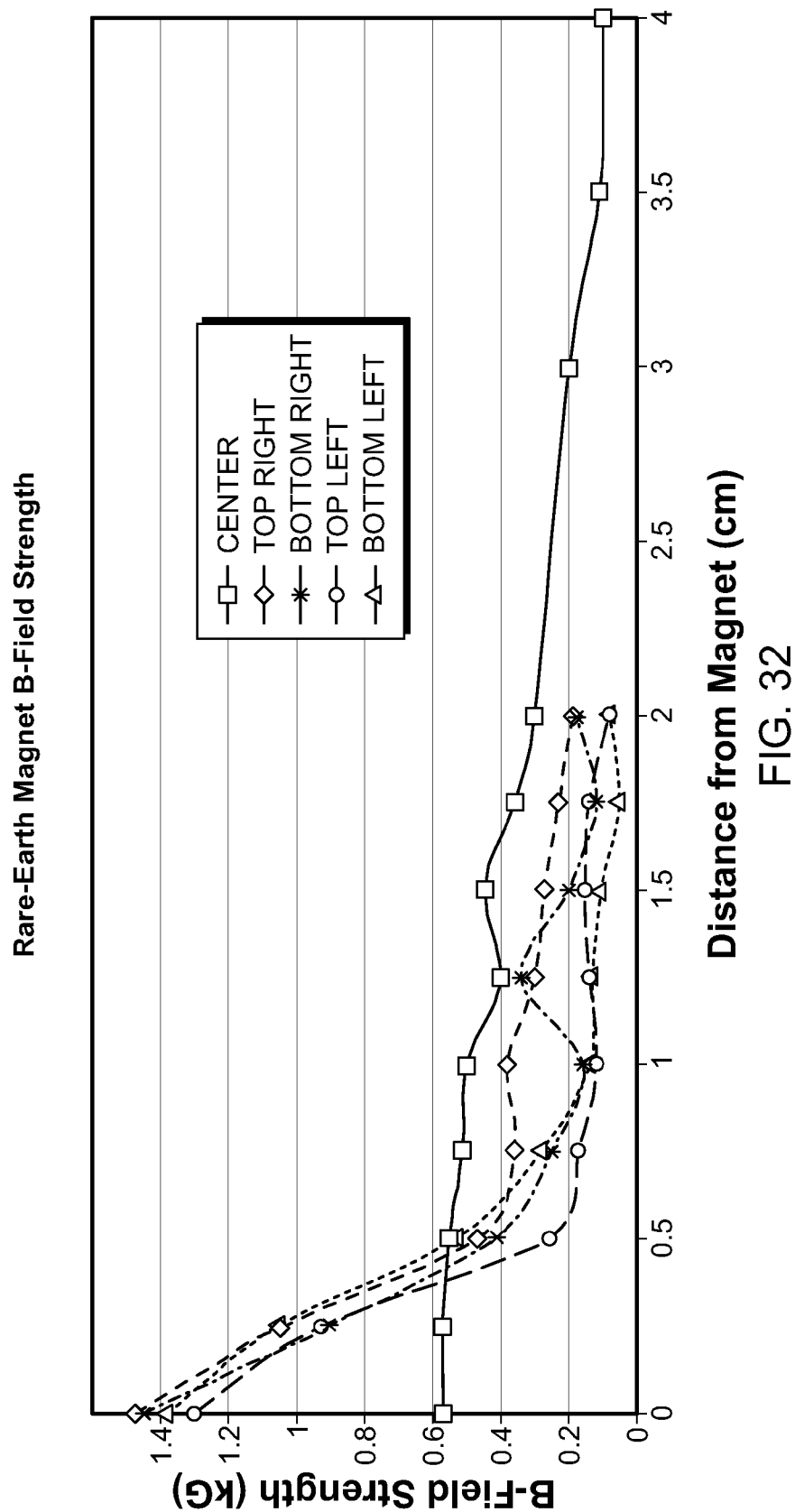
FIG. 32 show a plot of the magnetic field produced by the permanent magnet used to produce the data of FIGS. 27-30.

FIG. 32 show a plot of the strength of the magnetic field produced by the permanent magnet used to produce the data of FIGS. 27-30.

The test data shown in FIGS. 27-32 are shown merely for the sake of example and are not intended to limit the scope of the present disclosure in any way. It can be appreciated that the above measurements and characterizations can be repeated with any type of magnet (including an electromagnet), resonator, and sample. Accordingly the particular structure of the integrated ESR system used to perform theses measurement is not intended to limit the scope of the present disclosure.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method of obtaining an electron spin resonance (ESR) signal from a biological sample using an integrated electron spin resonance circuit chip having a chip substrate, the method comprising:
   generating, from an integrated oscillator circuit, an oscillating output signal;
   generating, by an integrated power amplifier (PA) circuit, an amplified oscillating output signal based on the oscillating output signal; and
   receiving, by integrated receiver amplifier circuit, an ESR signal from the biological sample that includes a magnetic species;
   generating, by the integrated receiver amplifier circuit, an amplified ESR signal based on the received ESR signal;
   down-converting, by an integrated mixer circuit, the amplified ESR signal to a baseband signal; and
   generating, by an integrated baseband amplifier circuit, an amplified baseband signal based on the baseband signal, wherein the integrated oscillator circuit, the integrated PA circuit, the integrated receiver amplifier circuit, and integrated mixer circuit, and the integrated baseband amplifier circuit are all disposed on the chip substrate.

2. The method of claim 1, wherein the magnetic species is one selected from a group consisting of a molecule, an atom, an ion, a free radical, and a nanoparticle.

3. The method of claim 2, wherein the magnetic species is a nanoparticle and the nanoparticle is a super paramagnetic iron oxide nanoparticle (SPION).

4. The method of claim 1, wherein the magnetic species comprises a reporter molecule that interacts with a magnetic molecule in the biological sample.

5. The method of claim 4, wherein the magnetic molecule is Oxygen ($O_2$).

6. The method of claim 4, wherein the reporter molecule is one selected for a group consisting of carbon particulate, a molecule with a nitroxides bond, and a tri-aryl-methyl (trityl) molecule with a protected electron on the central methyl carbon.

7. The method of claim 4, wherein a relaxation rate of the reporter molecule is proportional to a concentration of the magnetic molecule in the biological sample.

8. The method of claim 7, wherein the relaxation rate is one selected from a group consisting of $T_1$ relaxation rate, $T_2$ relaxation rate, and $T_2^*$ relaxation rate.

9. The method of claim 1, wherein generating the amplified oscillating output signal further comprises pulsing the amplified output signal to excite a time domain ESR signal in the biological sample.

10. The method of claim 9, wherein pulsing the amplified output signal includes:
generating, by an integrated digital pulse generator circuit, a voltage pulse,
wherein the integrated digital pulse generator circuit is disposed on the chip substrate.

11. The method of claim 10, further comprising:
providing the voltage pulse to a gate terminal of a switching transistor to switch the amplified oscillating output signal, wherein the switching transistor is connected to an input terminal of the PA circuit.

12. The method of claim 11, further comprising pulling down a bias voltage of an input transistor of the PA circuit to switch the amplified oscillating output signal in response to the voltage pulse from the integrated digital pulse generator circuit.

13. The method of claim 9, wherein the time domain ESR signal is an electron spin relaxation signal.

14. The method of claim 13, wherein the electron spin relaxation signal provides information related to one selected from a group consisting of $T_1$, $T_2$, and $T_2^*$.

15. The method of claim 1 wherein the magnetic species is a free radical generated by exposing the biological sample to ionizing radiation.

16. The method of claim 1, wherein the biological sample is an alanine ($CH_3CH(NH_2)COOH$) phantom.

17. The method of claim 1, wherein the magnetic species is a melanin pigment molecule.

18. The method of claim 1, wherein the biological sample a tissue sample.

19. The method of claim 18, wherein the tissue sample originates from a tumor.

20. The method of claim 1, wherein the ESR signal is used in early detection of cancer.

21. The method of claim 1, wherein the ESR signal is used to monitor drug delivery.

22. The method of claim 1, wherein the integrated ESR circuit chip is disposed within a patient at least during a time the ESR signal is obtained.

23. The method of claim 22, wherein the integrated ESR circuit chip is disposed within an ovary of the patient.

24. The method of claim 22, where in the biological sample comprises the patient's tissue.

25. The method of claim 1, wherein a filling factor of a resonator used to detect the ESR signal is substantially 1.

26. The method of claim 1, wherein a filling factor of a resonator used to detect the ESR signal is from 0.01 to 1.

27. A method of detecting an electron spin resonance (ESR) signal, the method comprising:
exciting a magnetic nanoparticle that is functionalized with a cancer specific antibody using an oscillating magnetic field, wherein a biological sample comprises the patient's tissue, wherein the oscillating magnetic field causes the magnetic nanoparticle to emit an ESR signal, and wherein the oscillating magnetic field is generated by an amplified oscillating output signal for an integrated electron spin resonance circuit chip having a chip substrate;
receiving the ESR signal;
generating, from an integrated oscillator circuit, an oscillating output signal;
generating, by an integrated power amplifier (PA) circuit, the amplified oscillating output signal based on the oscillating output signal;
receiving, by integrated receiver amplifier circuit, the ESR signal;
generating, by the integrated receiver amplifier circuit, an amplified ESR signal based on the received ESR signal;
down-converting, by an integrated mixer circuit, the amplified ESR signal to a baseband signal; and
generating, by an integrated baseband amplifier circuit, an amplified baseband signal based on the baseband signal.

28. The method of claim 27, wherein the cancer specific antibody is anti-prostate-specific G-protein coupled Receptor.

29. The method of claim 27, wherein the cancer specific antibody is anti-μ-opioid receptor.

30. The method of claim 27, wherein the integrated ESR circuit chip is disposed within a patient at least during a time the ESR signal is obtained.

31. The method of claim 27, wherein the integrated ESR circuit chip is disposed within an ovary of the patient.

32. The method of claim 27, wherein a filling factor of a resonator used to detect the ESR signal is substantially 1.

33. The method of claim 27, wherein a filling factor of a resonator used to detect the ESR signal is from 0.01 to 1.

34. A method of detecting an electron spin resonance (ESR) signal, the method comprising:
exciting a magnetic nanoparticle, wherein the magnetic nanoparticle comprises a drug, and the magnetic nanoparticle is disposed within a carrier, wherein the oscillating magnetic field causes the magnetic nanoparticle disposed within the carrier to emit an ESR signal, and wherein the oscillating magnetic field is generated by an amplified oscillating output signal for an integrated electron spin resonance circuit chip having a chip substrate;
receiving the ESR signal from the magnetic nanoparticle disposed within the carrier, wherein a filling factor of a resonator used to detect the ESR signal is from 0.01 to 1;

generating, from an integrated oscillator circuit, an oscillating output signal;

generating, by an integrated power amplifier (PA) circuit, the amplified oscillating output signal based on the oscillating output signal;

receiving, by integrated receiver amplifier circuit, the ESR signal;

generating, by the integrated receiver amplifier circuit, an amplified ESR signal based on the received ESR signal;

down-converting, by an integrated mixer circuit, the amplified ESR signal to a baseband signal; and generating, by an integrated baseband amplifier circuit, an amplified baseband signal based on the baseband signal.

35. The method of claim 34 wherein the carrier is porous amorphous silicon carrier.

36. The method of claim 34, wherein the integrated ESR circuit chip is disposed within a patient at least during a time the ESR signal is obtained.

37. The method of claim 34, wherein a filling factor of a resonator used to detect the ESR signal is substantially 1.

* * * * *